(12) United States Patent
Yamazaki et al.

(10) Patent No.: US 11,296,233 B2
(45) Date of Patent: Apr. 5, 2022

(54) SEMICONDUCTOR DEVICE AND SEMICONDUCTOR DEVICE MANUFACTURING METHOD

(71) Applicant: Semiconductor Energy Laboratory Co., Ltd., Atsugi (JP)

(72) Inventors: Shunpei Yamazaki, Setagaya (JP); Katsuaki Tochibayashi, Isehara (JP); Kensuke Yoshizumi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 12 days.

(21) Appl. No.: 16/962,558

(22) PCT Filed: Feb. 1, 2019

(86) PCT No.: PCT/IB2019/050802
§ 371 (c)(1),
(2) Date: Jul. 16, 2020

(87) PCT Pub. No.: WO2019/155329
PCT Pub. Date: Aug. 15, 2019

(65) Prior Publication Data
US 2020/0411693 A1 Dec. 31, 2020

(30) Foreign Application Priority Data
Feb. 9, 2018 (JP) .............................. JP2018-021908

(51) Int. Cl.
*H01L 27/00* (2006.01)
*H01L 29/00* (2006.01)
(Continued)

(52) U.S. Cl.
CPC .... *H01L 29/7869* (2013.01); *H01L 29/42364* (2013.01); *H01L 29/42372* (2013.01); *H01L 29/517* (2013.01)

(58) Field of Classification Search
CPC ............... H01L 27/1156; H01L 27/108; H01L 27/1225; H01L 27/124; H01L 27/1259;
(Continued)

(56) References Cited

U.S. PATENT DOCUMENTS

| 8,772,769 B2 | 7/2014 | Yamazaki |
| 9,553,200 B2 | 1/2017 | Isobe et al. |

(Continued)

FOREIGN PATENT DOCUMENTS

| JP | 2016-167584 A | 9/2016 |
| JP | 2016-174143 A | 9/2016 |

(Continued)

OTHER PUBLICATIONS

International Search Report (Application No. PCT/IB2019/050802) dated May 7, 2019.
(Continued)

*Primary Examiner* — Nikolay K Yushin
(74) *Attorney, Agent, or Firm* — Robinson Intellectual Property Law Office; Eric J. Robinson

(57) ABSTRACT

A semiconductor device having favorable electrical characteristics can be provided. The semiconductor device having favorable electrical characteristics is provided. The semiconductor device has a structure including a first metal oxide layer including a first region, and a second region and a third region in which phosphorus, boron, aluminum, or magnesium is added and between which the first region is sandwiched; a conductive layer which overlaps with the first region; a first insulating layer which covers a side surface and a bottom surface of the conductive layer; a second metal oxide layer which covers a side surface and a bottom surface of the first insulating layer and is in contact with a top surface of the first region; a second insulating layer in contact with a top surface of the second region and a top (Continued)

surface of the third region and in contact with a side surface of the second metal oxide layer; a third insulating layer positioned over the second insulating layer and in contact with a side surface of the second metal oxide layer; a fourth insulating layer positioned over the third insulating layer and in contact with a side surface of the second metal oxide layer; a fifth insulating layer in contact with a top surface of the conductive layer, a top surface of the first insulating layer, a top surface of the second metal oxide layer, and a top surface of the fourth insulating layer.

10 Claims, 22 Drawing Sheets

(51) Int. Cl.
  *H01L 29/786* (2006.01)
  *H01L 29/423* (2006.01)
  *H01L 29/51* (2006.01)
(58) Field of Classification Search
  CPC ........... H01L 29/7869; H01L 29/42364; H01L 29/78648; H01L 29/517; H01L 29/42372
  See application file for complete search history.

(56) References Cited

U.S. PATENT DOCUMENTS

| | | | |
|---|---|---|---|
| 9,865,712 | B2 | 1/2018 | Okamoto et al. |
| 9,917,207 | B2 | 3/2018 | Yamazaki |
| 9,947,802 | B2 | 4/2018 | Kimura et al. |
| 9,954,112 | B2 | 4/2018 | Asami et al. |
| 9,966,473 | B2 | 5/2018 | Endo |
| 10,446,671 | B2 | 10/2019 | Okamoto et al. |
| 10,546,958 | B2 | 1/2020 | Endo |
| 2016/0218219 | A1 | 7/2016 | Asami et al. |
| 2016/0260822 | A1 | 9/2016 | Okamoto et al. |
| 2016/0336454 | A1 | 11/2016 | Endo |
| 2017/0092779 | A1 | 3/2017 | Kimura et al. |
| 2017/0186875 | A1 | 6/2017 | Yamazaki |
| 2018/0248043 | A1 | 8/2018 | Asami et al. |
| 2019/0237584 | A1 | 8/2019 | Asami et al. |
| 2019/0378918 | A1 | 12/2019 | Okamoto et al. |

FOREIGN PATENT DOCUMENTS

| | | |
|---|---|---|
| JP | 2016-213468 A | 12/2016 |
| JP | 2017-063192 A | 3/2017 |
| JP | 2017-120896 A | 7/2017 |
| KR | 2017-0106358 A | 9/2017 |
| TW | 201639175 | 11/2016 |
| TW | 201642472 | 12/2016 |
| TW | 201707215 | 2/2017 |
| WO | WO-2016/120741 | 8/2016 |
| WO | WO-2016/139548 | 9/2016 |

OTHER PUBLICATIONS

Written Opinion (Application No. PCT/IB2019/050802) dated May 7, 2019.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.
Amano.S et al., "Low Power LC Display Using In—Ga—Zn-Oxide TFTs Based on Variable Frame Frequency", SID Digest'10 : SID International Symposium Digest of Technical Papers, May 23, 2010, vol. 41, No. 1, pp. 626-629.

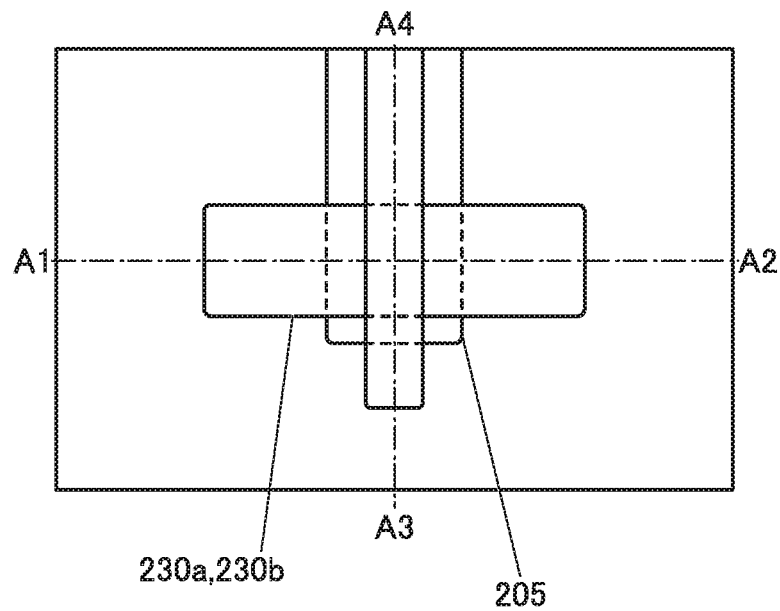
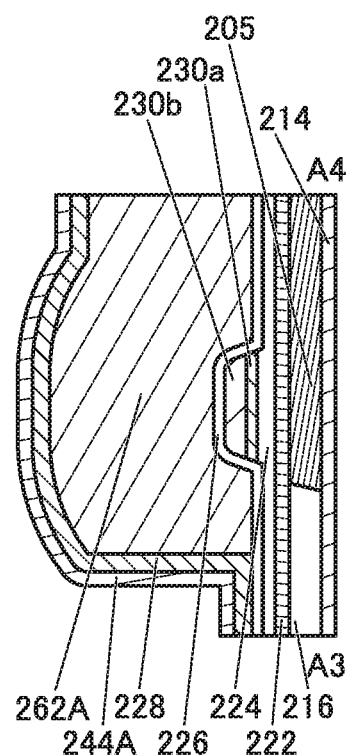
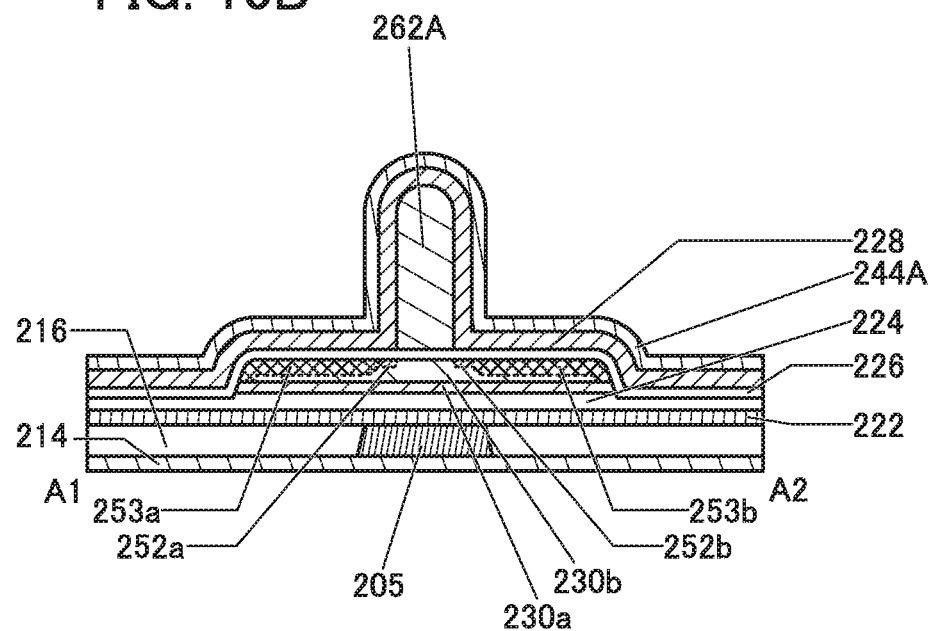

FIG. 22A
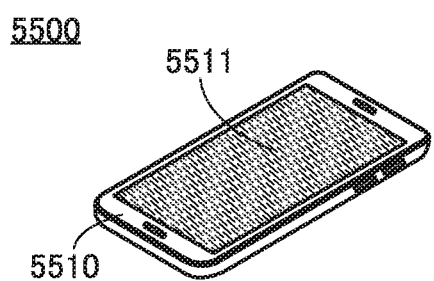
FIG. 22B
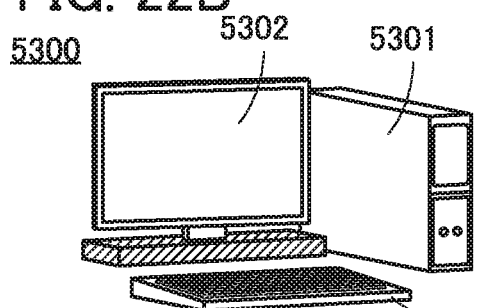
FIG. 22C
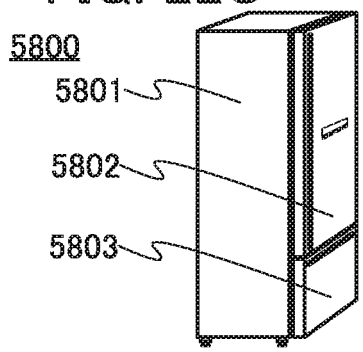
FIG. 22D
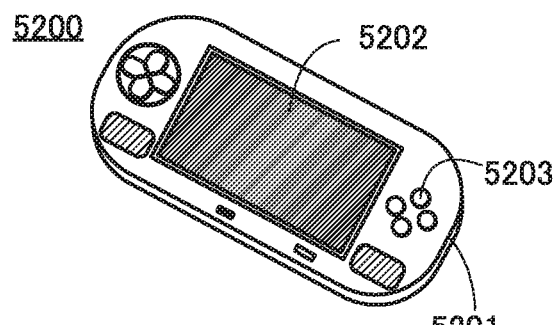
FIG. 22E1
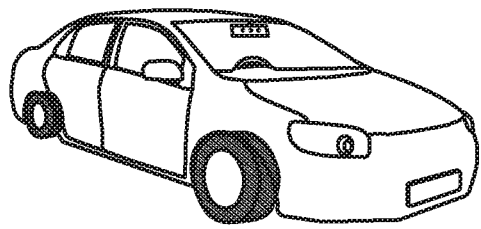
FIG. 22E2
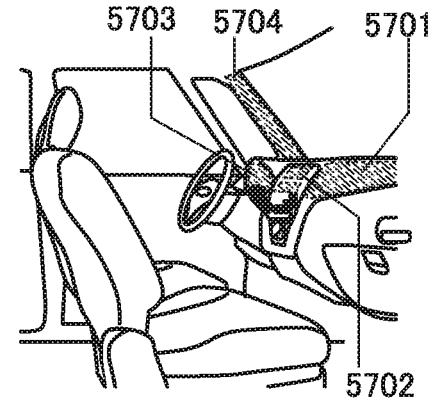
FIG. 22F
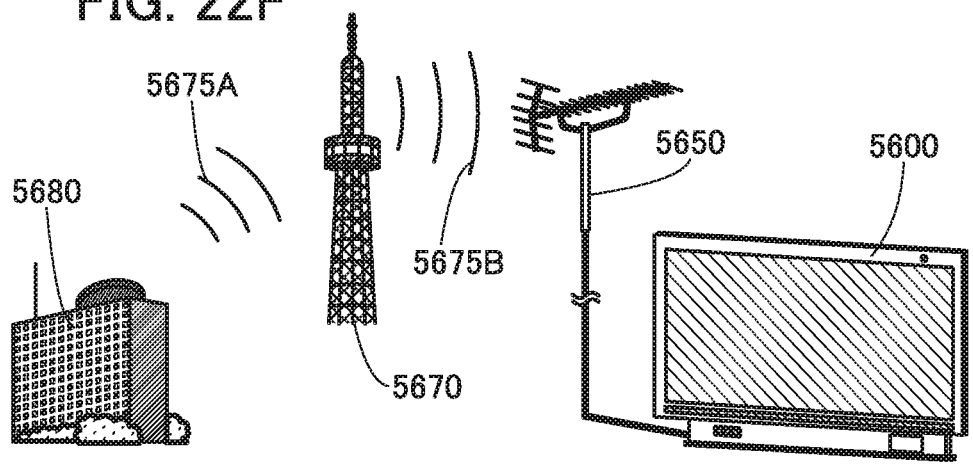

SEMICONDUCTOR DEVICE AND SEMICONDUCTOR DEVICE MANUFACTURING METHOD

TECHNICAL FIELD

One embodiment of the present invention relates to a semiconductor device and a method for manufacturing the semiconductor device. Alternatively, one embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and can be said to include a semiconductor device in some cases.

BACKGROUND ART

As semiconductor thin films applicable to transistors, silicon-based semiconductor materials have been widely known, but oxide semiconductors have been attracting attention as alternative materials. Examples of known oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

From the studies on IGZO, in an oxide semiconductor, a CAAC (c-axis aligned crystalline) structure and an nc (nanocrystalline) structure, which are neither single crystal nor amorphous, have been found (see Non-Patent Document 1 to Non-Patent Document 3). In Non-Patent Document 1 and Non-Patent Document 2, a technique for forming a transistor using an oxide semiconductor having the CAAC structure is disclosed. Moreover, Non-Patent Document 4 and Non-Patent Document 5 disclose that a minute crystal is included even in an oxide semiconductor which has lower crystallinity than an oxide semiconductor having the CAAC structure or the nc structure.

In addition, a transistor which includes IGZO as an active layer has an extremely low off-state current (see Non-Patent Document 6), and an LSI and a display utilizing the characteristics have been reported (see Non-Patent Document 7 and Non-Patent Document 8).

REFERENCE

Non-Patent Documents

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

An object of one embodiment of the present invention is to provide a semiconductor device having a high on-state current. Alternatively, an object of one embodiment of the present invention is to provide a semiconductor device with high frequency characteristics. Alternatively, an object of one embodiment of the present invention is to provide a semiconductor device having favorable reliability. Alternatively, an object of one embodiment of the present invention is to provide a semiconductor device that can be scaled down or highly integrated. Alternatively, an object of one embodiment of the present invention is to provide a semiconductor device with favorable electrical characteristics. Alternatively, an object of one embodiment of the present invention is to provide a semiconductor device with high productivity.

An object of one embodiment of the present invention is to provide a semiconductor device capable of retaining data for a long time. An object of one embodiment of the present invention is to provide a semiconductor device capable of high-speed information writing. An object of one embodiment of the present invention is to provide a semiconductor device with high design flexibility. An object of one embodiment of the present invention is to provide a semiconductor device capable of reducing power consumption. An object of one embodiment of the present invention is to provide a novel semiconductor device.

Note that the descriptions of these objects do not preclude the existence of other objects. One embodiment of the present invention does not have to achieve all the objects. Note that objects other than these can be derived from the description of the specification, the drawings, the claims, and the like.

Means for Solving the Problems

One embodiment of the present invention is a semiconductor device including a first metal oxide layer, a second metal oxide layer, first to fifth insulating layers, and a first conductive layer. The first metal oxide layer includes a first region, and a second region and a third region between which the first region is sandwiched. The first conductive layer includes a portion overlapping with the first region. The first insulating layer covers a side surface and a bottom surface of the first conductive layer. The second metal oxide layer covers a side surface and a bottom surface of the first insulating layer and is in contact with a top surface of the first region. The second insulating layer includes a portion in contact with a top surface of the second region, a portion in contact with a top surface of the third region, and a portion in contact with a side surface of the second metal oxide layer. The third insulating layer is positioned over the second insulating layer and includes a portion in contact with the side surface of the second metal oxide layer. The fourth insulating layer is positioned over the third insulating layer and includes a portion in contact with the side surface of the second metal oxide layer. The fifth insulating layer is in contact with a top surface of the first conductive layer, a top surface of the first insulating layer, a top surface of the second metal oxide layer, and a top surface of the fourth insulating layer. The second region and the third region contain a first element, and the first element is phosphorus, boron, aluminum, or magnesium.

In the above, the first metal oxide layer preferably includes a fourth region between the first region and the second region and a fifth region between the first region and the third region. In this case, it is preferable that the fourth region and the fifth region contain the first element and the second region and the third region contain a larger amount of the first element than the fourth region or the fifth region.

In the above, the second insulating layer preferably includes a portion protruding toward the first conductive layer rather than the third insulating layer.

In the above, a bottom portion of the first insulating layer and a bottom portion of the first conductive layer preferably have a rounded shape.

In the above, a second conductive layer and a third conductive layer are preferably further included. It is preferable that the second conductive layer be located inside a first opening provided in the second insulating layer, the third insulating layer, the fourth insulating layer, and the fifth insulating layer and be in contact with the second region at a bottom portion of the first opening. It is preferable that the third conductive layer be located inside a second opening provided in the second insulating layer, the third insulating layer, the fourth insulating layer, and the fifth insulating layer and be in contact with the third region at a bottom portion of the second opening.

In the above, a fourth conductive layer and a sixth insulating layer are preferably further included. In this case, it is preferable that the fourth conductive layer include a portion overlapping with the first conductive layer with the first region interposed therebetween, and the sixth insulating layer include a portion positioned between the fourth conductive layer and the first region.

In the above, a third metal oxide layer is preferably further included. In this case, the first metal oxide layer is preferably positioned over the third metal oxide layer.

Another embodiment of the present invention is a manufacturing method of a semiconductor device including the following steps: a first insulating film is formed covering a first metal oxide layer. A first layer overlapping with the first metal oxide layer is formed over the first insulating film. A first injection treatment is performed on a portion of the first metal oxide layer that is not covered by the first layer using the first layer as a mask through the first insulating film. A second insulating film is formed covering a side surface and a top surface of the first layer and a top surface of the first insulating film. A second injection treatment is performed through the second insulating film and the first insulating film using a portion of the second insulating film that covers a side surface of the first layer and the first layer as masks. A planarization treatment is performed to expose a top surface of the first layer, and the first layer is removed. Here, the first injection treatment and the second injection treatment are treatments injecting a first element by an ion implantation method. In addition, the second injection treatment is performed with a condition in which a greater amount of first element is injected to the first metal oxide layer than the first injection treatment. The first element is phosphorus, boron, aluminum, or magnesium.

Effect of the Invention

According to one embodiment of the present invention, a semiconductor device with a high on-state current can be provided. Alternatively, a semiconductor device having high frequency characteristics can be provided. Alternatively, a semiconductor device with high reliability can be provided. Alternatively, a semiconductor device that can be scaled down or highly integrated can be provided. Alternatively, a semiconductor device having favorable electrical characteristics can be provided. Alternatively, a semiconductor device with high productivity can be provided.

Alternatively, a semiconductor device capable of retaining data for a long time can be provided. Alternatively, a semiconductor device capable of high-speed data writing can be provided. Alternatively, a semiconductor device with high design flexibility can be provided. Alternatively, a semiconductor device capable of reducing power consumption can b provided. Alternatively, a novel semiconductor device can be provided.

Note that the descriptions of the effects do not preclude the existence of other effects. Note that one embodiment of the present invention does not need to have all these effects. Note that effects other than these can be derived from the description of the specification, the drawings, the claims, and the like.

BRIEF DESCRIPTION OF THE DRAWINGS

FIGS. 10A-10C Diagrams illustrating an example of a method for manufacturing a semiconductor device.

FIGS. 22A-22F Drawings illustrating electronic devices.

MODE FOR CARRYING OUT THE INVENTION

Figure 1A:
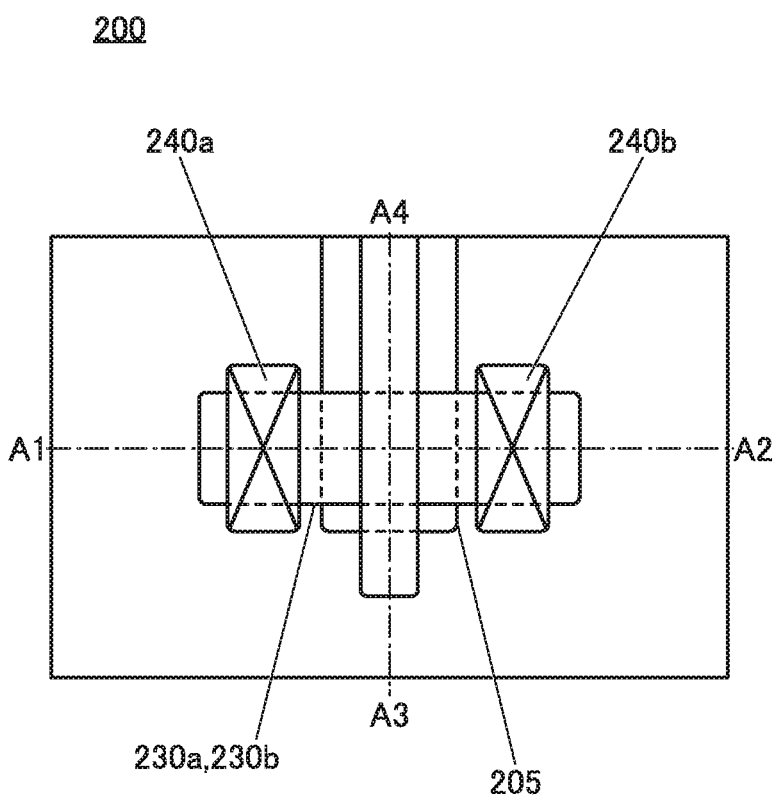
FIGS. 1A-1C A structure example of a semiconductor device.

Hereinafter, embodiments will be described with reference to the drawings. Note that the embodiments can be implemented with many different modes, and it will be readily understood by those skilled in the art that modes and details thereof can be changed in various ways without departing from the spirit and scope thereof. Therefore, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which is not illustrated in some cases for easy understanding. Furthermore, in the drawings, the same reference numerals are used in common for the same portions or portions having similar functions in different drawings, and repeated description thereof is omitted in some cases. Furthermore, the same hatch pattern is used in the case of denoting the portions having similar functions, and the portions are not especially denoted by reference numerals in some cases.

In addition, particularly in a top view (also referred to as a plan view), a perspective view, or the like, the description of some components might be omitted for easy understanding of the invention. Furthermore, some hidden lines and the like might be omitted.

In addition, in this specification and the like, ordinal numbers such as "first" and "second" are used for convenience and do not denote the order of steps or the stacking order of layers. Therefore, for example, description can be made by replacing "first" with "second," "third," or the like as appropriate. In addition, the ordinal numbers in this specification and the like do not correspond to the ordinal numbers which are used to specify one embodiment of the present invention in some cases.

In addition, in this specification and the like, terms for describing positions, such as "over" and "below," are used for convenience to describe the positional relationship between components with reference to drawings. The positional relation between components is changed as appropriate in accordance with the direction in which the components are described. Thus, terms for the description are not limited to those used in this specification, and description can be made appropriately in accordance with the situation.

Furthermore, functions of a source and a drain might be switched when a transistor of opposite polarity is employed or the direction of current flow is changed in circuit operation, for example. Therefore, the terms "source" and "drain" can sometimes be interchanged with each other in this specification and the like.

Note that in this specification and the like, depending on transistor structure, channel width in a region where a channel is actually formed (hereinafter also referred to as effective channel width) is different from channel width shown in a top view of a transistor (hereinafter also referred to as apparent channel width) in some cases. For example, when a gate electrode covers a side surface of a semiconductor, effective channel width is larger than apparent channel width, and its influence cannot be ignored in some cases. For example, in a scaled-down transistor having a gate electrode covering a side surface of a semiconductor, the proportion of a channel formation region formed in the side surface of the semiconductor is increased in some cases. In that case, effective channel width is greater than apparent channel width.

In this specification, the simple term "channel width" refers to apparent channel width or effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, DOS (Density of States) in a semiconductor might be increased or crystallinity might be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed by the mixing of impurities, for example. Furthermore, when the semiconductor is silicon, examples of the impurity that changes characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In addition, in this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In addition, in this specification and the like, "parallel" indicates a state where two straight lines are placed at an angle greater than or equal to $-10°$ and less than or equal to $10°$. Accordingly, the case where the angle is greater than or equal to $-5°$ and less than or equal to $5°$ is also included. Furthermore, "substantially parallel" indicates a state where two straight lines are placed at an angle greater than or equal to $-30°$ and less than or equal to $30°$. Moreover, "perpendicular" indicates a state where two straight lines are placed at an angle greater than or equal to $80°$ and less than or equal to $100°$. Accordingly, the case where the angle is greater than or equal to $85°$ and less than or equal to $95°$ is also included. Moreover, "substantially perpendicular" indicates a state where two straight lines are placed at an angle greater than or equal to $60°$ and less than or equal to $120°$.

Note that in this specification, a barrier film means a film having a function of inhibiting the permeation of oxygen and impurities such as water and hydrogen, and the barrier film having conductivity is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where an OS FET or an OS transistor is mentioned, the OS FET or the OS transistor can also be referred to as a transistor including an oxide or an oxide semiconductor in a semiconductor layer.

In addition, in this specification and the like, "normally off" means that current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

A specific structure example of a semiconductor device including a transistor 200 of one embodiment of the present invention will be described with reference to drawings.

<Structure Example of Semiconductor Device>

Figure 1C:
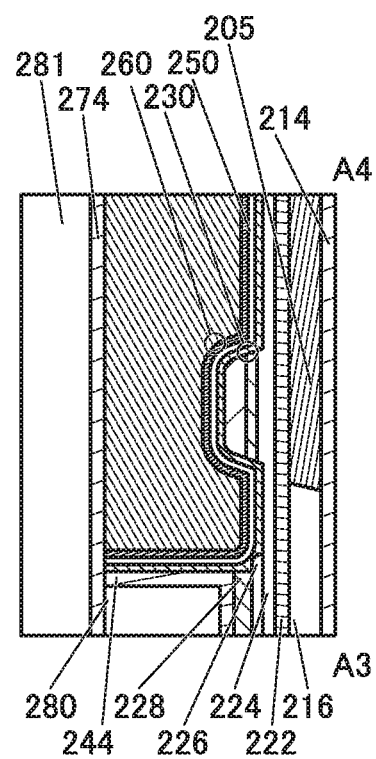
Figure 1B:
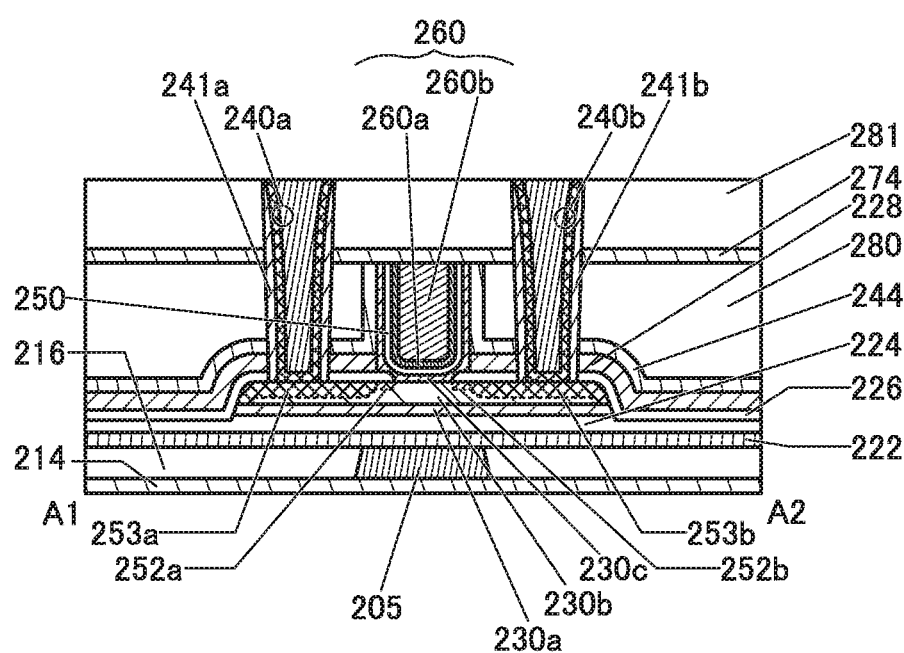

FIG. 1(A), FIG. 1(B), and FIG. 1(C) are a top view and cross-sectional views of a transistor 200 according to one embodiment of the present invention and the periphery of the transistor 200.

Figure 2:
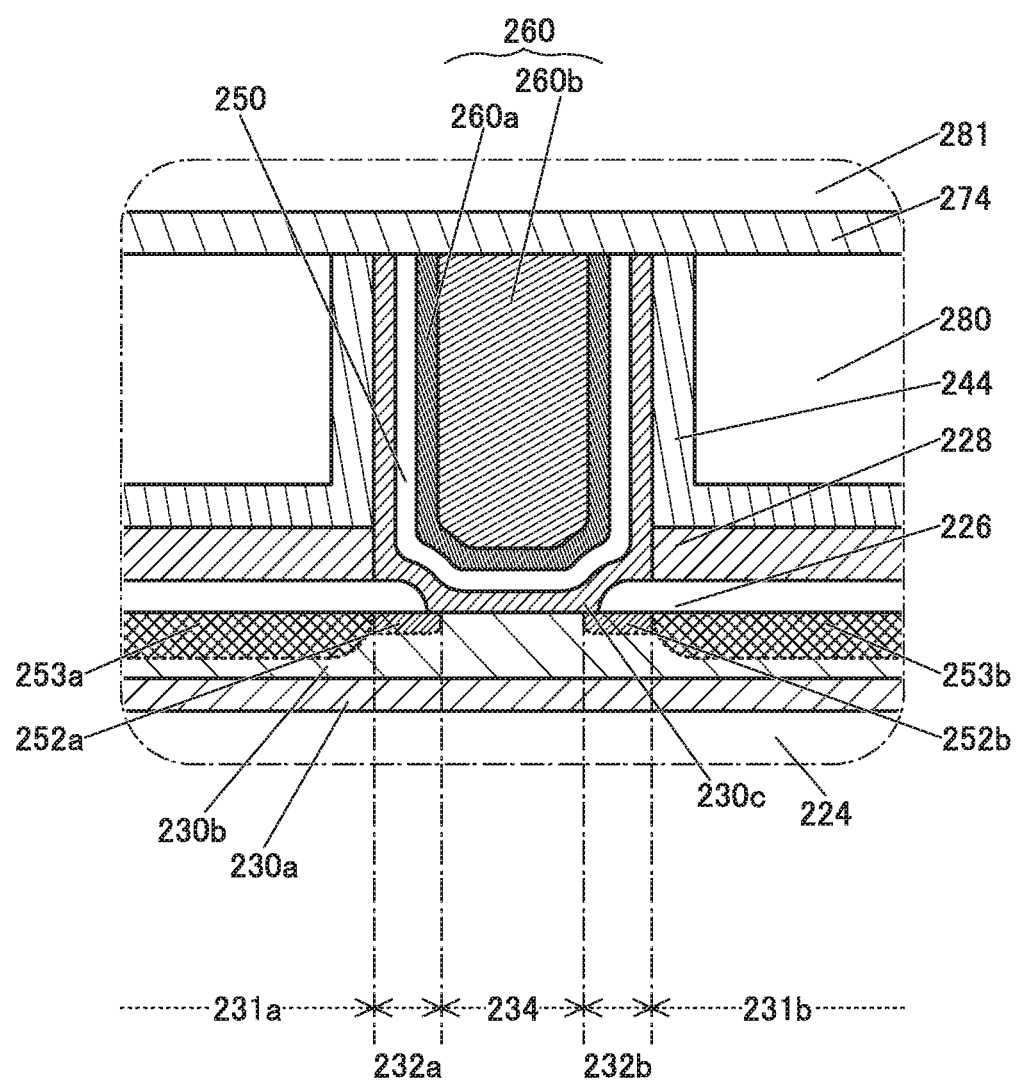
FIG. 2 A structure example of a semiconductor device.

FIG. 1(A) is a top view of a semiconductor device including the transistor 200. In addition, FIG. 1(B) and FIG. 1(C) are cross-sectional views of the semiconductor device. Here, FIG. 1(B) is a cross-sectional view of a portion indicated by a dashed-dotted line A1-A2 in FIG. 1(A), and is a cross-sectional view in the channel length direction of the transistor 200. In addition, FIG. 1(C) is a cross-sectional view of a portion indicated by a dashed-dotted line A3-A4 in FIG. 1(A), and is a cross-sectional view in the channel width direction of the transistor 200. Note that for clarity of the drawing, some components are not illustrated in the top view of FIG. 1(A). FIG. 2 is an enlarged view of the semiconductor layer 230b and the vicinity of the semiconductor layer 230b in FIG. 1(B).

As shown in FIG. 1 and FIG. 2, the transistor 200 includes a semiconductor layer 230a positioned over a substrate (not illustrated); a semiconductor layer 230b positioned over the semiconductor layer 230a; a region 252a and a region 252b which are formed separately in the semiconductor layer 230b; an insulating layer 226 in contact with a portion of a top surface of the semiconductor layer 230b and in which an opening overlapping with a region between the region 252a and the region 252b is formed; an insulating layer 228 positioned over the insulating layer 226 and in which an opening overlapping with the region between the region 252a and the region 252b is formed; an insulating layer 280 positioned over the semiconductor layer 230b and in which an opening overlapping with the region between the region 252a and the region 252b is formed; a conductive layer 260 positioned in the opening in the insulating layer 280 and the like; an insulating layer 250 positioned in the opening and in contact with a bottom surface and a side surface of the conductive layer 260; a semiconductor layer 230c in contact with a bottom surface and a side surface of the insulating layer 250 and in contact with the top surface of the semiconductor layer 230b; and an insulating layer 244 positioned between the insulating layer 228 and the insulating layer 280 and including a portion in contact with a side surface of the semiconductor layer 230c.

Here, as illustrated in FIGS. 1(B) and 1(C), a top surface of the conductive layer 260 is preferably substantially aligned with the top surfaces of the insulating layer 250, the insulating layer 244, the semiconductor layer 230c, and the insulating layer 280. In addition, a region 253a is preferably formed in a region of the region 252a that is not in contact with the semiconductor layer 230c. In addition, a region 253b is preferably formed in a region of the region 252b that is not in contact with the semiconductor layer 230c.

Note that in the hereinafter, the semiconductor layer 230a, the semiconductor layer 230b, and the semiconductor layer 230c are collectively referred to as the semiconductor layer 230 in some cases. The region 252a and the region 252b are collectively referred to as the region 252 in some cases. The region 253a and the region 253b are collectively referred to as the region 253 in some cases.

Note that although a structure of the transistor 200 in which three layers of the semiconductor layer 230a, the semiconductor layer 230b, and the semiconductor layer 230c are stacked in a region where a channel is formed (hereinafter also referred to as a channel formation region) and its vicinity is illustrated, the present invention is not limited thereto. For example, a two-layer structure of the semiconductor layer 230b and the semiconductor layer 230c or a stacked-layer structure of four or more layers may be employed. Moreover, each of the semiconductor layer 230a, the semiconductor layer 230b, and the semiconductor layer 230c may have a stacked-layer structure of two or more layers.

For example, when the semiconductor layer 230c has a stacked-layer structure including a first oxide layer and a second oxide layer over the first oxide layer, it is preferable that the first oxide layer has a composition similar to that of the semiconductor layer 230b and the second oxide layer has a composition similar to that of the semiconductor layer 230a.

Here, the conductive layer 260 functions as a gate electrode of the transistor, and the region 252a and the region 253a, and the region 252b and the region 253b function as source regions or drain regions. As described above, the conductive layer 260 is formed to be embedded in an opening of the insulating layer 280 and the region interposed between the region 252a and the region 252b. Here, the positions of the conductive layer 260, the region 252a, and the region 252b with respect to the opening of the insulating layer 280 are selected in a self-aligned manner. That is, in the transistor 200, the gate electrode can be positioned between the source electrode and the drain electrode in a self-aligned manner. Therefore, the conductive layer 260 can be formed without an alignment margin, resulting in a reduction in the area occupied by the transistor 200. Accordingly, scaling down and high integration of the semiconductor device can be achieved.

In addition, as illustrated in FIG. 1, the conductive layer 260 preferably includes a conductive layer 260a provided inside the insulating layer 250 and a conductive layer 260b embedded in the conductive layer 260a. Note that in FIG. 1, although the conductive layer 260 has a two-layer stacked structure, the present invention is not limited thereto. For example, the conductive layer 260 may have a single-layer structure or a stacked-layer structure of three or more layers.

The transistor 200 preferably includes an insulating layer 214 positioned over the substrate (not illustrated); an insulating layer 216 positioned over the insulating layer 214; a conductive layer 205 positioned to be embedded in the insulating layer 216; an insulating layer 222 positioned over the insulating layer 216 and the conductive layer 205; and an insulating layer 224 positioned over the insulating layer 222. The semiconductor layer 230a is preferably positioned over the insulating layer 224.

An insulating layer 274 and an insulating layer 281 functioning as interlayer films are preferably positioned over the transistor 200. Here, the insulating layer 274 is preferably positioned to be in contact with the top surfaces of the conductive layer 260, the insulating layer 250, the insulating layer 244, the semiconductor layer 230c, and the insulating layer 280.

The insulating layer 222, the insulating layer 244, and the insulating layer 274 preferably have a function of inhibiting diffusion of hydrogen (e.g., a hydrogen atom, a hydrogen molecule, and the like). For example, the insulating layer 222, the insulating layer 244, and the insulating layer 274 preferably have lower hydrogen permeability than the insulating layer 224, the insulating layer 250, and the insulating layer 280. In addition, the insulating layer 222 and the insulating layer 244 preferably have a function of inhibiting diffusion of oxygen (e.g., an oxygen atom, an oxygen molecule, and the like). For example, the insulating layer 222 and the insulating layer 244 preferably have lower oxygen permeability than the insulating layer 224, the insulating layer 250, and the insulating layer 280.

Here, the insulating layer 224, the semiconductor layer 230, and the insulating layer 250 are separated from the insulating layer 280 and the insulating layer 281 by the insulating layer 244 and the insulating layer 274. Thus, entry of impurities such as hydrogen contained in the insulating layer 280 and the insulating layer 281 and excess oxygen into the insulating layer 224, the semiconductor layer 230, and the insulating layer 250 can be inhibited.

In addition, a conducting layer 240 (a conducting layer 240a and a conducing layer 240b) that is electrically connected to the transistor 200 and functions as a plug is preferably provided. Note that an insulating layer 241 (an insulating layer 241a and an insulating layer 241b) is provided in contact with a side surface of the conducting layer 240 functioning as a plug. In other words, the insulating layer 241 is provided in contact with an inner wall of an opening in the insulating layer 226, the insulating layer 228, the insulating layer 244, the insulating layer 280, the insulating layer 274, and the insulating layer 281. A structure may be employed in which a first conductive layer of the conductive layer 240 is provided in contact with a side surface of the insulating layer 241 and a second conductive layer of the conductive layer 240 is provided on the further inner side. Here, the height of a top surface of the conductive layer 240 and the height of a top surface of the insulating layer 281 can be substantially level with each other. Note that although the transistor 200 having a structure in which the first conductive layer of the conductive layer 240 and the second conductive layer of the conductive layer 240 are stacked is illustrated, the present invention is not limited thereto. For example, the conductive layer 240 may be provided as a single layer or a stacked-layer structure of three or more layers. When a component has a stacked-layer structure, layers may be distinguished by ordinal numbers corresponding to the formation order.

In the transistor 200, a metal oxide functioning as an oxide semiconductor (hereinafter also referred to as an oxide semiconductor) is preferably used for the semiconductor layer 230 (the semiconductor layer 230a, the semiconductor layer 230b, and the semiconductor layer 230c) including a channel formation region. For example, it is preferable to use a metal oxide having a bandgap of more than or equal to 2 eV, preferably more than or equal to 2.5 eV as the metal oxide to be the channel formation region of the semiconductor layer 230. With the use of a metal oxide having such a wide bandgap, the leakage current in a non-conduction state of the transistor (off-state current) can be extremely small. With the use of such a transistor, a semiconductor device with low power consumption can be provided.

For example, as the semiconductor layer 230, a metal oxide such as an In-M-Zn oxide (the element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used for the element M. Furthermore, indium oxide, zinc oxide, an In—Ga oxide, an In—Zn oxide, a Ga—Zn oxide, or gallium oxide may be used as the semiconductor layer 230.

Here, when an element that forms oxygen vacancies or an element that is bonded to oxygen vacancies is added to the semiconductor layer 230, the carrier concentration may be increased and the resistance may be reduced. Typical examples of the element include boron and phosphorus. Hydrogen, carbon, nitrogen, fluorine, sulfur, chlorine, titanium, a rare gas element, or the like can also be used. Typical examples of the rare gas include helium, neon, argon, krypton, and xenon. Furthermore, in the semiconductor layer 230, any one or a plurality of metal elements selected from metal elements such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added. Among the above-described elements, boron and phosphorus are preferable as the element to be added. Since an apparatus in a manufacturing line for amorphous silicon or low-temperature polysilicon can be used for the addition of boron and phosphorus, capital investment can be reduced. The concentration of the above element is measured by secondary ion mass spectrometry (SIMS) or the like.

In particular, an element that easily forms an oxide is preferably used as an element to be added in the semiconductor layer 230. Typical examples of the element include boron, phosphorus, aluminum, and magnesium. The element added in the semiconductor layer 230 can take oxygen in the semiconductor layer 230 to form an oxide. As a result, many oxygen vacancies are generated in the semiconductor layer 230. When the oxygen vacancies and hydrogen in the semiconductor layer 230 are bonded to each other, carriers are generated, and accordingly, a region with extremely low resistance is formed. Furthermore, the element added in the semiconductor layer 230 is present in the state of a stable oxide in the semiconductor layer 230; thus, even when a treatment that requires a high temperature is performed in a later step, the element is not easily released from the semiconductor layer 230. That is, the use of an element that easily forms an oxide as an element to be added to the semiconductor layer 230 enables formation of a region in the semiconductor layer 230 whose resistance is not easily increased even after going through a high-temperature process.

The region 252 is a region formed by adding the above element to the semiconductor layer 230. As illustrated in FIG. 1(B) and FIG. 2, the region 252a and the region 252b are formed facing each other with a region overlapping with the conductive layer 260 interposed therebetween. The top surfaces of the region 252a and the region 252b are preferably in contact with the insulating layer 226 or the semiconductor layer 230c. In a plan view, a portion of the region 252a and a portion of the region 252b preferably overlap with the conductive layer 260. Here, the concentration of the above element in the region 252 is higher than that in a portion of the semiconductor layer 230 where the region 252 and the region 253 are not formed. The amount of oxygen vacancies contained in the region 252 is preferably larger than the amount of oxygen vacancies contained in the portion of the semiconductor layer 230 where the region 252 and the region 253 are not formed. Thus, the region 252 has a higher carrier concentration and a lower resistance than the portion of the semiconductor layer 230 where the region 252 and the region 253 are not formed.

The region 253 is a region where a large amount of the above element is further added to a portion of the region 252. As illustrated in FIG. 1(B) and FIG. 2, a top surface of the region 253 is preferably in contact with the insulating layer 226. Here, the concentration of the above element in the region 253 is preferably higher than the concentration of the above element in the region 252. The amount of oxygen vacancies contained in the region 253 is preferably larger than the amount of oxygen vacancies contained in the region 252. Thus, the region 253 has high carrier concentration and low resistance compared with the region 252. Even in the case where the concentration of the above element contained in the region 253 is equal to or lower than that in the region 252, the depth at which the above element is contained in the region 253 may be deeper than the depth at which the above element is contained in the region 252.

For example, in the case where boron is contained in the semiconductor layer 230, boron can exist in a state of being bonded to oxygen. This can be confirmed when a spectrum peak attributed to a $B_2O_3$ bond is observed in an X-ray Photoelectron Spectroscopy (XPS) analysis.

Although the region 252 and the region 253 are illustrated as only being formed in the semiconductor layer 230b in FIG. 1(B) and FIG. 2, the region 252 and the region 253 may each be also formed in the semiconductor layer 230a.

As illustrated in FIG. 2, in the semiconductor layer 230, a region interposed between a pair of the regions 252 is referred to as a region 234. The region 234 corresponds to a channel formation region. Regions in which the region 252a and the region 252b are provided are called a region 232a and a region 232b, respectively (collectively referred to as a region 232). Regions in which the region 253a and the region 253b are provided are called a region 231a and a region 231b, respectively (collectively referred to as a region 231). As illustrated in FIG. 2, the region 234 is positioned between the region 231a and the region 231b, the region 232a is positioned between the region 231a and the region 234, and the region 232b is positioned between the region 231b and the region 234. Here, the region 231 is a region having high carrier concentration and low resistance compared with the region 234. The region 232 is a region having high carrier concentration and low resistance compared with the region 234, and a region having low carrier concentration and high resistance compared with the region 231. Accordingly, the region 234 functions as a channel formation region of the transistor 200, the region 231 functions as a source region or a drain region, and the region 232 functions as a junction region. A portion of the region 232 which is a junction region overlaps with the conductive layer 260.

With such a structure, a high-resistance offset region is prevented from being formed between the channel formation region and the source region or the drain region in the semiconductor layer 230, so that an effective channel length can be inhibited from being longer than the width of the conductive layer 260. Accordingly, the transistor 200 has high on-state current and favorable subthreshold characteristics, and thus high frequency characteristics can be achieved.

The formation of the region 231 functioning as a source region or a drain region in the semiconductor layer 230 enables the conductive layer 240 functioning as a plug to be connected to the region 231 without providing a source electrode and a drain electrode that are formed of a metal. When the source electrode and the drain electrode formed of a metal are provided in contact with the semiconductor layer 230, in the case where high-temperature heat treatment is performed in the manufacturing process or the back-end process of the transistor 200, the source electrode and the drain electrode formed of a metal may be oxidized, and the on-state current, the subthreshold characteristics, and the frequency characteristics of the transistor 200 may be degraded. However, in the semiconductor device described in this embodiment, it is not necessary to provide the source electrode and the drain electrode formed of a metal. Therefore, even when high-temperature heat treatment is performed in the manufacturing process or the back-end process of the transistor 200, a semiconductor device with favorable on-state current, subthreshold characteristics and frequency characteristics can be provided. For example, in the semiconductor device in this embodiment, after manufacturing the transistor 200, a process at a high temperature of 450° C. to 800° C., typically 600° C. to 750° C. can be performed.

By adding an element that forms oxygen vacancies to the region 252 and the region 253 and performing heat treatment, hydrogen contained in the region 234 functioning as a channel formation region can be trapped by oxygen vacancies included in the region 252 and the region 253 in some cases. Thus, the transistor 200 can have stable electrical characteristics and increased reliability.

Note that in FIG. 2, although the region 252 is formed in the vicinity of the interface between the semiconductor layer 230b and the insulating layer 226 in the thickness direction of the semiconductor layer 230b, the present invention is not limited thereto. For example, the region 252 may have substantially the same thickness as the semiconductor layer 230b or may also be formed in the semiconductor layer 230a.

In the oxide semiconductor layer 230, it is difficult to detect clearly boundaries between the regions in some cases. The concentration of a metal element and an impurity element such as hydrogen and nitrogen, which is detected in each region, may not only gradually change between the regions, but also continuously change (also referred to as gradation) within each region. That is, the concentration of a metal element and an impurity element such as hydrogen and nitrogen decreases in a region closer to the channel formation region.

Here, the insulating layer 226 positioned over the semiconductor layer 230 includes a portion that protrudes to the conductive layer 260 side (hereinafter also referred to as a protruding portion) rather than an end portion (an end surface, a side surface, or a tip) of the insulating layer 228. In addition, the protruding portion of the insulating layer 226 is rounded. Thus, the semiconductor layer 230c, the insulating layer 250, and the conductive layer 260 are formed to be embedded in the opening with improved coverage of the bottom portion of the opening. The shape of the bottom portion of the insulating layer 250 and the conductive layer 260 can be rounded; that is, a shape with a curved surface.

When the bottom portion of the conductive layer 260 and the insulating layer 250 is rounded, a potential can be supplied to the conductive layer 260 functioning as a gate electrode with less electric-field concentration. Thus, a transistor with high reliability can be achieved.

Although FIG. 2 illustrates an example in which the surface of the protruding portion of the insulating layer 226 has a convex curved surface shape, the present invention is not limited thereto, and any other shape in which the bottom portion of each of the insulating layer 250 and the conductive layer 260 can be rounded may be employed.

Figure 3:
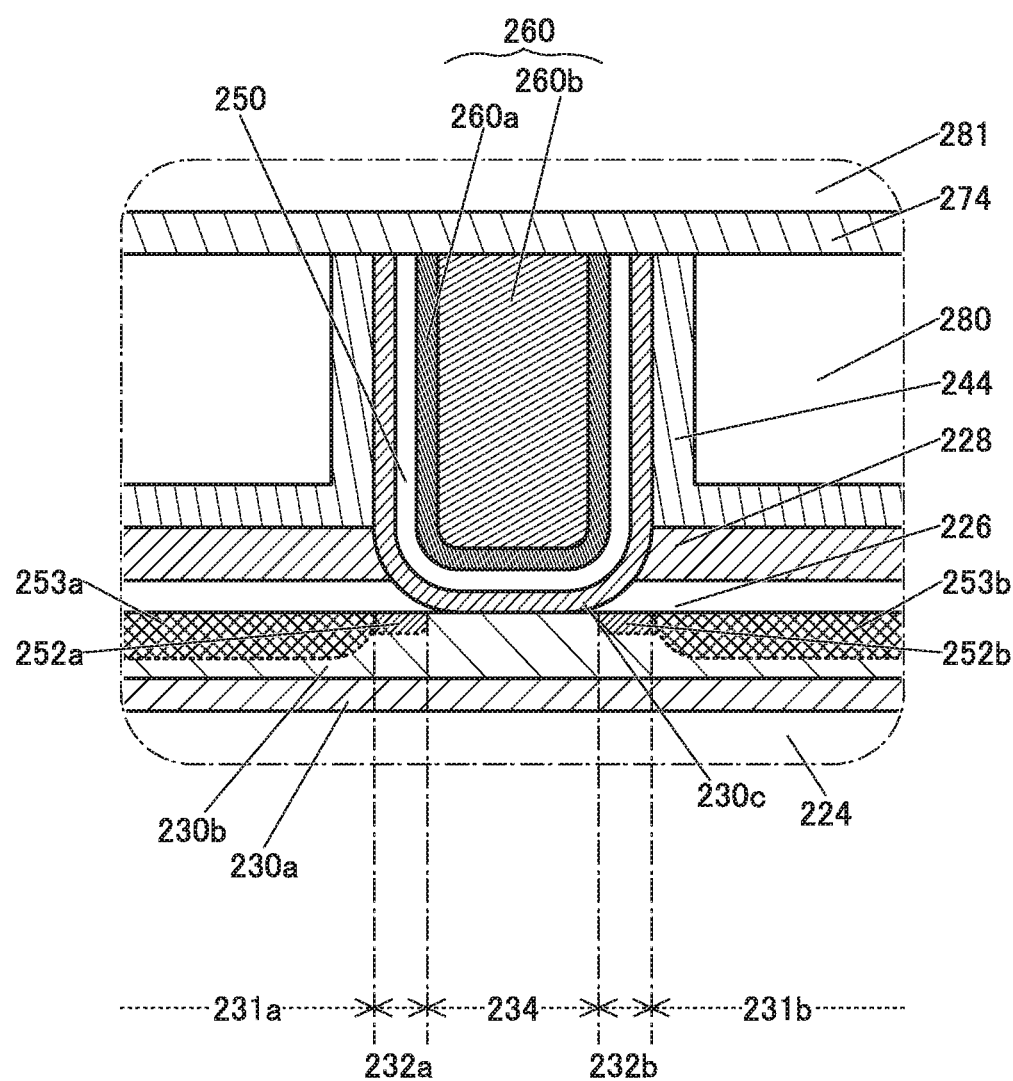
FIG. 3 A structure example of a semiconductor device.

FIG. 3 illustrates an example in which the surface of the protruding portion of the insulating layer 226 has a concave curved surface shape. Furthermore, in FIG. 3, a surface of the insulating layer 228 which is in contact with the semiconductor layer 230c has a concave curved surface shape that is consecutive to the surface of the insulating layer 226. With such a structure, the shape of each of the bottom portion of the conductive layer 260 and the insulating layer 250 can be more favorable.

Figure 4:
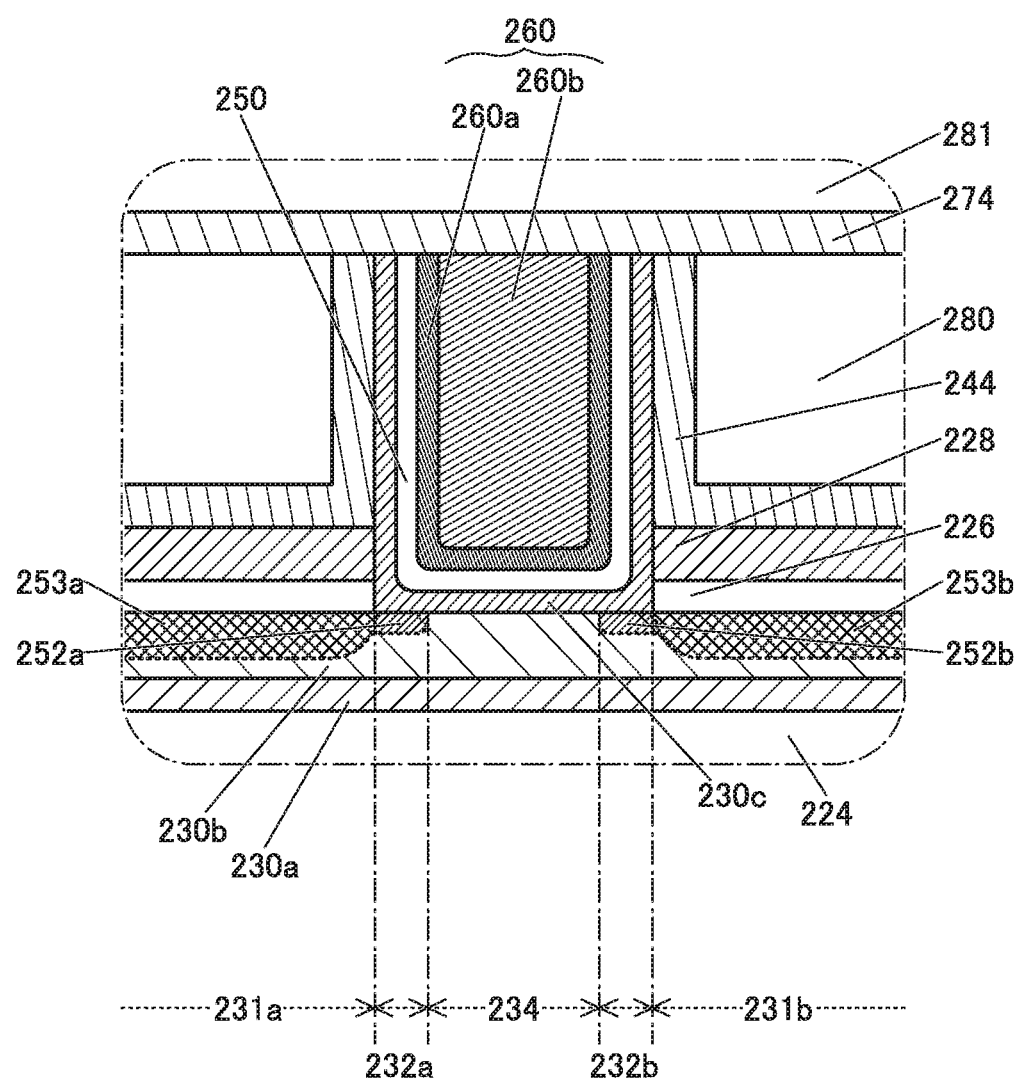
FIG. 4 A structure example of a semiconductor device.
Figure 5A:
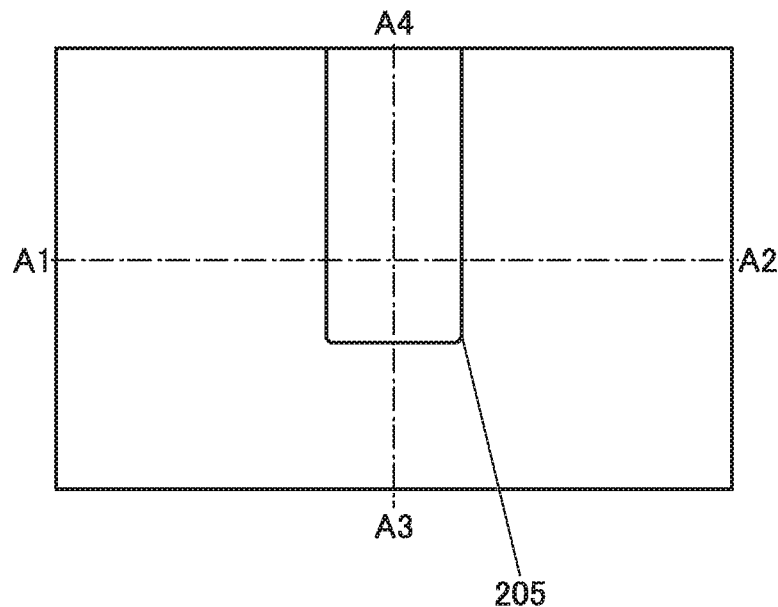
FIGS. 5A-5C Diagrams illustrating an example of a method for manufacturing a semiconductor device.
Figure 5C:
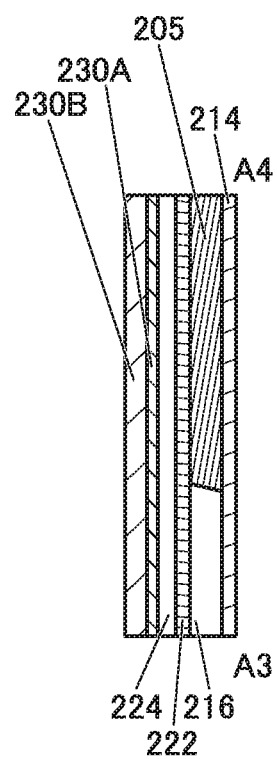
Figure 5B:
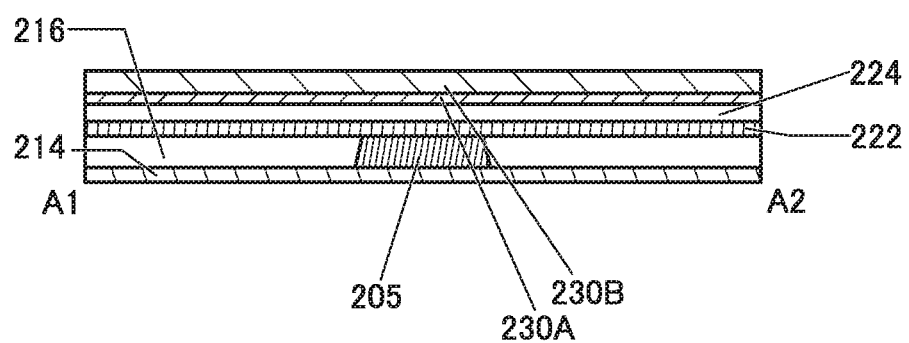
Figure 6A:
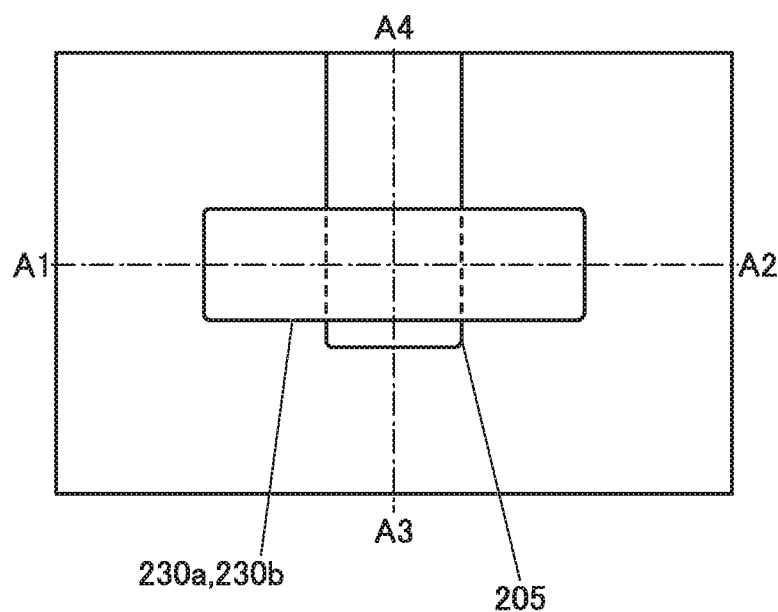
FIGS. 6A-6C Diagrams illustrating an example of a method for manufacturing a semiconductor device.
Figure 6C:
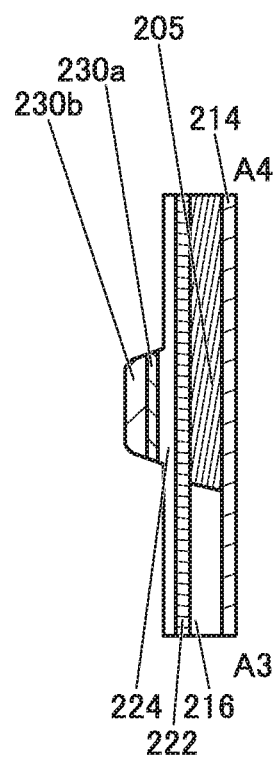
Figure 6B:
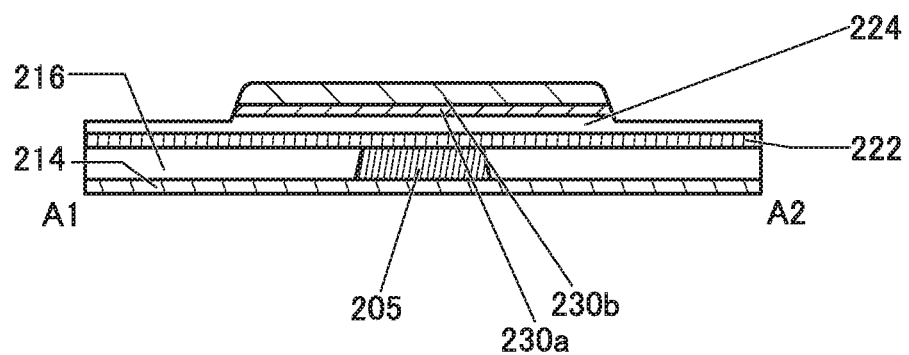

Note that in the case where the semiconductor layer 230c can be formed by a deposition method with high coverage, a structure in which the protruding portion is not provided in the insulating layer 226 as illustrated in FIG. 4 can be employed. FIG. 4 illustrates an example in which an end surface of the insulating layer 226 and an end surface of the insulating layer 228 are substantially aligned with each other in a plan view. At this time, the semiconductor layer 230c is provided in contact with the top surfaces of the region 252a and the region 252b. As illustrated in FIG. 4, a top surface of the semiconductor layer 230c in an opening is formed to have a concave curved surface, whereby the insulating layer 250 and the conductive layer 260 can have a rounded bottom surface.

Accordingly, a semiconductor device including a transistor with high on-state current can be provided. Alternatively, a semiconductor device including a transistor with high frequency characteristics can be provided. Alternatively, a semiconductor device that has stable electrical characteristics with reduced variations in electrical characteristics and higher reliability can be provided. Alternatively, a semiconductor device including a transistor with low off-state current can be provided.

The detailed structure of the semiconductor device including the transistor 200 according to one embodiment of the present invention is described below.

The conductive layer 205 is positioned to overlap with the semiconductor layer 230 and the conductive layer 260. Furthermore, the conductive layer 205 is preferably provided to be embedded in the insulating layer 216. Here, the top surface of the conductive layer 205 preferably has favorable planarity. For example, the average surface roughness (Ra) of the top surface of the conductive layer 205 is less than or equal to 1 nm, preferably less than or equal to 0.5 nm, further preferably less than or equal to 0.3 nm. This enables favorable planarity of the insulating layer 224 formed over the conductive layer 205 and improvement in the crystallinity of the semiconductor layer 230a, the semiconductor layer 230b and the semiconductor layer 230c.

Here, the conductive layer 260 functions as a first gate (also referred to as a top gate) electrode, and the conductive layer 205 functions as a second gate (also referred to as a bottom gate) electrode. In this case, by changing the potential applied to the conductive layer 205 not in conjunction with but independently from the potential applied to the conductive layer 260, the threshold voltage (Vth) of the transistor 200 can be controlled. In particular, the threshold voltage of the transistor 200 can be higher than 0 V and the off-state current can be reduced by applying a negative potential to the conductive layer 205.

The conductive layer 205 is preferably provided to overlap a channel formation region of the semiconductor layer 230. In particular, the conductive layer 205 is preferably extended outside the semiconductor layer 230 in the channel width direction as illustrated in FIG. 1(C). In other words, it is preferable that the conductive layer 205 and the conductive layer 260 be overlapped with each other with an insulating layer provided therebetween on the outside of the semiconductor layer 230.

By employing the above-described structure, the channel formation region of the semiconductor layer 230 can be electrically surrounded by the electric field of the conductive layer 260 functioning as the first gate electrode and the electric field of the conductive layer 205 functioning as the second gate electrode.

In addition, part of the conductive layer 205 can be used as a wiring. A structure in which a conductive layer functioning as a wiring is provided under the conductive layer 205 may be employed. The conductive layer 205 may be shared by a plurality of transistors.

For the conductive layer 205, a conductive material containing tungsten, copper, or aluminum as its main component is preferably used. Note that the conductive layer 205 is illustrated as a single layer but may also have a stacked-layer structure; for example, stacked layers of titanium or titanium nitride and the above conductive material.

In addition, a conductive layer that does not easily allow diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom may be provided below the conductive layer 205. Alternatively, it is preferable to use a conductive layer that does not easily allow diffusion of oxygen (e.g., at least one of an oxygen atom, an oxygen molecule, and the like).

When a conductive layer that does not easily allow diffusion of oxygen is used below the conductive layer 205, decrease in conductivity due to oxidation of the conductive layer 205 can be suppressed. For example, tantalum, tantalum nitride, ruthenium, ruthenium oxide, or the like is preferably used. Accordingly, the conductive layer positioned under the conductive layer 205 may be a single layer or stacked layers of the above conductive materials.

The insulating layer 214 preferably functions as a barrier insulating film that inhibits the entry of impurities such as water or hydrogen into the transistor 200 from the substrate side. Accordingly, for the insulating layer 214, an insulating material that does not easily allow diffusion of impurities such as a hydrogen atom, a hydrogen molecule, a water molecule, a nitrogen atom, a nitrogen molecule, a nitrogen oxide molecule, and a copper atom is preferably used. Moreover, an insulating material that does not easily allow diffusion of oxygen is preferably used.

For example, aluminum oxide, silicon nitride, or the like is preferably used for the insulating layer 214. Accordingly, impurities such as water or hydrogen can be inhibited from diffusing into the transistor 200 side from the substrate side through the insulating layer 214. Alternatively, oxygen contained in the insulating layer 224 and the like can be prevented from diffusing into the substrate side through the insulating layer 214.

In addition, the dielectric constant of the insulating layer 216, the insulating layer 280, and the insulating layer 281 each functioning as an interlayer film is preferably lower than that of the insulating layer 214. When a material with a low dielectric constant is used for the interlayer film, the parasitic capacitance generated between wirings can be reduced. For the insulating layer 216, the insulating layer 280, and the insulating layer 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulating layer 216 may have a stacked-layer structure. For example, it is preferable to employ a structure in which an insulating layer similar to the insulating layer 214 is provided in contact with a side surface of the conductive layer 205, and the above silicon oxide or the like is not in contact with the conductive layer 205. Accordingly, oxygen contained in the insulating layer 216 can be prevented from diffusing into the conductive layer 205, and thus the oxidation of the conductive layer 205 can be suppressed.

The insulating layer 222 and the insulating layer 224 each have a function of a gate insulating layer.

Here, it is preferable that oxygen be released from the insulating layer 224 in contact with the semiconductor layer 230 by heating. In this specification, oxygen that is released by heating is referred to as excess oxygen in some cases. For the insulating layer 224, silicon oxide or silicon oxynitride can be used, for example. When an insulating layer containing oxygen is provided in contact with the semiconductor layer 230, the amount of oxygen vacancies in the semiconductor layer 230 is reduced, whereby the reliability of the transistor 200 can be improved.

As the insulating layer 224, specifically, an oxide film from which oxygen is partly released by heating is preferably used. An oxide film that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$, or greater than or equal to $3.0 \times 10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

As illustrated in FIG. 1(C), in the insulating layer 224, a region that does not overlap with the semiconductor layer 230b is preferably thinner than the other regions. With such a structure, the lower end portion of the conductive layer 260 can be positioned lower, and thus, the electric field of the conductive layer 260 functioning as the first gate electrode is easily applied to a side surface of the semiconductor layer 230. Thus, the on-state current of the transistor 200 can be increased and the frequency characteristics can be improved. In addition, the insulating layer 224 may have an island shape to overlap with the semiconductor layer 230b and the semiconductor layer 230a.

Similar to the insulating layer 214 and the like, a material that does not easily allow diffusion of impurities such as water or hydrogen is preferably used for the insulating layer 222. It is further preferable to use a material that does not easily allow diffusion of oxygen for the insulating layer 222. When the insulating layer 224, the semiconductor layer 230, the insulating layer 250, and the like are surrounded by the insulating layer 222, the insulating layer 244, and the insulating layer 274, impurities such as water or hydrogen can be inhibited from entering the transistor 200 from the outside. Furthermore, with the insulating layer 222, diffusion of oxygen contained in the semiconductor layer 230 to the substrate side can be reduced.

In particular, it is preferable that aluminum oxide, hafnium oxide, an oxide containing aluminum and hafnium (hafnium aluminate), or the like be used for the insulating layer 222. By using such a material, release of oxygen from the semiconductor layer 230 and entry of impurities such as hydrogen from the peripheral portion of the transistor 200 into the semiconductor layer 230 can be suppressed.

For the insulating layer 222, a single layer or stacked layers of an insulating film containing what is called a high-k material such as tantalum oxide, zirconium oxide, lead zirconate titanate (PZT), strontium titanate (SrTiO$_3$), or (Ba,Sr)TiO$_3$ (BST) may be used. Thus, even in the case where the thickness of a gate insulating layer is reduced due to scaling down and high integration of transistors, increase in leakage current is suppressed by increasing the physical thickness, and a gate potential at the time of operating the transistor can be reduced.

Note that the insulating layer 222 and the insulating layer 224 may each have a stacked-layer structure of two or more layers. In that case, without limitation to a stacked-layer structure formed of the same material, a stacked-layer structure formed of different materials may be employed. For example, an insulating layer similar to the insulating layer 224 may be provided below the insulating layer 222.

The semiconductor layer 230 includes the semiconductor layer 230a, the semiconductor layer 230b over the semiconductor layer 230a, and the oxide semiconductor layer 230c over the semiconductor layer 230b. When the semiconductor layer 230a is provided below the semiconductor layer 230b, impurities can be inhibited from diffusing into the semiconductor layer 230b from the structures formed below the semiconductor layer 230a. When the semiconductor layer 230c is provided over the semiconductor layer 230b, impurities can be inhibited from diffusing into the semiconductor layer 230b from the structures formed above the semiconductor layer 230c.

The semiconductor layer 230 preferably has a stacked-layer structure of metal oxides in which the atomic ratio of each metal atom is different. Specifically, the atomic ratio of the element M to constituent elements in the metal oxide used as the semiconductor layer 230a is preferably greater than that in the metal oxide used as the semiconductor layer 230b. Moreover, the atomic ratio of the element M to In in the metal oxide used as the semiconductor layer 230a is preferably greater than that in the metal oxide used as the semiconductor layer 230b. Moreover, the atomic ratio of In to the element M in the metal oxide used as the semiconductor layer 230b is preferably greater than that in the metal oxide used as the semiconductor layer 230a. As the semiconductor layer 230c, a metal oxide which can be used as the semiconductor layer 230a or the semiconductor layer 230b can be used.

The semiconductor layer 230a, the semiconductor layer 230b, and the semiconductor layer 230c preferably have crystallinity, and in particular preferably use CAAC-OS. An oxide having crystallinity, such as a CAAC-OS, has a dense structure with small amounts of impurities and defects (oxygen vacancies or the like) and high crystallinity. With the use of such a semiconductor layer 230, the transistor 200 is stable in high temperatures in a manufacturing process (what is called a thermal budget).

The energy of the conduction band minimum of the semiconductor layer 230a and the semiconductor layer 230c is preferably higher than that of the semiconductor layer 230b. In other words, the electron affinity of the semiconductor layer 230a and the semiconductor layer 230c is preferably lower than that of the semiconductor layer 230b. In this case, a metal oxide that can be used for the semiconductor layer 230a is preferably used for the semiconductor layer 230c. Specifically, the atomic ratio of the element M to constituent elements in the metal oxide used as the semiconductor layer 230c is preferably greater than that in the metal oxide used as the semiconductor layer 230b. Moreover, the atomic ratio of the element M to In in the metal oxide used as the semiconductor layer 230c is preferably greater than that in the metal oxide used as the semiconductor layer 230b. Moreover, the atomic ratio of In to the element M in the metal oxide used as the semiconductor layer 230b is preferably greater than that in the metal oxide used as the semiconductor layer 230c.

The energy level of the conduction band minimum gradually changes at the junction portions of the semiconductor layer 230a, the semiconductor layer 230b, and the semiconductor layer 230c. In other words, the energy level of the conduction band minimum at the junction portions of the semiconductor layer 230a, the semiconductor layer 230b, and the semiconductor layer 230c continuously changes or is continuously connected. To obtain this, the density of defect states in a mixed layer formed at an interface between the semiconductor layer 230a and the semiconductor layer 230b, and an interface between the semiconductor layer 230b and the semiconductor layer 230c is preferably made low.

Specifically, when the semiconductor layer 230a and the semiconductor layer 230b or the semiconductor layer 230b and the semiconductor layer 230c contain the same element other than oxygen as a main component, a mixed layer with a low density of defect states can be formed. For example, when the semiconductor layer 230b is an In—Ga—Zn oxide, an In—Ga—Zn oxide, a Ga—Zn oxide, gallium oxide, or the like may be used as the semiconductor layer 230a and the semiconductor layer 230c. The semiconductor layer 230c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, a stacked-layer structure of an In—Ga—Zn oxide and an oxide that does not contain In may be employed as the semiconductor layer 230c.

Specifically, as the semiconductor layer 230a, a metal oxide having In:Ga:Zn=1:3:4 [atomic ratio] or In:Ga:Zn=1:1:0.5 [atomic ratio] is used. As the semiconductor layer 230b, a metal oxide having In:Ga:Zn=1:1:1 [atomic ratio], In:Ga:Zn=4:2:3 [atomic ratio], or In:Ga:Zn=3:1:2 [atomic ratio], or Ga:Zn=2:5 [atomic ratio] is used. As the semiconductor layer 230c, a metal oxide having In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Furthermore, as a specific example of the semiconductor layer 230c having a stacked-layer structure, a stacked-layer structure of a metal oxide having In:Ga:Zn=4:2:3 [atomic ratio] and a metal oxide having Ga:Zn=2:1 [atomic ratio], a stacked-layer structure of a metal oxide having In:Ga:Zn=4:2:3 [atomic ratio] and a metal oxide having Ga:Zn=2:5 [atomic ratio], or a stacked-layer structure of a metal oxide having In:Ga:Zn=4:2:3 [atomic ratio] and a gallium oxide can be given.

At this time, the semiconductor layer 230b serves as a main carrier path. When the semiconductor layer 230a and the semiconductor layer 230c have the above structure, the density of defect states at the interface between the semiconductor layer 230a and the semiconductor layer 230b and the interface between the semiconductor layer 230b and the semiconductor layer 230c can be made low. Thus, the influence of interface scattering on carrier conduction becomes small, and the transistor 200 can have high on-state current and high frequency characteristics. Note that in the case where the semiconductor layer 230c has a stacked-layer structure, in addition to the reduction of density of defect states at the interface between the semiconductor layer 230b and the semiconductor layer 230c, diffusion of the constituent elements of the semiconductor layer 230c to the insulating layer 250 side is expected to be inhibited. More specifically, the semiconductor layer 230c has a stacked-layer structure and a metal oxide film that does not include In is positioned in the upper portion of the stacked layer structure, so that In, which can diffuse into the insulating layer 250 side, can be inhibited. Since the insulating layer 250 functions as a gate insulating layer, diffusion of In would cause defects in characteristics of the transistor. Thus, when the semiconductor layer 230c has a stacked-layer structure, a highly reliable semiconductor device can be provided.

A region (the region 234) between the region 252a and the region 252b overlaps with an opening in the insulating layer 280. Thus, the conductive layer 260 can be positioned between the region 252a and the region 252b in a self-aligned manner.

The insulating layer 250 functions as a gate insulating layer. The insulating layer 250 is preferably positioned in contact with the top surface of the semiconductor layer 230c. For the insulating layer 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

As in the insulating layer 224, the concentration of impurities such as water or hydrogen contained in the insulating layer 250 is preferably lowered. The thickness of the insulating layer 250 is preferably greater than or equal to 1 nm and less than or equal to 20 nm.

Furthermore, a metal oxide layer may be provided between the insulating layer 250 and the conductive layer 260. The metal oxide layer preferably inhibits diffusion of oxygen from the insulating layer 250 to the conductive layer 260. Accordingly, oxidation of the conductive layer 260 due to oxygen from the insulating layer 250 can be inhibited.

In addition, the metal oxide layer has a function of part of the gate insulating layer in some cases. Therefore, when silicon oxide, silicon oxynitride, or the like is used for the insulating layer 250, a metal oxide that is a high-k material with high relative dielectric constant is preferably used for the metal oxide layer. When the gate insulating layer has a stacked-layer structure of the insulating layer 250 and the metal oxide layer, the stacked-layer structure can be thermally stable and have high relative dielectric constant. Thus, a gate potential that is applied during operation of the transistor can be reduced while maintaining the physical thickness of the gate insulating film. In addition, the equivalent oxide thickness (EOT) of the insulating layer functioning as the gate insulating layer can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. In particular, aluminum oxide, hafnium oxide, or hafnium aluminate is preferably used.

Although FIG. 1 illustrates the conductive layer 260 having a two-layer structure, the conductive layer 260 may have a single-layer structure or a stacked-layer structure of three or more layers.

For the conductive layer 260a, it is preferable to use the above conductive film that does not easily allow diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material that does not easily allow diffusion of oxygen (e.g., an oxygen atom, an oxygen molecule, and the like). Thus, oxidation of the conductive layer 260b can be inhibited. Examples of the conductive material that does not easily allow diffusion of oxygen include tantalum, tantalum nitride, ruthenium, or ruthenium oxide.

The conductive layer 260b is preferably formed using a conductive material containing tungsten, copper, or aluminum as its main component. The conductive layer 260 also functions as a wiring and thus a conductive film having high conductivity is preferably used. The conductive layer 260b may have a stacked-layer structure, for example, a stacked-layer structure of any of the above conductive materials and titanium or titanium nitride.

A metal oxide layer that can be used as the semiconductor layer 230 may be provided between the insulating layer 250 and the conductive layer 260a. At this time, the metal oxide layer functions as a gate electrode, as in the conductive layer 260. It is preferable that the metal oxide layer be provided so that oxygen can be supplied to at least one of the insulating layer 250 and the semiconductor layer 230. When a metal oxide in which oxygen is not easily diffused is used as the metal oxide layer, oxidation of the conductive layer 260 due to oxygen contained in the insulating layer 250 or the insulating layer 280 can be suppressed.

The insulating layer 226 is provided in contact with the top surface of the semiconductor layer 230b and a side surface of the semiconductor layer 230a. For the insulating layer 226, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

As in the insulating layer 250 and the like, the concentration of impurities such as water or hydrogen contained in the insulating layer 226 is preferably lowered. The thickness of the insulating layer 226 is preferably greater than or equal to 1 nm and less than or equal to 20 nm.

Here, the insulating layer 226 and the insulating layer 228 preferably contain the same element as that added to the region 252 or the region 253. In particular, the above-mentioned elements that easily form oxides such as boron, phosphorus, aluminum, and magnesium are preferably contained.

In particular, in the case where an insulating film containing an oxide is used for the insulating layer 226 in contact with the semiconductor layer 230a, the above-mentioned elements that easily form oxides such as boron, phosphorus, aluminum, and magnesium may be bonded to oxygen contained in the film to exist as an oxide. In particular, in the case where the insulating layer 226 contains excess oxygen, the excess oxygen and the above element are bonded to each other, whereby the amount of oxygen that can be supplied to the semiconductor layer 230a can be reduced. Accordingly, even in the case where a treatment requiring a high temperature is performed in a process, the resistance of the region 252 and the region 253 in the semiconductor layer 230a can be prevented from being increased.

For example, in the case where boron is contained in the insulating layer 226, boron can exist in a state of being bonded to oxygen. This can be confirmed when a spectrum peak attributed to a $B_2O_3$ bond is observed in XPS analysis, for example.

The addition of the above elements can provide the insulating layer 226 containing an oxide with a property of inhibiting permeation of oxygen. Accordingly, oxygen can be prevented from being supplied from a layer positioned above the insulating layer 226 to the region 252 and the region 253 through the insulating layer 226.

Similar to the insulating layer 214 and the like, the insulating layer 228 and the insulating layer 244 preferably function as a barrier insulating film that inhibits the entry of impurities such as water or hydrogen into the transistor 200 from the insulating layer 280 side. For example, for the insulating layer 228 and the insulating layer 244, a material having a lower hydrogen permeability than the insulating layer 224 can be used. As illustrated in FIGS. 1(B) and 1(C), the insulating layer 228 is provided in contact with a top surface of the insulating layer 226. The insulating layer 244 is provided in contact with a top surface of the insulating layer 228 and a side surface of the semiconductor layer 230c. With this structure, hydrogen contained in the insulating layer 280 can be inhibited from entering from the top surfaces or the side surfaces of the semiconductor layer 230a, the semiconductor layer 230b, the semiconductor layer 230c, and the insulating layer 226.

Furthermore, for the insulating layer 228 and the insulating layer 244, an insulating material that does not easily allow oxygen to permeate is preferably used. For example, the insulating layer 228 and the insulating layer 244 preferably have lower oxygen permeability than the insulating layer 280 or the insulating layer 224.

The insulating layer 228 is preferably deposited by a sputtering method. When the insulating layer 228 is deposited by a sputtering method in an oxygen-containing atmosphere, oxygen can be added to the vicinity of a region of the insulating layer 226 that is in contact with the insulating layer 228. Accordingly, oxygen can be supplied from the region to the semiconductor layer 230 through the insulating layer 226. Accordingly, oxygen vacancies in the semiconductor layer 230 can be reduced, so that the transistor can be inhibited from becoming normally on.

An insulating film containing an oxide of one or both of aluminum and hafnium is preferably deposited as the insulating layer 228 and the insulating layer 244, for example. For example, aluminum oxide, hafnium oxide, or hafnium aluminate is preferably used.

In particular, an insulating film containing aluminum nitride can be used as the insulating layer 244, for example. For example, it is preferable to use a nitride insulating film that satisfies the composition formula $AlN_x$ (x is a real number greater than 0 and less than or equal to 2, and preferably, x is a real number greater than 0.5 and less than or equal to 1.5). Accordingly, a film having an excellent insulating property and high thermal conductivity can be obtained, and thus dissipation of heat generated in driving the transistor 200 can be increased. Furthermore, aluminum titanium nitride, titanium nitride, or the like can be used for the insulating layer 244. In this case, deposition by a sputtering method is preferable because deposition can be performed without using a highly-oxidizing gas such as oxygen or ozone as a deposition gas. In addition, silicon nitride, silicon nitride oxide, or the like can be used.

The insulating layer 244 is preferably deposited using an ALD (Atomic Layer Deposition) method. Since an ALD method is a deposition method that achieves favorable coverage, even when the formation surface has an uneven shape, a film can be deposited with uniform thickness.

The insulating layer 280 is provided over the insulating layer 224 and the semiconductor layer 230 with the insulating layer 244, the insulating layer 228, and the insulating layer 226 interposed therebetween. For example, for the insulating layer 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water or hydrogen in the insulating layer 280 is preferably lowered. In addition, the top surface of the insulating layer 280 is preferably planarized.

Similar to the insulating layer 214 and the like, the insulating layer 274 preferably functions as a barrier insulating film that inhibits the entry of impurities such as water or hydrogen from above into the insulating layer 280. As the insulating layer 274, for example, an insulating film that can be used as the insulating layer 214, the insulating layer 244, or the like may be used.

The insulating layer 281 functioning as an interlayer film is preferably provided over the insulating layer 274. As in the insulating layer 224 and the like, the concentration of impurities such as water or hydrogen in the insulating layer 281 is preferably reduced.

In addition, the conductive layer 240a and the conductive layer 240b are provided in an opening formed in the insulating layer 281, the insulating layer 274, the insulating layer 280, the insulating layer 244, and the insulating layer 228, and the insulating layer 226. The conductive layer 240a and the conductive layer 240b are provided to face each other with the conductive layer 260 interposed therebetween. Note that it is preferable that the top surfaces of the conductive layer 240a and the conductive layer 240b be planarized to be the same level as the top surface of the insulating layer 281.

Note that the insulating layer 241a or the insulating layer 241b is provided in contact with an inner wall of an opening in the insulating layer 281, the insulating layer 274, the insulating layer 280, the insulating layer 244, the insulating layer 228, and the insulating layer 226, and a first conductive layer of the conductive layer 240a or the conductive layer 240b is formed in contact with a side surface of the insulating layer 241a or the insulating layer 241b. The region 253a or the region 253b is positioned in at least part of a bottom portion of the opening, and the conductive layer 240a or the conductive layer 240b is in contact with the region 253a or the region 253b.

For the conductive layer 240a and the conductive layer 240b, a conductive material containing tungsten, copper, or aluminum as its main component is preferably used. In addition, the conductive layer 240a and the conductive layer 240b may have a stacked-layer structure.

When the conductive layer 240 has a stacked-layer structure, it is preferable that the above-mentioned conductive film in which impurities such as water or hydrogen is not easily diffused be used as a conductive layer positioned on the side of the semiconductor layer 230a, the semiconductor layer 230b, the insulating layer 281, the insulating layer 274, the insulating layer 280, the insulating layer 244, the insulating layer 228, and the insulating layer 226. For example, tantalum, tantalum nitride, titanium, titanium nitride, ruthenium, ruthenium oxide, or the like is preferably used. When the conductive material is used, it is possible to inhibit oxygen added to the insulating layer 280 from being absorbed by the conductive layer 240a and the conductive layer 240b, and impurities such as water or hydrogen from entering from a layer above the insulating layer 281 into the semiconductor layer 230 through the conductive layer 240a and the conductive layer 240b.

For the insulating layer 241a and the insulating layer 241b, an insulating film that can be used for the insulating layer 214 or the like such as aluminum oxide or silicon nitride can be used. Since the insulating layer 241a and the insulating layer 241b are provided to be in contact with the insulating layer 228 and the insulating layer 244, impurities such as water or hydrogen can be prevented from entering the semiconductor layer 230 from the insulating layer 280 or the like through the conductive layer 240a and the conductive layer 240b, and oxygen contained in the insulating layer 280 can be prevented from being absorbed by the conductive layer 240a and the conductive layer 240b.

The insulating layer 241a and the insulating layer 241b can be formed by using an ALD method or a chemical vapor deposition (CVD) method.

In addition, although not illustrated, a conductive layer functioning as a wiring may be provided in contact with the top surface of the conductive layer 240a and the top surface of the conductive layer 240b. For the conductive layer functioning as a wiring, a conductive material containing tungsten, copper, or aluminum as its main component is preferably used. Furthermore, the conductive layer may have a stacked-layer structure; for example, stacked layers of the above conductive material and titanium or titanium nitride. The conductive layer may be formed to be embedded in an opening provided in an insulating layer.

In addition, although not illustrated, an insulating layer having resistivity higher than or equal to $1.0 \times 10^{13}$ Ωcm and lower than or equal to $1.0 \times 10^{15}$ Ωcm, preferably higher than or equal to $5.0 \times 10^{13}$ Ωcm and lower than or equal to $5.0 \times 10^{14}$ Ωcm is preferably provided to cover the conductive layer. It is preferable that an insulating layer having resistivity in the above range be provided over the conductive layer, in which case the insulating layer can disperse electric charge accumulated in the transistor 200 or between wirings of the conductive layer or the like and can inhibit poor characteristics and electrostatic breakdown of a transistor and an electronic device including the transistor due to the electric charge, while maintaining the insulating property.

<Constituent Material of Semiconductor Device>

Constituent materials that can be used for a semiconductor device are described below.

<<Substrate>>

As a substrate over which the transistor 200 is formed, an insulating substrate, a semiconductor substrate, or a conductive substrate is used, for example. Examples of the insulating substrate include a glass substrate, a quartz substrate, a sapphire substrate, a stabilized zirconia substrate (an yttria-stabilized zirconia substrate or the like), and a resin substrate. In addition, examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example is a semiconductor substrate in which an insulating region is included in the semiconductor substrate such as an SOI (Silicon On Insulator) substrate. Examples of the conductive substrate include a graphite substrate, a metal substrate, an alloy substrate, and a conductive resin substrate. Other examples include a substrate including a metal nitride and a substrate including a metal oxide. Other examples include an insulating substrate provided with a conductive layer or a semiconductor, a semiconductor substrate provided with a conductive layer or an insulating layer, and a conductive substrate provided with a semiconductor or an insulating layer. Alternatively, these substrates provided with elements may be used. Examples of elements provided for the substrates include a capacitor, a resistor, a switching element, a light-emitting element, and a memory element.

<<Insulating Layer>>

An insulating oxide, an insulating nitride, an insulating oxynitride, an insulating nitride oxide, an insulating metal oxide, an insulating metal oxynitride, an insulating metal nitride oxide, or the like can be used as the insulating layer.

As scaling down and high integration of the transistor progress, for example, a problem such as leakage current may arise because of a thinner gate insulating layer. When a high-k material is used for the insulating layer functioning as a gate insulating layer, the voltage when the transistor operates can be reduced while maintaining the physical thickness of the gate insulator. In contrast, when a material with low dielectric constant is used for the insulating layer functioning as an interlayer film, parasitic capacitance generated between wirings can be reduced. Thus, a material is preferably selected in accordance with the function of an insulating layer.

In addition, examples of insulating materials with high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

In addition, examples of insulating materials with low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In addition, when a transistor using an oxide semiconductor is surrounded by an insulating layer (the insulating layer 214, the insulating layer 222, the insulating layer 228, the insulating layer 244, the insulating layer 274, or the like) having a function of inhibiting the permeation of oxygen and impurities such as hydrogen, the electrical characteristics of the transistor can be stable. For the insulating layer having a function of inhibiting the permeation of oxygen and impurities such as hydrogen, a single layer or stacked layers of an insulating layer containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulating layer having a function of inhibiting permeation of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide or silicon nitride; or the like can be used.

In addition, the insulating layer functioning as the gate insulating layer is preferably an insulating layer including a region containing oxygen released by heating. For example, when a structure is employed in which silicon oxide or silicon oxynitride including a region containing oxygen released by heating is in contact with the semiconductor layer 230, oxygen vacancies included in the semiconductor layer 230 can be compensated for.

<<Conductive Layer>>

For the conductive layer, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure in which a material containing the above metal element and a conductive material containing oxygen are combined is preferably used for the conductive layer functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductive layer functioning as the gate electrode, a conductive material containing oxygen and a metal element contained in a metal oxide where the channel is formed. A conductive material containing the above metal element and nitrogen may be used. For example, a conductive material containing nitrogen, such as titanium nitride or tantalum nitride, may be used. In addition, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulating layer or the like can be trapped in some cases.

<<Metal Oxide>>

As the semiconductor layer 230, a metal oxide functioning as an oxide semiconductor is preferably used. A metal oxide that can be used as the semiconductor layer 230 of the present invention is described below.

The oxide semiconductor preferably contains at least indium or zinc. In particular, indium and zinc are preferably contained. Furthermore, aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, the element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that a plurality of above elements may be used in combination as the element M.

Note that in this specification and the like, a metal oxide containing nitrogen is also collectively referred to as a metal oxide in some cases. A metal oxide containing nitrogen can also be referred to as a metal oxynitride.

Oxide semiconductors are classified into a single crystal oxide semiconductor and a non-single-crystal oxide semiconductor. A polycrystalline oxide semiconductor, an amorphous oxide semiconductor, and the like are known as non-single-crystal oxide semiconductors, for example.

For an oxide semiconductor used for a semiconductor of the transistor, a thin film having high crystallinity is preferably used. With use of the thin film, the stability or reliability of the transistor can be improved. Examples of the thin film include a thin film of a single crystal oxide semiconductor and a thin film of a polycrystalline oxide semiconductor. However, to form the thin film of a single crystal oxide semiconductor or the thin film of a polycrystalline oxide semiconductor over a substrate, a high-temperature process or a laser heating process is needed. Thus, manufacturing cost is increased, and throughput is decreased.

Non-Patent Document 1 and Non-Patent Document 2 have reported that an In—Ga—Zn oxide having a CAAC structure (referred to as CAAC-IGZO) was found in 2009. Here, it has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, an In—Ga—Zn oxide having an nc structure (referred to as nc-IGZO) was found in 2013 (see Non-Patent Document 3). Here, it has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown changes in average crystal size due to electron beam irradiation to thin films of CAAC-IGZO, nc-IGZO, and IGZO having low crystallinity. In the thin film of IGZO having low crystallinity, crystalline IGZO with a size of approximately 1 nm was observed even before electron beam irradiation. Thus, here, it has been reported that the existence of a completely amorphous structure could not be observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for the semiconductor of the transistor.

Non-Patent Document 6 has shown that a transistor using an oxide semiconductor has extremely low leakage current in a non-conduction state; specifically, off-state current per micrometer in the channel width of the transistor is on the order of yA/μm ($10^{-24}$ A/μm). For example, a low-power-consumption CPU (Central Processing Unit) and the like utilizing the property of low leakage current of the transistor using an oxide semiconductor has been disclosed (see Non-Patent Document 7).

Furthermore, application of a transistor using an oxide semiconductor to a display device utilizing the property of low leakage current of the transistor has been reported (see Non-Patent Document 8). In the display device, a displayed image is changed several tens of times per second. The number of times an image is changed per second is referred to as a refresh rate. The refresh rate is also referred to as drive frequency. Such high-speed screen change that is difficult for human eyes to recognize is considered a cause of eyestrain. Thus, it is proposed that the refresh rate of the display device is lowered to reduce the number of times of image rewriting. Moreover, driving with a lowered refresh rate can reduce the power consumption of the display device. Such a driving method is referred to as idling stop (IDS) driving.

The finding of the CAAC structure and the nc structure has contributed to improvements in electrical characteristics and reliability of a transistor using an oxide semiconductor having the CAAC structure or the nc structure, a reduction in manufacturing cost, and an improvement in throughput. Furthermore, applications of the transistor to a display device and an LSI utilizing the property of low leakage current of the transistor have been studied.

[Composition of Metal Oxide]

The composition of a CAC (Cloud-Aligned Composite)-OS that can be used in a transistor disclosed in one embodiment of the present invention will be described below.

Note that in this specification and the like, "CAAC (c-axis aligned crystal)" and "CAC (cloud-aligned composite)" is mentioned in some cases. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize both functions.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of this structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

[Structure of Metal Oxide]

An oxide semiconductor is classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to the low density of oxygen atom arrangement in the a-b plane direction, a change in interatomic bond distance by replacement of a metal element, and the like.

Furthermore, the CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. Meanwhile, in the CAAC-OS, it can be said that a reduction in electron mobility due to the crystal grain boundary is less likely to occur because a clear crystal grain boundary cannot be observed. Furthermore, the crystallinity of the oxide semiconductor is lowered in some cases due to the mixing of impurities, formation of defects, or the like; thus, it can also be said that the CAAC-OS is an oxide semiconductor having little amounts of impurities and defects (oxygen vacancies or the like). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor having a structure between those of the nc-OS and the amorphous oxide semiconductor. The a-like OS contains a void or a low-density region. That is, the a-like OS has low crystallinity compared with the nc-OS and the CAAC-OS.

An oxide semiconductor has various structures with different properties. An oxide semiconductor of one embodiment of the present invention may include two or more of the amorphous oxide semiconductor, the polycrystalline oxide semiconductor, the a-like OS, the nc-OS, and the CAAC-OS.

[Transistor Including Oxide Semiconductor]

Next, the case where the above oxide semiconductor is used for a transistor is described.

Note that when the above oxide semiconductor is used for a transistor, a transistor with high field-effect mobility can be achieved. In addition, a transistor having high reliability can be achieved.

An oxide semiconductor with a low carrier concentration is preferably used for a transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. For example, the carrier density of the oxide semiconductor is set lower than $8 \times 10^{11}$/ cm$^3$, preferably lower than 1×10$^{11}$/cm$^3$, further preferably lower than 1×10$^{10}$/cm$^3$, and greater than or equal to 1×10$^{-9}$/cm$^3$.

In addition, a highly purified intrinsic or substantially highly purified intrinsic oxide semiconductor film has a low density of defect states and thus has a low density of trap states in some cases.

Furthermore, electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Therefore, in order to stabilize the electrical characteristics of the transistor, reducing the impurity concentration in the oxide semiconductor is effective. Furthermore, in order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

[Impurities]

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are lower than or equal to 2×10$^{18}$ atoms/cm$^3$, preferably lower than or equal to 2×10$^{17}$ atoms/cm$^3$.

Furthermore, when the oxide semiconductor contains an alkali metal or an alkaline earth metal, defect states are formed and carriers are generated in some cases. Thus, a transistor using an oxide semiconductor containing an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to 1×10$^{18}$ atoms/cm$^3$, preferably lower than or equal to 2×10$^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than 5×10$^{19}$ atoms/cm$^3$, preferably lower than or equal to 5×10$^{18}$ atoms/cm$^3$, further preferably lower than or equal to 1×10$^{18}$ atoms/cm$^3$, still further preferably lower than or equal to 5×10$^{17}$ atoms/cm$^3$.

In addition, hydrogen contained in the oxide semiconductor reacts with oxygen bonded to a metal atom to become water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than 1×10$^{20}$ atoms/cm$^3$, preferably lower than 1×10$^{19}$ atoms/cm$^3$, further preferably lower than 5×10$^{18}$ atoms/cm$^3$, still further preferably lower than 1×10$^{18}$ atoms/cm$^3$.

When an oxide semiconductor with sufficiently reduced impurities is used for the channel formation region of the transistor, stable electrical characteristics can be given.

<Method for Manufacturing Semiconductor Device>

Next, a method for manufacturing a semiconductor device including the transistor 200 according to one embodiment of the present invention illustrated in FIG. 1 is described with reference to FIG. 5 to FIG. 15. FIG. 5(A) to FIG. 15(A) illustrate top views. FIG. 5(B) to FIG. 15(B) are cross-sectional views corresponding to a portion indicated by a dashed-dotted line A1-A2 in FIG. 5(A) to FIG. 15(A), and are also cross-sectional views of the transistor 200 in the channel length direction. FIG. 5(C) to FIG. 15(C) are cross-sectional views corresponding to a portion indicated by a dashed-dotted line A3-A4 in FIG. 5(A) to FIG. 15(A), and are also cross-sectional views in the channel width direction of the transistor 200. Note that for clarification of the drawing, some components are not illustrated in the top views of FIG. 5(A) to FIG. 15(A).

First, a substrate (not illustrated) is prepared, and the insulating layer 214 is deposited over the substrate. The insulating layer 214 can be deposited by a sputtering method, a CVD method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on the source gas to be used.

With a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In this case, accumulated electric charge might break the wiring, the electrode, the element, or the like included in the semiconductor device. In contrast, such plasma damage does not occur in the case of a thermal CVD method that does not use plasma, and thus the yield of the semiconductor device can be increased. In addition, the thermal CVD method does not cause plasma damage during deposition, and thus a film with few defects can be obtained.

In addition, in an ALD method, one atomic layer can be deposited at a time using self-regulating characteristics of atoms. Thus, the ALD method can achieve deposition of an extremely thin film, deposition on a structure with a high aspect ratio, deposition of a film with a small number of defects such as pinholes, deposition with good coverage, and low-temperature deposition. Furthermore, the ALD method includes a plasma enhanced ALD (PEALD) method that is a deposition method using plasma. The use of plasma enables deposition at a lower temperature. Note that a precursor used in the ALD method includes impurities such as carbon; thus, the film formed by an ALD method might contain more impurities such as carbon as compared to a film formed by another deposition method. The analysis of the impurities can be analyzed by XPS analysis.

Unlike a deposition method in which particles ejected from a target or the like are deposited, a CVD method and an ALD method are deposition methods in which a film is formed by reaction at a surface of an object. Thus, a CVD method and an ALD method are deposition methods that enables favorable step coverage and is not easily influenced by the shape of an object. In particular, an ALD method enables excellent step coverage and excellent thickness uniformity and is suitable in cases such as covering a surface of an opening with a high aspect ratio. On the other hand, an ALD method has a relatively low deposition rate, and thus can be used in combination with another deposition method with a high deposition rate, such as a CVD method.

When a CVD method or an ALD method is used, the composition of a film to be obtained can be controlled with the flow rate ratio of source gases. For example, a film with a certain composition can be deposited by adjusting the flow rate ratio of source gases. Moreover, by changing the flow rate ratio of source gases while depositing the film, a film whose composition is continuously changed can be formed. In the case of depositing a film while changing the flow rate ratio of source gases, compared with the case of depositing a film with use of a plurality of deposition chambers, time taken for the deposition can be shortened because time taken for transfer and pressure adjustment is not required, and hence productivity can be increased.

In this embodiment, for the insulating layer 214, aluminum oxide is deposited by a sputtering method. In addition, the insulating layer 214 may have a multilayer structure. For example, a structure may be employed in which aluminum oxide is deposited by a sputtering method and aluminum oxide is deposited over the aluminum oxide by an ALD method. Alternatively, a structure may be employed in which aluminum oxide is deposited by an ALD method and aluminum oxide is deposited over the aluminum oxide by a sputtering method.

Next, a conductive film to be the conductive layer 205 is deposited over the insulating layer 214. The conductive film to be the conductive layer 205 can be deposited by a sputtering method, a CVD method, an MBE method, a PLD method, an ALD method, or the like. In addition, the conductive film to be the conductive layer 205 can be a multilayer film. In this embodiment, tungsten is deposited for the conductive film to be the conductive layer 205.

Next, the conductive film to be the conductive layer 205 is processed by a lithography method, so that the conductive layer 205 is formed.

Note that in a lithography method, for example, KrF excimer laser light, ArF excimer laser light, EUV (Extreme Ultraviolet) light, or the like can be used for light exposure of a resist mask. A liquid immersion technique may be employed in which a gap between a substrate and a projection lens is filled with liquid (e.g., water) in light exposure. An electron beam or an ion beam may be used instead of the above-mentioned light. Note that a mask is unnecessary in the case of using an electron beam or an ion beam. Note that removal of the resist mask can be performed with a dry etching treatment such as ashing, a wet etching treatment, or a combination of both.

In addition, a hard mask formed of an insulating film or a conductive film may be used instead of the resist mask. In the case where a hard mask is used, a hard mask with a desired shape can be formed by forming an insulating film or a conductive film to be a hard mask material over the conductive film to be the conductive layer 205, forming a resist mask thereover, and then etching the hard mask material. The etching of the conductive film to be the conductive layer 205 may be performed after removal of the resist mask or with the resist mask remaining. In the latter case, the resist mask sometimes disappears during the etching. The hard mask may be removed by etching after the etching of the conductive film to be the conductive layer 205. Meanwhile, the hard mask is not necessarily removed when the hard mask material does not affect a post-process or can be utilized in the post-process.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

Next, an insulating film to be the insulating layer 216 is deposited over the insulating layer 214 and the conductive layer 205. The insulating film is formed to be in contact with the top surface and the side surface of the conductive layer 205. The insulating film to be the insulating layer 216 can be deposited by a sputtering method, a CVD method, an MBE method, a PLD method, an ALD method, or the like. In this embodiment, for the insulating film to be the insulating layer 216, silicon oxide is deposited by a CVD method.

Here, the thickness of the insulating film to be the insulating layer 216 is preferably greater than or equal to the thickness of the conductive layer 205. For example, when the thickness of the conductive layer 205 is 1, the thickness of the insulating film to be the insulating layer 216 is greater than or equal to 1 and less than or equal to 3.

Next, CMP (Chemical Mechanical Polishing) treatment is performed on the insulating film to be the insulating layer 216, so that part of the insulating film to be the insulating layer 216 is removed and a surface of the conductive layer 205 is exposed. Thus, the conductive layer 205 and the insulating layer 216 in contact with the side surface of the conductive layer 205 that have flat top surfaces can be formed (see FIG. 5). The improvement in planarity of the top surfaces of the insulating layer 216 and the conductive layer 205 results in improved crystallinity of the CAAC-OS that forms the semiconductor layer 230a, the semiconductor layer 230b, and the semiconductor layer 230c.

Note that the method for manufacturing the insulating layer 216 and the conductive layer 205 is not limited to the above. For example, the insulating film to be the insulating layer 216 may be deposited over the insulating layer 214, an opening may be provided in the insulating film, and the conductive layer 205 may be formed to be embedded in the opening.

Next, the insulating layer 222 is deposited over the insulating layer 216 and the conductive layer 205. The insulating layer 222 can be deposited by a sputtering method, a CVD method, an MBE method, a PLD method, an ALD method, or the like.

Next, the insulating layer 224 is formed over the insulating layer 222. The insulating layer 224 can be formed by a sputtering method, a CVD method, an MBE method, a PLD method, an ALD method, or the like.

Next, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen or inert gas atmosphere, or an atmosphere containing an oxidizing gas at 10 ppm or more, 1% or higher, or 10% or higher. In addition, the heat treatment may be performed under reduced pressure. Alternatively, the heat treatment may be performed by performing heat treatment in a nitrogen or inert gas atmosphere and then performing heat treatment in an atmosphere containing an oxidizing gas at 10 ppm or higher, 1% or higher, or 10% or higher to compensate for released oxygen.

In this embodiment, as the heat treatment, treatment is performed at 400° C. in a nitrogen atmosphere for 1 hour after deposition of the insulating layer 224. By the heat treatment, impurities such as water and hydrogen contained in the insulating layer 224 can be removed, for example. The heat treatment can also be performed after deposition of the insulating layer 222, for example.

Here, in order to form an excess-oxygen region in the insulating layer 224, plasma treatment containing oxygen may be performed under reduced pressure. For the plasma treatment containing oxygen, an apparatus including a power source for generating high-density plasma using microwaves is preferably used, for example. Alternatively, a power source for applying an RF (Radio Frequency) to a substrate side may be included. The use of high-density plasma enables high-density oxygen radicals to be generated, and RF application to the substrate side allows the oxygen radicals generated by the high-density plasma to be efficiently introduced into the insulating layer 224. Alternatively, after plasma treatment containing an inert gas is performed with this apparatus, plasma treatment containing oxygen may be performed to compensate for released oxygen. Note that impurities such as water and hydrogen contained in the insulating layer 224 can be removed by selecting the conditions for the plasma treatment as appropriate. In this case, heat treatment does not need to be performed.

Next, a metal oxide film 230A to be the semiconductor layer 230a and a metal oxide film 230B to be the semiconductor layer 230b are deposited sequentially over the insulating layer 224 (see FIG. 5). Note that the metal oxide films are preferably deposited successively without being exposed to an atmospheric environment. By the deposition without exposure to the air, impurities or moisture from the atmospheric environment can be prevented from attaching onto the metal oxide film 230A and the metal oxide film 230B, so that the vicinity of an interface between the metal oxide film 230A and the metal oxide film 230B can be kept clean.

The metal oxide film 230A and the metal oxide film 230B can be deposited by a sputtering method, a CVD method, an MBE method, a PLD method, an ALD method, or the like.

In the case where the metal oxide film 230A and the metal oxide film 230B are deposited by a sputtering method, for example, oxygen or a mixed gas of oxygen and a rare gas is used as a sputtering gas. Increasing the proportion of oxygen contained in the sputtering gas can increase the amount of excess oxygen in the deposited metal oxide films. In the case where the above metal oxide films are deposited by a sputtering method, the above In-M-Zn oxide target or the like can be used. Furthermore, a direct current (DC) power source or an alternating current (AC) power source such as a radio frequency (RF) power source is connected to a target, and required power can be applied in accordance with the electric conductivity of the target.

In particular, part of oxygen contained in the sputtering gas is supplied to the insulating layer 224 during the deposition of the metal oxide film 230A in some cases. Therefore, the proportion of oxygen contained in the sputtering gas for the metal oxide film 230A is higher than or equal to 70%, preferably higher than or equal to 80%, further preferably 100%.

In addition, in the case where the metal oxide film 230B is formed by a sputtering method, when the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. In a transistor in which an oxygen-deficient oxide semiconductor is used for its channel formation region, relatively high field-effect mobility can be obtained. Furthermore, when deposition is performed while the substrate is heated, the crystallinity of the metal oxide film can be improved. Note that one embodiment of the present invention is not limited thereto. In the case where the metal oxide film 230B to be the semiconductor layer 230b is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained.

In this embodiment, the metal oxide film 230A is deposited by a sputtering method using a target with In:Ga:Zn=2:2:1 [atomic ratio] or a target with In:Ga:Zn=1:3:4 [atomic ratio]. In addition, the metal oxide film 230B is deposited by a sputtering method using a target with In:Ga:Zn=4:2:4.1 [atomic ratio]. Note that each of the metal oxide films is formed to have characteristics required for the semiconductor layer 230 by selecting the deposition condition and the atomic ratio as appropriate.

Note that the insulating layer 222, the insulating layer 224, the metal oxide film 230A, and the metal oxide film 230B are preferably deposited without exposure to the air. For example, a multi-chamber deposition apparatus may be used.

Next, heat treatment may be performed. For the heat treatment, the conditions for the above heat treatment can be used. Through the heat treatment, impurities such as water and hydrogen in the metal oxide film 230A and the metal oxide film 230B can be removed, for example. In this embodiment, after treatment is performed at 400° C. in a nitrogen atmosphere for 1 hour, treatment is successively performed at 400° C. in an oxygen atmosphere for 1 hour.

Next, the metal oxide film 230A and the metal oxide film 230B are processed into island shapes to form the semiconductor layer 230a and the semiconductor layer 230b. Note that in this step, the thickness of the insulating layer 224 in a region that does not overlap with the semiconductor layer 230a is reduced in some cases (see FIG. 6).

Here, the semiconductor layer 230a and the semiconductor layer 230b are formed to at least partly overlap with the conductive layer 205. The side surfaces of the semiconductor layer 230a and the semiconductor layer 230b may be tapered. In that case, the angle formed by the side surfaces of the semiconductor layer 230a and the semiconductor layer 230b and a top surface of the insulating layer 222 is preferably greater than or equal to 60° and less than 70°. With such a shape, coverage of the insulating layer 226 and the like can be improved in a later step, so that defects such as voids can be reduced. Alternatively, the side surface of the semiconductor layer 230b may be substantially perpendicular to the top surface of the insulating layer 222. When the side surfaces of the semiconductor layer 230a and the semiconductor layer 230b are substantially perpendicular to the top surface of the insulating layer 222, area reduction and increasing density are possible when providing a plurality of transistors 200.

A curved surface is included between the side surface of the semiconductor layer 230b and the top surface of the semiconductor layer 230b. That is, an end portion of the side surface and an end portion of the top surface are preferably curved (also referred to as a rounded shape). The radius of curvature of the curved surface at an end portion of the semiconductor layer 230b is greater than or equal to 3 nm and less than or equal to 10 nm, preferably greater than or equal to 5 nm and less than or equal to 6 nm, for example. When the end portions are not angular, coverage of films in a later deposition process can be improved.

Note that the metal oxide film 230A and the metal oxide film 230B can be processed by a lithography method. In addition, a dry etching method or a wet etching method can be used for the processing. A dry etching method is suitable for microfabrication.

In addition, in some cases, treatment such as dry etching causes attachment or diffusion of impurities due to an etching gas or the like to a surface or an inside of the semiconductor layer 230a, the semiconductor layer 230b, or the like. Examples of the impurities include fluorine or chlorine. In order to remove the impurities or the like, cleaning is preferably performed. Examples of a cleaning method include wet cleaning using a cleaning solution or the like, plasma treatment using plasma, and cleaning by heat treatment, and these cleanings may be performed in appropriate combination. As the wet cleaning, cleaning treatment may be performed using an aqueous solution obtained by diluting an oxalic acid, a phosphoric acid, a hydrofluoric acid, or the like with carbonated water or pure water. Alternatively, ultrasonic cleaning using pure water or carbonated water may be performed. In this embodiment, the ultrasonic cleaning using pure water or carbonated water is performed.

Then, heat treatment may be performed. For the conditions of the heat treatment, the conditions of the above heat treatment can be used.

Figure 7A:
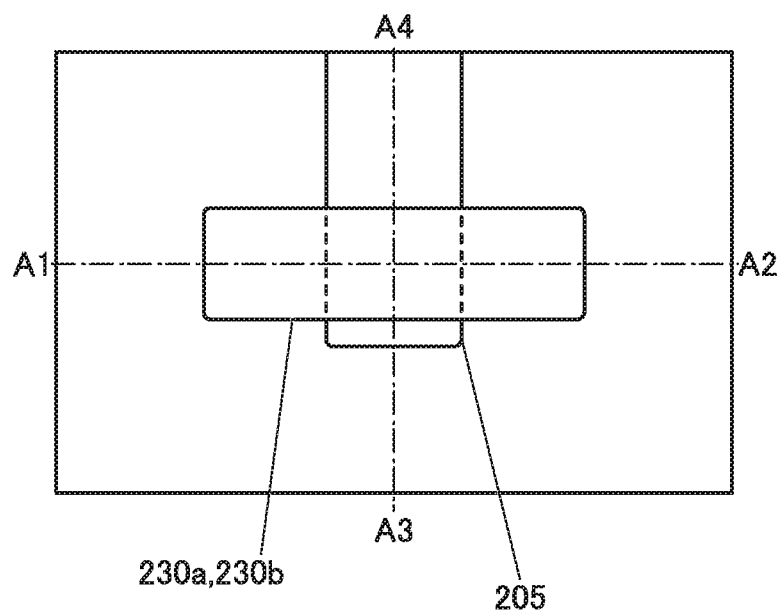
FIGS. 7A-7C Diagrams illustrating an example of a method for manufacturing a semiconductor device.
Figure 7C:
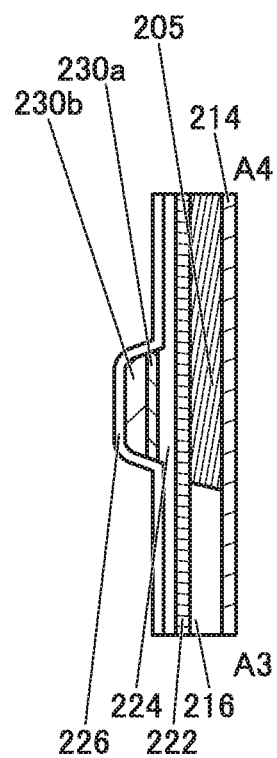
Figure 7B:
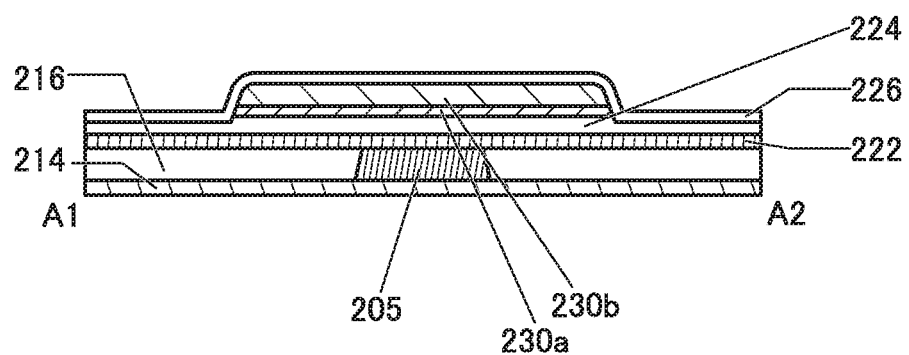

Next, the insulating layer 226 is formed to cover the semiconductor layer 230a, the semiconductor layer 230b, and the insulating layer 224 (see FIG. 7). The insulating layer 226 can be deposited by a sputtering method, a CVD method, an MBE method, a PLD method, an ALD method, or the like. The insulating layer 226 can be formed by a method similar to that of the insulating layer 224.

The thickness of the insulating layer 226 can be set as appropriate in accordance with the conditions of the element injection treatment performed later. For example, when a silicon oxide film or a silicon oxynitride film is used as the insulating layer 224, the thickness of the insulating layer 226 can be greater than or equal to 3 nm and less than or equal to 20 nm.

Next, a dummy gate film to be a dummy gate layer 262A is deposited over the insulating layer 224, the semiconductor layer 230a, and the semiconductor layer 230b.

The dummy gate film to be the dummy gate layer 262A is processed to be used as a dummy gate. The dummy gate is an interim gate electrode. That is, the dummy gate film to be the dummy gate layer 262A is processed to form an interim gate electrode, the dummy gate is removed in a later step, and a gate electrode is formed using a conductive film or the like instead. Thus, a film that is easily processed minutely and easily removed is preferably used as the dummy gate film to be the dummy gate layer 262A.

The dummy gate film to be the dummy gate layer 262A can be deposited by a sputtering method, a CVD method, an MBE method, a PLD method, an ALD method, or the like. An insulating material, a semiconductor material, or a conductive material can be used, for example. Specifically, silicon such as polysilicon, microcrystalline silicon, or amorphous silicon, or a metal film of aluminum, titanium, tungsten, or the like is used, for example. Alternatively, a film containing carbon, SOG (Spin On Glass), a resin film, or the like may be formed using a coating method. For example, a photoresist, polyester, polyolefin, polyamide (nylon, aramid, or the like), polyimide, polycarbonate, acrylic, or the like can be given. When SOG or the resin film is formed by a coating method, a surface of the dummy gate film can be made flat. Accordingly, when the surface of the dummy gate film is made flat, the dummy gate film can be easily processed minutely and easily removed.

In addition, the dummy gate film to be the dummy gate layer 262A can be a multilayer film using different kinds of films. For example, the dummy gate film to be the dummy gate layer 262A can be a two-layer structure of a conductive film and a resin film over the conductive film. When the dummy gate film has such a structure, the conductive film functions as a stopper film for CMP treatment in a later CMP process in some cases, for example. Alternatively, the end point of the CMP treatment can be detected in some cases, and processing variations can be reduced in some cases.

Figure 8A:
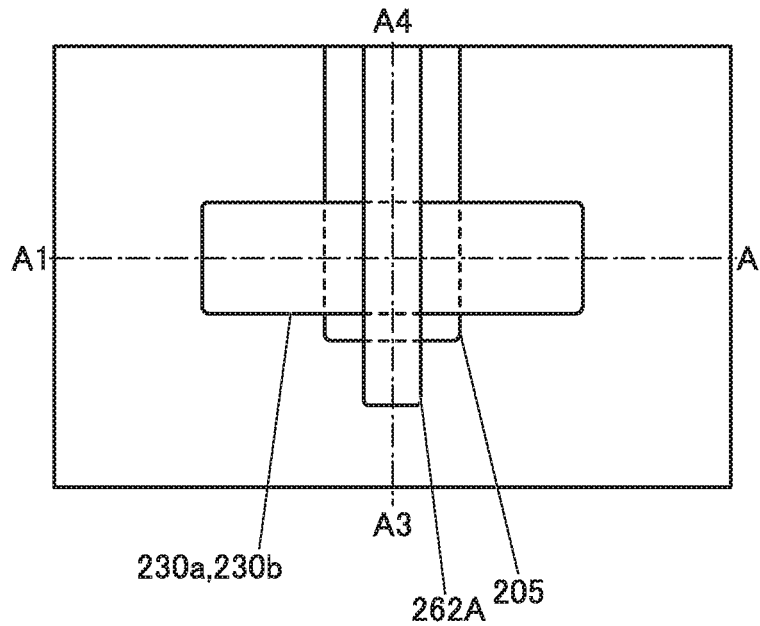
FIGS. 8A-8C Diagrams illustrating an example of a method for manufacturing a semiconductor device.
Figure 8C:
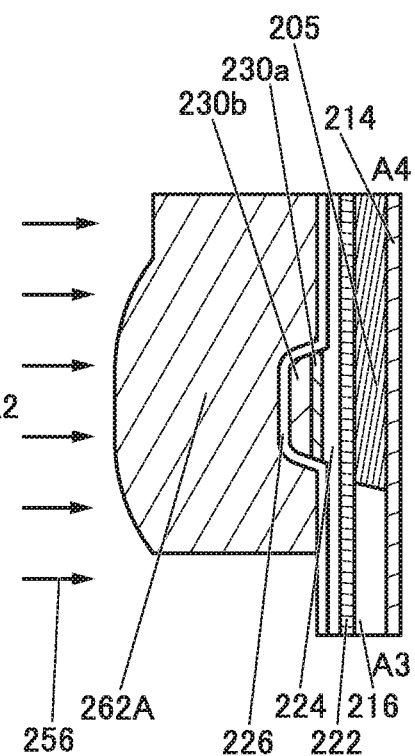
Figure 8B:
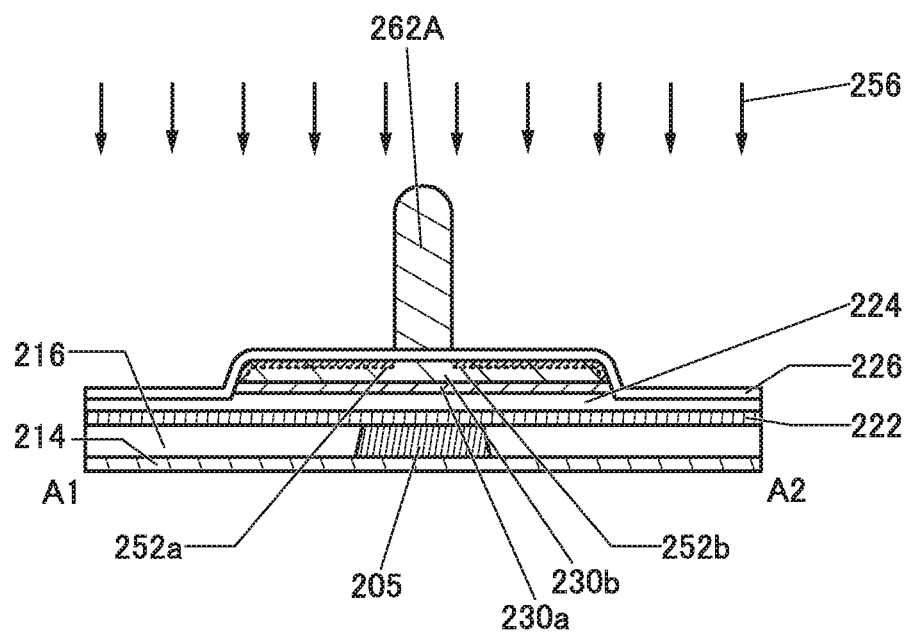

Then, the dummy gate film to be the dummy gate layer 262A is etched by a lithography method, so that the dummy gate layer 262A is formed (see FIG. 8). The dummy gate layer 262A is formed to at least partly overlap with the conductive layer 205 and the semiconductor layer 230.

Next, a first injection treatment is performed (see FIG. 8). The first injection treatment is a treatment in which a dopant 256 is injected (added) to the semiconductor layer 230b using the dummy gate layer 262A as a mask. Accordingly, the region 252a and the region 252b which include the dopant 256 are formed in a region of the semiconductor layer 230b that does not overlap with the dummy gate layer 262A. Hence, the distance between the region 252a and the region 252b, that is, the channel length, can be controlled by the length of the dummy gate layer 262A in the channel length direction.

As a method for adding the dopant 256, an ion implantation method in which an ionized source gas is subjected to mass separation and then added, an ion doping method in which an ionized source gas is added without mass separation, a plasma immersion ion implantation method, or the like can be used. In the case of performing mass separation, an ion species to be added and its concentration can be adjusted precisely. On the other hand, in the case of not performing mass separation, a high concentration of ions can be added in a short time. Furthermore, an ion doping method in which atomic or molecular clusters are generated and ionized may be used. Note that a dopant may be referred to as an ion, donor, acceptor, impurity, element, or the like.

As the dopant 256, an element that forms the above-mentioned oxygen vacancy, an element that is bonded to the oxygen vacancy, or the like is used. Typical examples of the element include boron and phosphorus. Hydrogen, carbon, nitrogen, fluorine, sulfur, chlorine, titanium, a rare gas element, or the like can also be used. Typical examples of a rare gas include helium, neon, argon, krypton, and xenon. Furthermore, any one or more metal elements selected from metal elements such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added. Among the above, boron and phosphorus are preferable as the dopant 256. In the case where boron or phosphorus is used as the dopant 256, manufacturing line apparatuses for amorphous silicon or low-temperature polysilicon can be used; thus, capital investment can be reduced.

In particular, for the dopant 256, an element that easily forms an oxide is preferably used. Typical examples of the element include boron, phosphorus, aluminum, and magnesium.

A gas containing the above impurity element can be used as a source gas used when injecting the dopant 256. In the case where boron is supplied, typically, a $B_2H_6$ gas, a $BF_3$ gas, or the like can be used. In addition, in the case where phosphorus is supplied, typically, a $PH_3$ gas can be used. A mixed gas in which any of these source gases is diluted with a rare gas may be used.

Other gases that can be used as the source gas include $CH_4$, $N_2$, $NH_3$, $AlH_3$, $AlCl_3$, $SiH_4$, $Si_2H_6$, $F_2$, HF, $H_2$, a rare gas, and the like. The ion source is not limited to a gas and an evaporated liquid or an evaporated solid may be used as the ion source.

Addition of the dopant 256 can be controlled by setting the conditions such as the acceleration voltage and the dosage in consideration of the compositions, densities, thicknesses, and the like of the insulating layer 226 and the semiconductor layer 230.

Note that a method for supplying the dopant 256 is not limited thereto; for example, plasma treatment, treatment using thermal diffusion by heating, or the like may be used. In a plasma treatment method, plasma is generated in a gas atmosphere containing an impurity element to be added and plasma treatment is performed, so that the impurity element can be added. A dry etching apparatus, an ashing apparatus, a plasma CVD apparatus, a high-density plasma CVD apparatus, or the like can be used as an apparatus for generating the plasma.

Although the dopant 256 is added substantially perpendicularly to a top surface of the insulating layer 214 in FIG. 8, one embodiment of the present invention is not limited thereto, and the dopant 256 may be added obliquely to the top surface of the insulating layer 214. By the addition of the dopant at the top surface of the insulating layer 214, the region 252a and the region 252b can be formed in part of a region which overlaps with the dummy gate layer 262A.

Figure 9A:
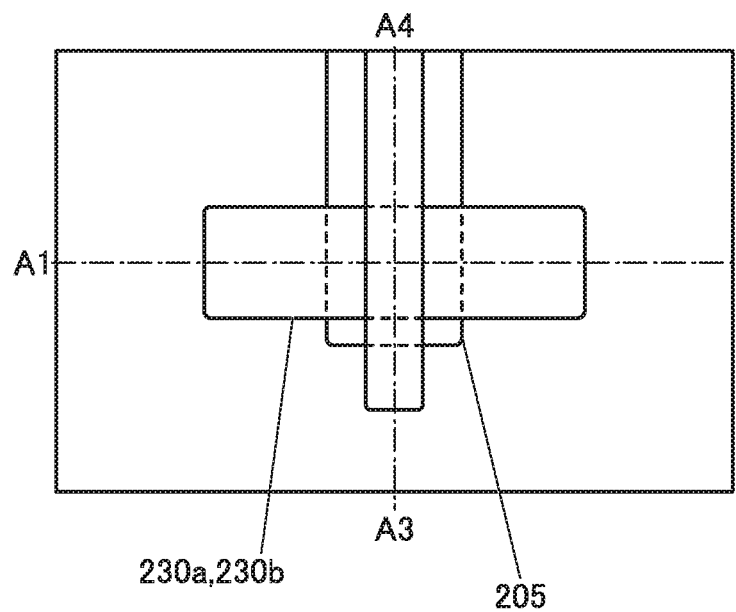
FIGS. 9A-9C Diagrams illustrating an example of a method for manufacturing a semiconductor device.
Figure 9C:
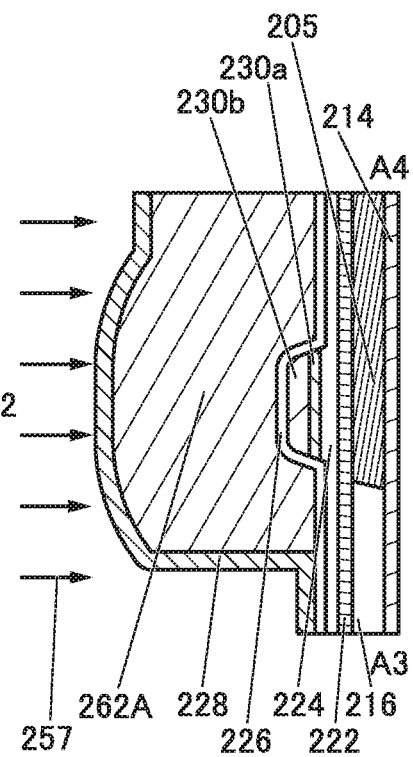
Figure 9B:
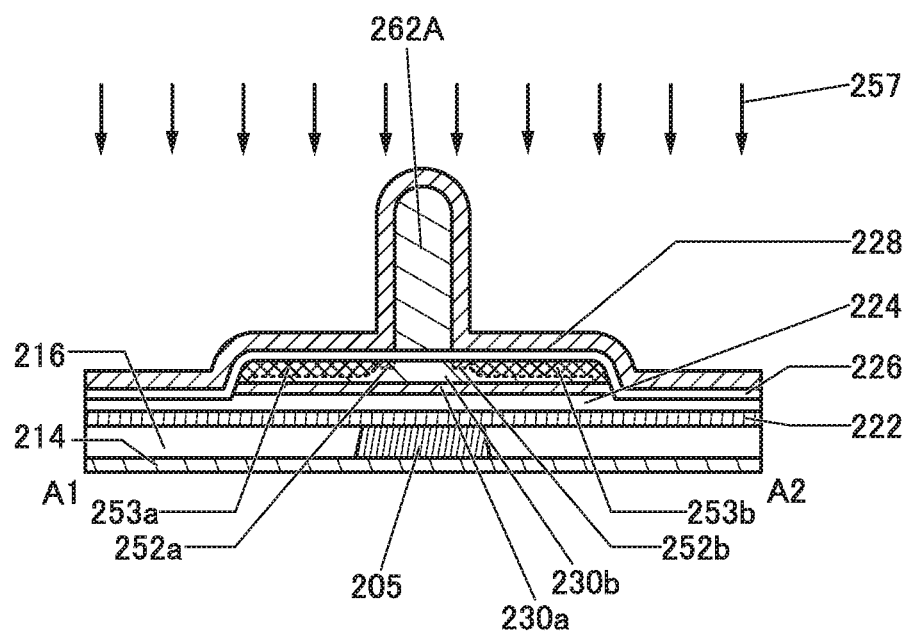

Next, the insulating layer 228 is formed to cover the insulating layer 226 and the dummy gate layer 262A (FIG. 9). The insulating layer 228 can be deposited by a sputtering method, a CVD method, an MBE method, a PLD method, an ALD method, or the like. The insulating layer 228 can be formed by a method similar to that of the insulating layer 222.

As the insulating layer 228, an insulating film having a function of inhibiting diffusion of oxygen and impurities such as hydrogen is preferably used. For example, an aluminum oxide film is preferably deposited by a sputtering method. When an aluminum oxide film is deposited by a sputtering method using a gas containing oxygen, oxygen can be injected into the insulating layer 226. That is, the insulating layer 226 can contain excess oxygen.

Alternatively, aluminum oxide may be deposited as the insulating layer 228 while the substrate is heated at a high temperature. The substrate heating temperature during the deposition of the insulating layer 228 is higher than or equal to 200° C., preferably higher than or equal to 250° C., further preferably higher than or equal to 350° C. In this case, aluminum oxide is deposited by an ALD method before depositing the insulating layer 228, whereby the dummy gate layer 262A can be prevented from being deformed when the insulating layer 228 is deposited at the above temperature.

Next, a second injection treatment is performed (see FIG. 9). The second injection treatment is a treatment in which a dopant 257 is injected (added) to the semiconductor layer 230b using the dummy gate layer 262A and a portion of the insulating layer 228 that is in contact with the side surfaces of the dummy gate layer 262A as masks. Accordingly, the region 253a and the region 253b containing the dopant 257 are formed in a region of the semiconductor layer 230b that does not overlap with the mask. Hence, the length in the channel length direction of a portion in the region 252 where the region 253 is not formed (corresponding to the region 232a and the region 232b illustrated in FIG. 2) can be controlled by the thickness of the insulating layer 228 covering a side surface of the dummy gate layer 262A.

The dopant 257 can be added by a method similar to the aforementioned method for adding the dopant 256. In this case, enough energy is preferably supplied to the dopant 257 so that the dopant 257 can penetrate a portion of the insulating layer 228 that is not in contact with the dummy gate layer 262A and the insulating layer 226. In addition, the same element used as the dopant 256 can be used as the dopant 257.

The dopant 257 is preferably injected at a higher concentration than the dopant 256. Accordingly, the region 252b to which the element is injected at a higher concentration than the region 252a can be formed. In addition, the dopant 257 is preferably injected at an acceleration voltage higher than the dopant 256. Accordingly, the region 252b in which elements are distributed deeper than those in the region 252a can be formed.

Although the dopant 257 is added substantially perpendicularly to a top surface of the insulating layer 214 in FIG. 9, the present invention is not limited to this, and the dopant 257 may be added obliquely to the top surface of the insulating layer 214. By adding the dopant obliquely to the top surface of the insulating layer 214, the region 253a and the region 253b can be formed in part of a region that overlaps with a portion of the insulating layer 228 that is in contact with the dummy gate layer 262A.

In this embodiment, the dopant 257 is added to the semiconductor layer 230 through the insulating layer 228 and the insulating layer 226. At this time, the dopant 257 is also added to the insulating layer 228 and the insulating layer 226. That is, the semiconductor layer 230, the insulating layer 228, and the insulating layer 226 include an element contained in the dopant 257. In the case where the insulating layer 226 contains excess oxygen, the dopant 257 can inhibit diffusion of excess oxygen to the outside.

Note that in this embodiment, addition of the dopant 257 is performed after the insulating layer 228 is formed; however, the present invention is not limited thereto. For example, the dopant 257 may be added after an insulating film 244A to be described later is formed. Thus, the region 253a and the region 253b containing the dopant 257 are formed in a region that does not overlap with the dummy gate layer 262A in the semiconductor layer 230b, a portion of the insulating layer 228 extending in a direction perpendicular to the substrate, and a portion of the insulating film 244A extending in a direction perpendicular to the substrate.

The region 252 and the region 253 are formed as described above, whereby the conductive layer 260 that is formed in a later step can be placed between the region 252a and the region 253a and between the region 252b and the region 253b in a self-aligned manner.

Next, the insulating film 244A is deposited over the insulating layer 228 (see FIG. 10). The insulating film 244A can be deposited by a sputtering method, a CVD method, an MBE method, a PLD method, an ALD method, or the like.

As the insulating film 244A, similar to the insulating layer 228, an insulating film having a function of inhibiting the diffusion of oxygen and impurities such as hydrogen is preferably used. For example, an aluminum oxide film is preferably deposited by an ALD method. By using an ALD method which enables excellent coverage, the insulating film 244A having a uniform thickness can be formed even in a step portion formed by the dummy gate layer 262A and the like. Moreover, with the use of an ALD method, a dense thin film can be deposited. Accordingly, a dense thin film having excellent coverage can be deposited, and thus even when defects such as voids or pinholes are generated in the insulating layer 228, for example, they can be covered with the insulating film 244A.

Aluminum nitride, silicon nitride, silicon nitride oxide, or the like may be deposited as the insulating film 244A. For example, in the case where an aluminum nitride film is deposited as the insulating film 244A by reactive sputtering using an aluminum target, the flow rate of a nitrogen gas to the total flow rate of a deposition gas is preferably higher than or equal to 30% and lower than or equal to 100%, further preferably higher than or equal to 40% and lower than or equal to 100%, still further preferably higher than or equal to 50% and lower than or equal to 100%.

Accordingly, it is possible to prevent outward diffusion of excess oxygen contained in the insulating layer 224 and prevent entry of impurities such as water and hydrogen into the insulating layer 224 from the outside. Note that the deposition of the insulating film 244A can be omitted in some cases.

Next, an insulating film to be the insulating layer 280 is deposited over the insulating film 244A. The insulating film to be the insulating layer 280 can be deposited by a sputtering method, a CVD method, an MBE method, a PLD method, an ALD method, or the like.

Figure 11A:
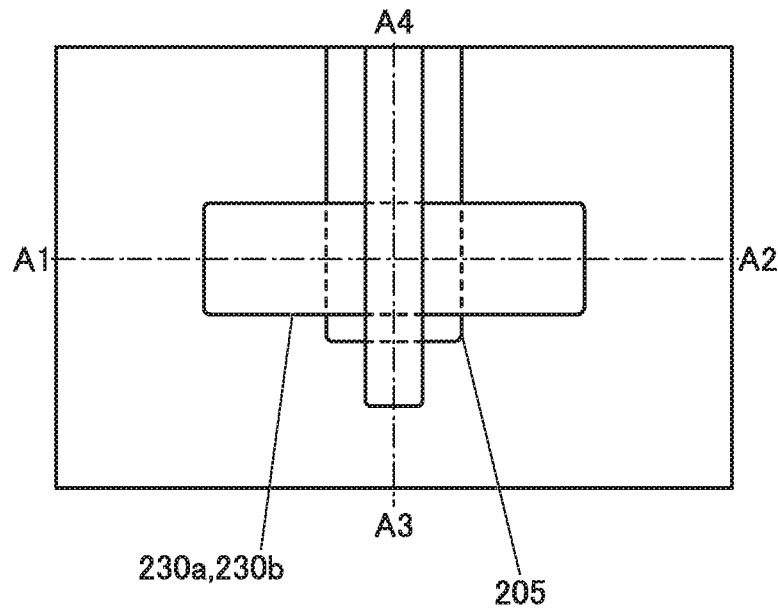
FIGS. 11A-11C Diagrams illustrating an example of a method for manufacturing a semiconductor device.
Figure 11C:
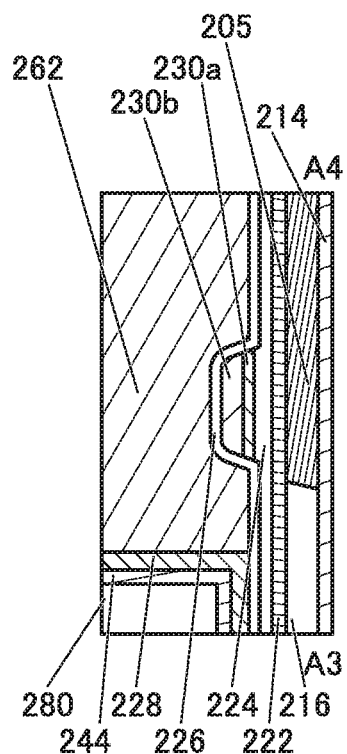

Next, the insulating film to be the insulating layer 280, the dummy gate layer 262A, the insulating layer 228, and the insulating film 244A are partly removed until part of the dummy gate layer 262A is exposed, so that the insulating layer 280, a dummy gate 262, the insulating layer 228, and the insulating layer 244 are formed (see FIG. 11). CMP treatment is preferably employed for forming the insulating layer 280, the dummy gate 262, the insulating layer 228, and the insulating layer 244.

Figure 11B:
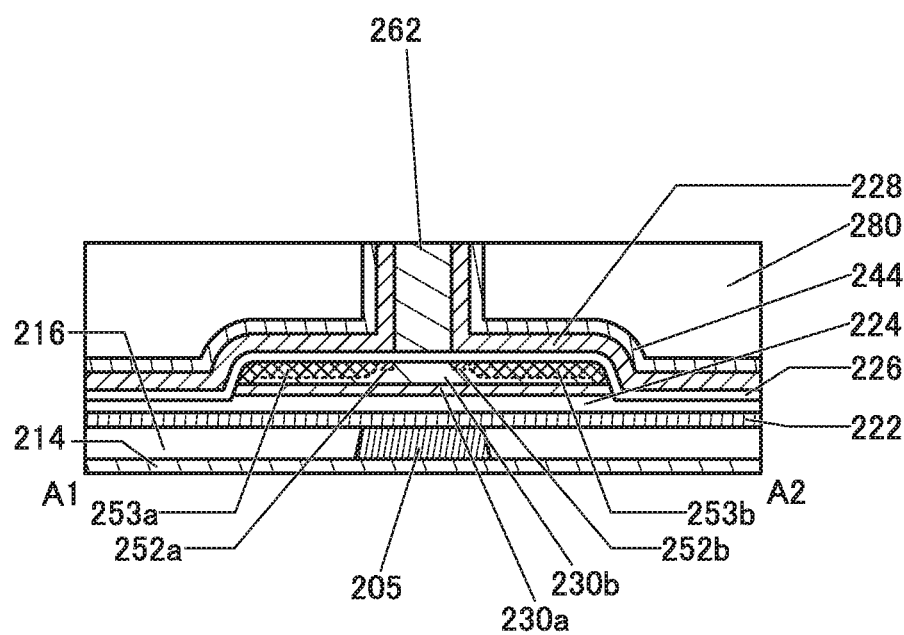

In addition, as described above, when the dummy gate layer 262A has a two-layer structure in which a conductive film and a resin film over the conductive film are formed, for example, in a CMP process, the conductive film functions as a stopper film for CMP treatment in some cases. Alternatively, the end point of the CMP treatment can be detected with the conductive film in some cases, so that variation in the height of the dummy gate 262 can be reduced in some cases. As illustrated in FIG. 11(B), a top surface of the dummy gate 262 is substantially aligned with the top surfaces of the insulating layer 228, the insulating layer 244, and the insulating layer 280.

Figure 12A:
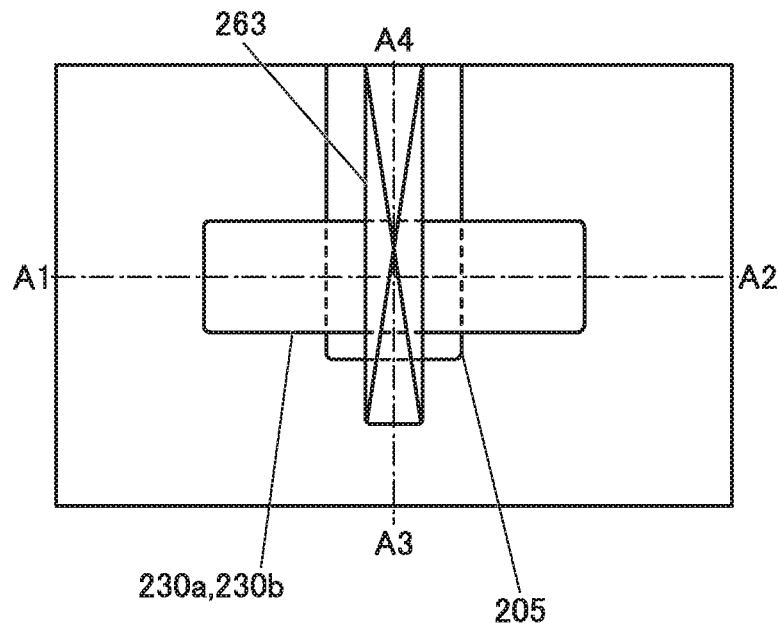
FIGS. 12A-12C Diagrams illustrating an example of a method for manufacturing a semiconductor device.
Figure 12C:
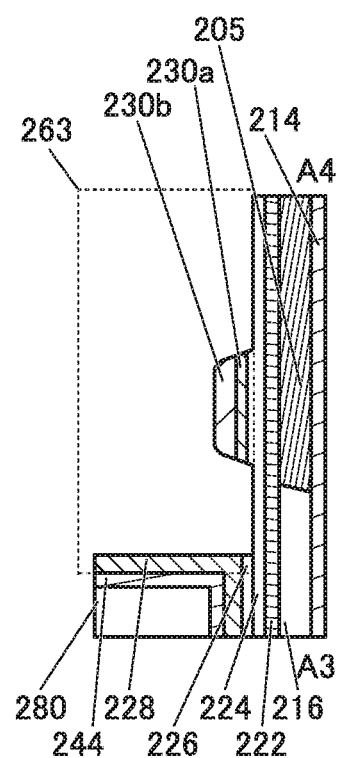
Figure 12B:
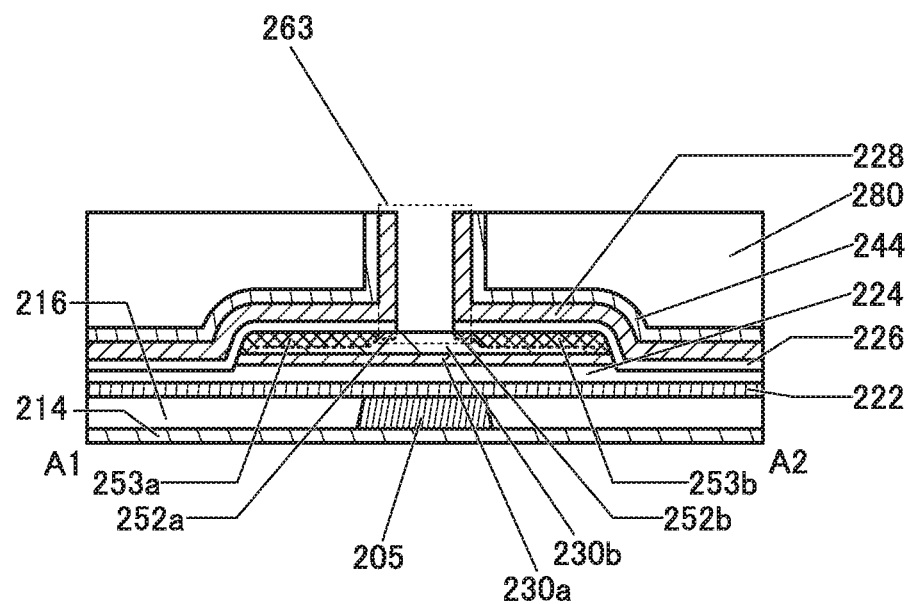

Next, the dummy gate 262 and the insulating layer 226 overlapping with the dummy gate 262 are partly removed to form an opening 263 (see FIG. 12). The dummy gate 262 and the insulating layer 226 can be removed by wet etching, dry etching, ashing, or the like. Alternatively, a plurality of above treatments may be performed in appropriate combination. For example, wet etching treatment may be performed after ashing treatment. The dummy gate 262 and the insulating layer 226 are partly removed, so that part of a surface of the semiconductor layer 230b is exposed in the opening 263.

Figure 13A:
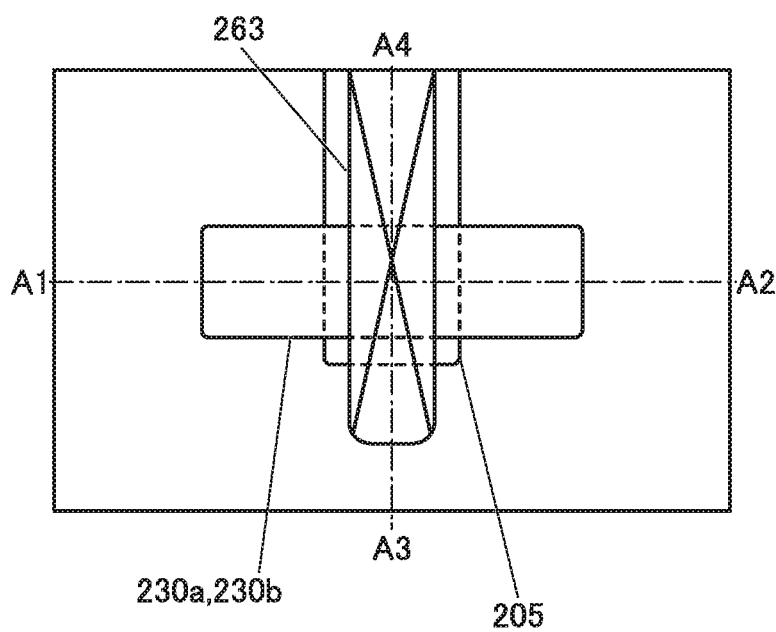
FIGS. 13A-13C Diagrams illustrating an example of a method for manufacturing a semiconductor device.
Figure 13C:
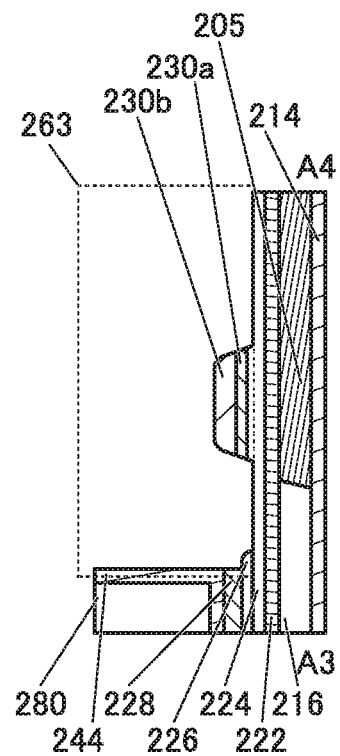
Figure 13B:
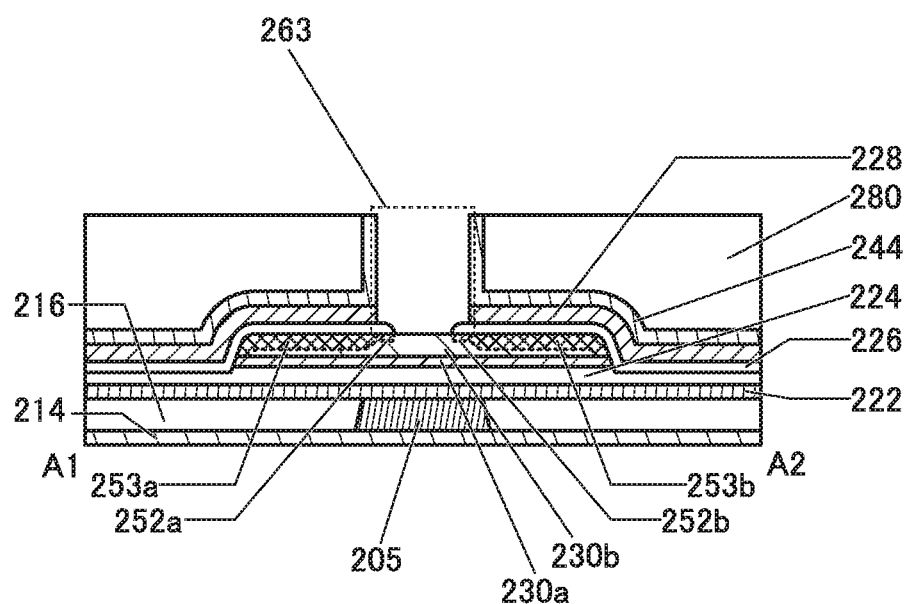
Figure 14A:
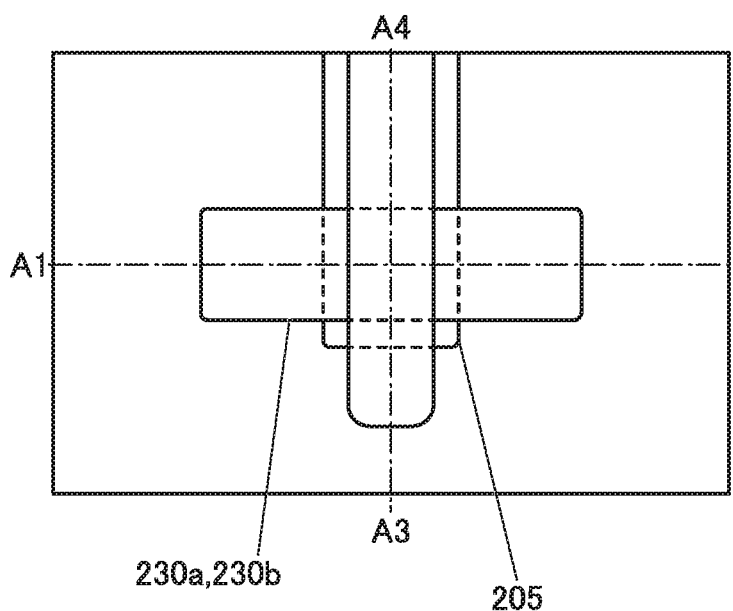
FIGS. 14A-14C Diagrams illustrating an example of a method for manufacturing a semiconductor device.
Figure 14C:
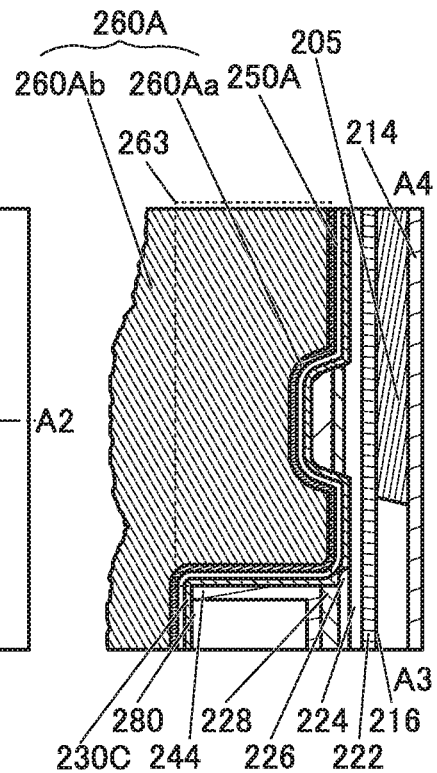
Figure 14B:
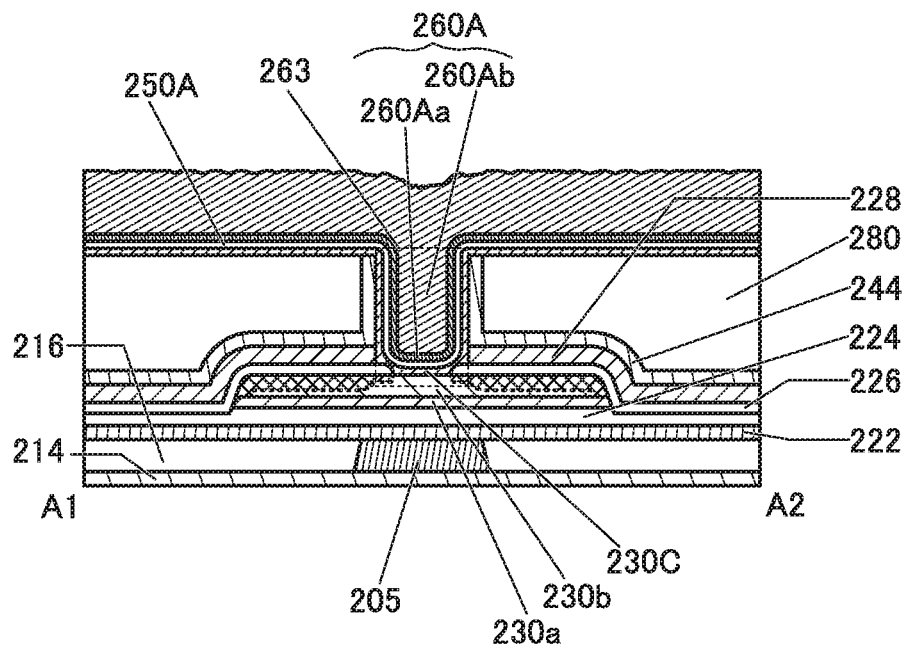
Figure 15A:
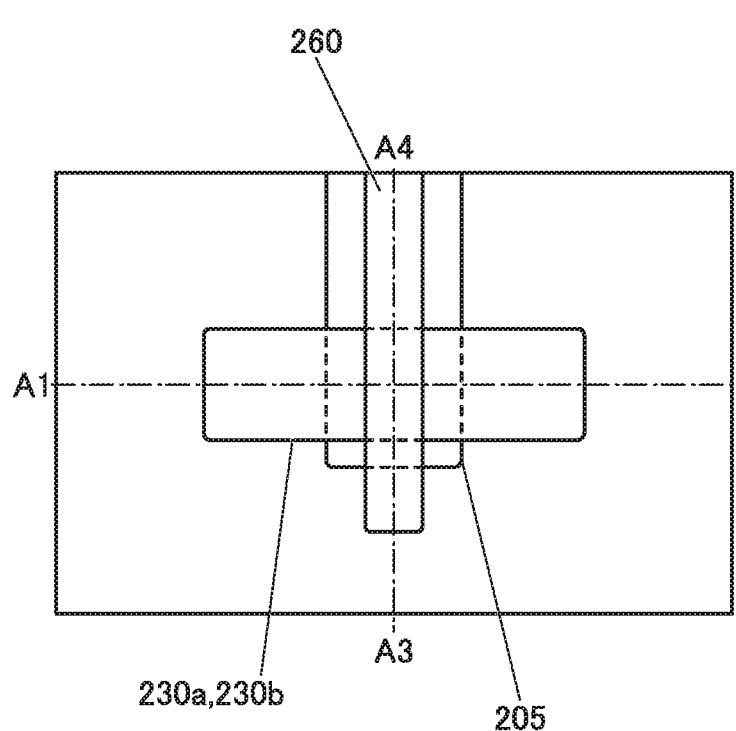
FIGS. 15A-15C Diagrams illustrating an example of a method for manufacturing a semiconductor device.
Figure 15C:
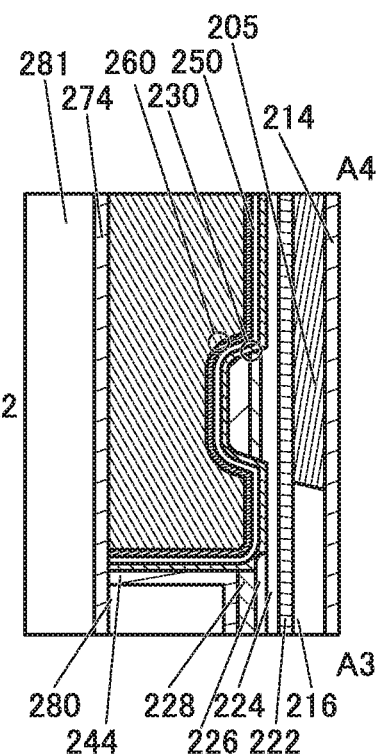
Figure 15B:
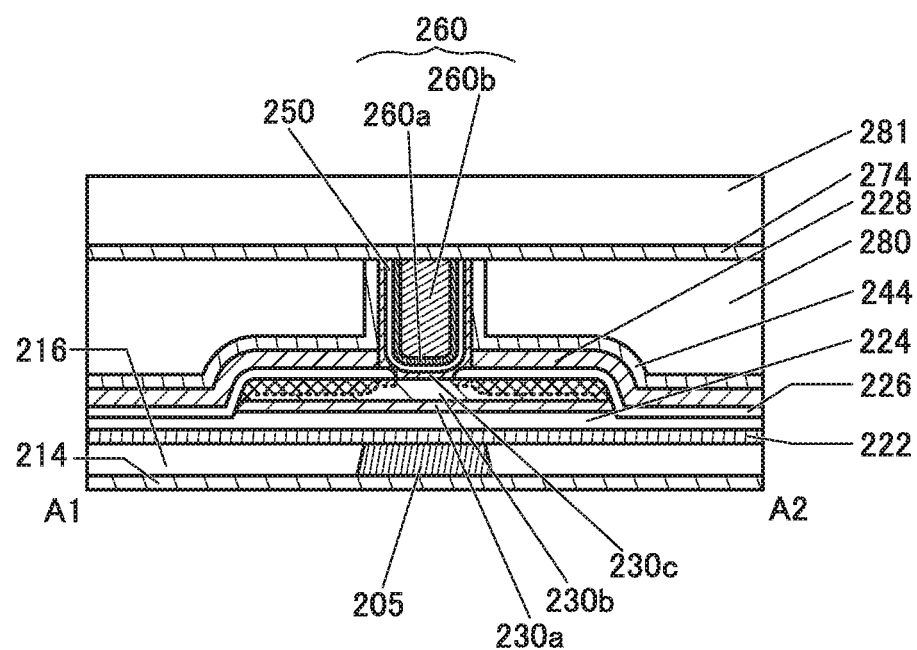

Then, portions of the insulating layer 228 that are in contact with the side surfaces of the dummy gate 262 are etched (see FIG. 13). Accordingly, a side surface of the insulating layer 244 inside the opening 263 is exposed.

Part of the insulating layer 228 can be etched by anisotropic dry etching, isotropic dry etching, wet etching, or using a reactive gas. In addition, it is preferable that etching be performed with a condition in which the insulating layer 280, the insulating layer 244, and the semiconductor layer 230 are not etched.

At the time of etching the insulating layer 228 or after etching the insulating layer 228, a protruding portion of the insulating layer 226 positioned in the opening 263 is slightly etched, whereby a surface of the portion can be processed to become a curved surface.

Next, heat treatment is preferably performed before deposition of a metal oxide film 230C. The heat treatment may be performed at a temperature higher than or equal to 100° C. and lower than or equal to 400° C., and may be performed at 200° C., for example. Alternatively, the heat treatment is preferably performed at the same temperature as the deposition temperature of the metal oxide film 230C. Here, the deposition temperature is not limited to the substrate temperature during deposition, and includes the set temperature of the deposition apparatus. For example, in the case where the metal oxide film 230C is deposited at 300° C., the heat treatment is preferably performed at 300° C. The heat treatment is preferably performed under reduced pressure, and for example, may be performed in a vacuum atmosphere. A vacuum atmosphere is maintained by exhaustion with a turbomolecular pump or the like. Pressure in a vacuum atmosphere of the treatment chamber is lower than or equal to $1\times10^{-2}$ Pa, preferably lower than or equal to $1\times10^{-3}$ Pa.

Next, the metal oxide film 230C is deposited to fill the opening 263. In addition, the metal oxide film 230C is preferably deposited successively without being exposed to the air after the above-mentioned heat treatment. For example, it is preferable that the heat treatment and the deposition treatment be successively performed in different chambers by using a multi-chamber type deposition apparatus described later, or the like. The treatment can remove impurities such as moisture, hydrogen, or carbon adsorbed onto the surfaces or the like of the semiconductor layer 230a and the semiconductor layer 230b, and can reduce the moisture concentration and the hydrogen concentration in the semiconductor layer 230a and the semiconductor layer 230b. An impurity that is removed by the heat treatment includes an impurity having a bond of hydrogen and carbon, an impurity having a bond of hydrogen and oxygen, and the like. Furthermore, it is possible to prevent reentry of impurities such as hydrogen into the semiconductor layer 230 by performing heat treatment and deposition successively without exposure to the air.

The metal oxide film 230C can be deposited by a sputtering method, a CVD method, an MBE method, a PLD method, an ALD method, or the like. A metal oxide film to be the metal oxide film 230C is deposited using a deposition method similar to that of the metal oxide film 230A or the metal oxide film 230B, in accordance with characteristics required for the metal oxide film 230C. An In—Ga—Zn oxide or an oxide that does not contain In can be used for the metal oxide film 230C. As the oxide that does not contain In, a Ga—Zn oxide, gallium oxide, or the like can be used. In addition, as the metal oxide film 230C, a stacked-layer structure of an In—Ga—Zn oxide and an oxide that does not contain In may be used. The metal oxide film 230C is deposited by a sputtering method using a target with In:Ga:Zn=1:3:4 [atomic ratio], In:Ga:Zn=4:2:4.1 [atomic ratio], Ga:Zn=2:1 [atomic ratio], or Ga:Zn=2:5 [atomic ratio]. In this embodiment, as the metal oxide film 230C, a metal oxide film to be the semiconductor layer 230c is deposited by a sputtering method using a target with In:Ga:Zn=1:3:4 [atomic ratio].

The metal oxide film 230C may have a stacked-layer structure of a first metal oxide film and a second metal oxide film over the first metal oxide film, and the first metal oxide film may be formed using a target similar to that used for forming the metal oxide film 230B, and the second metal oxide film may be formed using a target similar to that used for forming the metal oxide film 230A.

The metal oxide film 230C is preferably deposited while the substrate is heated. In this case, the substrate temperature is set to higher than or equal to 300° C., so that oxygen vacancies in the semiconductor layer 230a, the semiconductor layer 230b, and the metal oxide film 230C can be reduced. In addition, for example, the metal oxide film 230C may be deposited at the same temperature as the deposition temperature of an insulating film 250A to be described later. Furthermore, when the metal oxide film 230C is deposited while the substrate is heated in this manner, the crystallinity of the semiconductor layer 230a, the semiconductor layer 230b, and the metal oxide film 230C can be improved.

In particular, during the deposition of the metal oxide film 230C, part of oxygen contained in the sputtering gas is supplied to the semiconductor layer 230a and the semiconductor layer 230b in some cases. Therefore, the proportion of oxygen contained in the sputtering gas for the metal oxide film 230C is higher than or equal to 70%, preferably higher than or equal to 80%, further preferably 100%. Furthermore, when deposition is performed while the substrate is heated, the crystallinity of the metal oxide film can be improved.

Next, heat treatment is preferably performed before deposition of the insulating film 250A. The heat treatment may be performed at a temperature higher than or equal to 100° C. and lower than or equal to 400° C., and may be performed at 200° C., for example. Alternatively, the heat treatment is preferably performed at the same temperature as the deposition temperature of the insulating film 250A. Here, the deposition temperature is not limited to the substrate temperature during deposition, and includes the set temperature of the deposition apparatus. For example, in the case where the insulating film 250A is deposited at 350° C., the heat treatment is preferably performed at 350° C. The heat treatment is preferably performed under reduced pressure, and for example, may be performed in a vacuum atmosphere. A vacuum atmosphere is maintained by exhaustion with a turbomolecular pump or the like. Pressure in a vacuum atmosphere of the treatment chamber is lower than or equal to $1\times10^{-2}$ Pa, preferably lower than or equal to $1\times10^{-3}$ Pa.

Next, the insulating film 250A is deposited. The insulating film 250A can be deposited by a sputtering method, a CVD method, an MBE method, a PLD method, an ALD method, or the like. Silicon oxide, hafnium oxide, gallium oxide, or the like is preferably deposited as the insulating film 250A by an ALD method. For example, a stacked-layer film of silicon oxide and gallium oxide over the silicon oxide may be used as the insulating film 250A. Note that the deposition temperature at the time of depositing the insulating film 250A is preferably higher than or equal to 300° C. and lower than 450° C., further preferably higher than or equal to 300° C. and lower than 400° C., particularly preferably approximately 350° C. For example, when the insulating film 250A is deposited at 350° C., an insulating film having a low amount of impurities can be deposited.

Note that oxygen is excited by microwaves to generate high-density oxygen plasma, and the insulating film 250A is exposed to the oxygen plasma, so that oxygen can be introduced into the insulating film 250A.

Furthermore, heat treatment may be performed. For the heat treatment, the conditions for the above heat treatment can be used. The heat treatment can reduce the moisture concentration and hydrogen concentration in the insulating film 250A.

Next, a conductive film 260Aa and a conductive film 260Ab are deposited. The conductive film 260Aa and the conductive film 260Ab can be deposited by a sputtering method, a CVD method, an MBE method, a PLD method, an ALD method, or the like. A CVD method is preferably used, for example. In this embodiment, the conductive film 260Aa is deposited using an ALD method, and the conductive film 260Ab is deposited using a CVD method (see FIG. 14).

Then, the metal oxide film 230C, the insulating film 250A, the conductive film 260Aa, and the conductive film 260Ab are polished by CMP treatment until the insulating layer 280 is exposed, so that the semiconductor layer 230c, the insulating layer 250, and the conductive layer 260 (the conductive layer 260a and the conductive layer 260b) are formed (see FIG. 15).

Next, heat treatment may be performed. For the heat treatment, the conditions for the above heat treatment can be used. The heat treatment can reduce the moisture concentration and hydrogen concentration in the insulating layer 280. Alternatively, heat treatment is preferably performed before deposition of an insulating film to be the insulating layer 274. The heat treatment may be performed at a temperature higher than or equal to 100° C. and lower than or equal to 400° C., and may be performed at 200° C., for example. Alternatively, the heat treatment is preferably performed at the same temperature as the deposition temperature of the insulating film. Here, the deposition temperature is not limited to the substrate temperature during deposition, and includes the set temperature of the deposition apparatus. For example, in the case where the insulating film is deposited at 250° C., the heat treatment is preferably performed at 250° C. The heat treatment is preferably performed under reduced pressure, and for example, may be performed in a vacuum atmosphere. A vacuum atmosphere is maintained by exhaustion with a turbomolecular pump or the like. Pressure in a vacuum atmosphere of the treatment chamber is lower than or equal to $1\times10^{-2}$ Pa, preferably lower than or equal to $1\times10^{-3}$ Pa.

Next, an insulating film to be the insulating layer 274 is formed over the insulating layer 280 (see FIG. 15). The insulating film to be the insulating layer 274 can be deposited by a sputtering method, a CVD method, an MBE method, a PLD method, an ALD method, or the like. An aluminum oxide film is preferably deposited as the insulating film to be the insulating layer 274 by a sputtering method, for example. When an aluminum oxide film is deposited by a sputtering method, hydrogen contained in the insulating layer 280 can be prevented from diffusing into the semiconductor layer 230 in some cases.

Next, heat treatment may be performed. For the heat treatment, the conditions for the above heat treatment can be used. The heat treatment can reduce the moisture concentration and hydrogen concentration in the insulating layer 274.

Next, an insulating film to be the insulating layer 281 may be deposited over the insulating layer 274. The insulating film to be the insulating layer 281 can be deposited by a sputtering method, a CVD method, an MBE method, a PLD method, an ALD method, or the like (see FIG. 15).

Next, an opening reaching the region 253a and the region 253b is formed in the insulating layer 226, the insulating layer 228, the insulating layer 244, the insulating layer 280, the insulating layer 274, and the insulating layer 281. The opening may be formed using a lithography method.

Next, an insulating film to be the insulating layer 241 is deposited and the insulating film is subjected to anisotropic etching to form the insulating layer 241. The conductive film can be deposited by a sputtering method, a CVD method, an MBE method, a PLD method, an ALD method, or the like. An insulating film having a function of inhibiting the permeation of oxygen is preferably used as the insulating film to be the insulating layer 241. For example, an aluminum oxide film is preferably deposited by an ALD method. In addition, a silicon nitride film may be formed by an ALD method or a CVD method. In the case where a silicon nitride film is formed by an ALD method, a precursor containing silicon and halogen or an aminosilane precursor can be used. As the precursor containing silicon and halogen, $SiCl_4$, $SiH_2Cl_2$, $Si_2Cl_6$, $Si_3Cl_8$, or the like can be used. As the aminosilane precursor, an aminosilane precursor having a valence of 1, a valence of 2, or a valence of 3 can be used. As the nitride gas, ammonia or hydrazine can be used. In addition, for the anisotropic etching, a dry etching method or the like may be employed, for example. When sidewall portions of the openings have such structures, the permeation of oxygen from the outside can be inhibited and oxidation of the conductive layer 240a and the conductive layer 240b to be formed next can be prevented. Furthermore, impurities such as water and hydrogen can be prevented from being diffused from the conductive layer 240a and the conductive layer 240b to the outside.

Next, a conductive film to be the conductive layer 240a and the conductive layer 240b is deposited. The conductive film to be the conductive layer 240a and the conductive layer 240b desirably has a stacked-layer structure that includes a conductive film having a function of inhibiting diffusion of impurities such as water and hydrogen. For example, a stacked layer of tantalum nitride, titanium nitride, or the like and tungsten, molybdenum, copper, or the like can be employed. The conductive film to be the conductive layer 240 can be deposited by a sputtering method, a CVD method, an MBE method, a PLD method, an ALD method, or the like.

Next, CMP treatment is performed to remove part of the conductive film to be the conductive layer 240a and the conductive layer 240b, so that the insulating layer 281 is exposed. As a result, the conductive film remains only in the above-mentioned opening, so that the conductive layer 240a and the conductive layer 240b having planar top surfaces can be formed (see FIG. 1). Note that the insulating layer 281 is partly removed by the CMP treatment in some cases.

Through the above process, the semiconductor device including the transistor 200 illustrated in FIG. 1 can be manufactured.

According to one embodiment of the present invention, a semiconductor device with high on-state current can be provided. Alternatively, according to one embodiment of the present invention, a semiconductor device with high frequency characteristics can be provided. Alternatively, according to one embodiment of the present invention, a highly reliable semiconductor device can be provided. Alternatively, according to one embodiment of the present invention, a semiconductor device that can be scaled down or highly integrated can be provided. Alternatively, according to one embodiment of the present invention, a semiconductor device with favorable electrical characteristics can be provided. Alternatively, according to one embodiment of the present invention, a semiconductor device with low off-state current can be provided. Alternatively, according to one embodiment of the present invention, a semiconductor device with reduced power consumption can be provided. Alternatively, according to one embodiment of the present invention, a semiconductor device with high productivity can be provided.

At least part of this embodiment can be implemented in combination with the other embodiments described in this specification as appropriate.

Embodiment 2

In this embodiment, one embodiment of a semiconductor device of one embodiment of the present invention will be described using FIG. 16 and FIG. 17.
[Memory Device 1]

Figure 16:
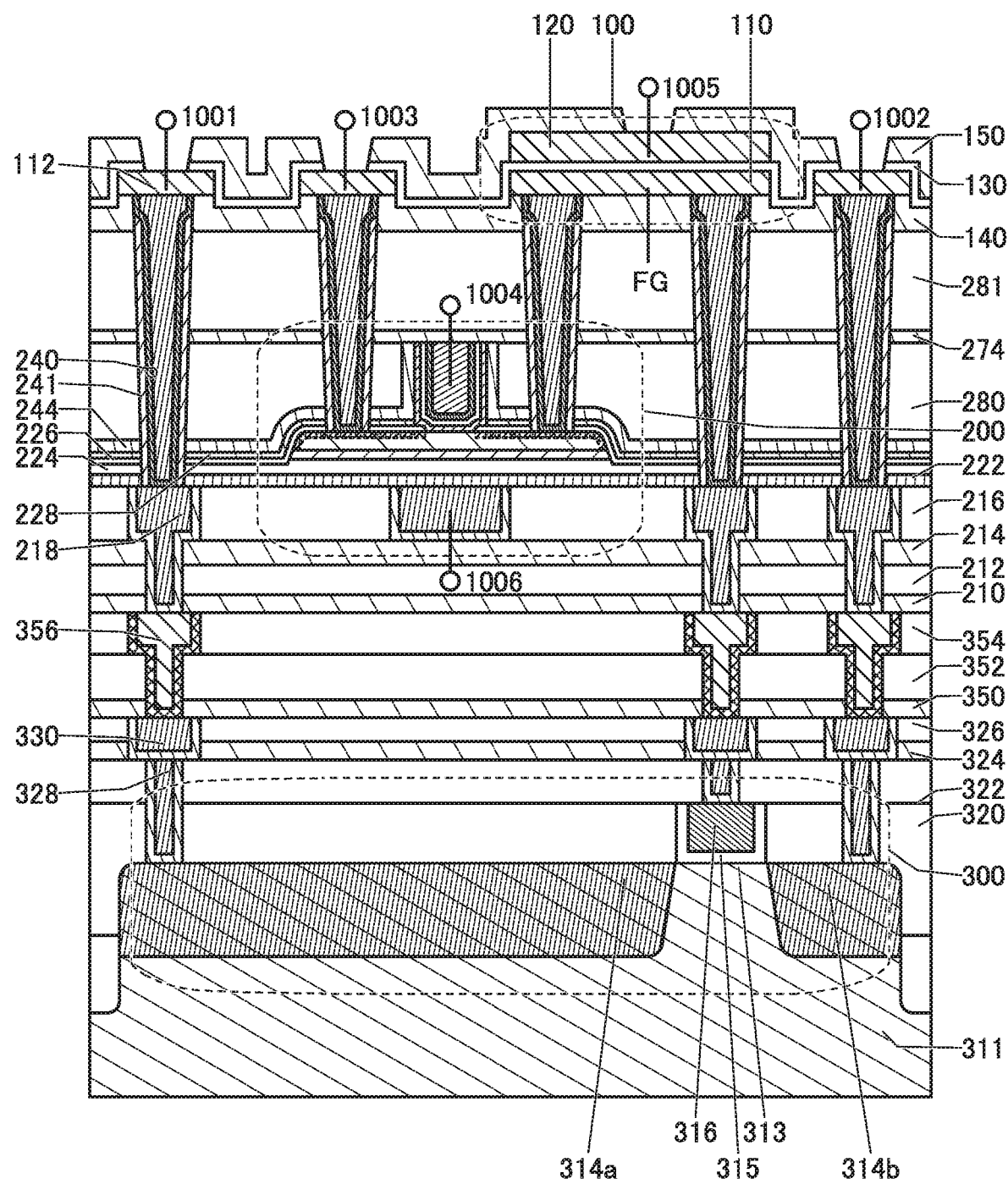
FIG. 16 A cross-sectional diagram of a memory device.

An example of a semiconductor device (memory device) using a capacitor of one embodiment of the present invention is illustrated in FIG. 16. In the memory device illustrated in FIG. 16, a transistor 200 is provided above a transistor 300, and a capacitor 100 is provided above the transistor 300 and the transistor 200. Note that the transistor 200 described in the above embodiment can be used as the transistor 200.

The transistor 200 is a transistor in which a channel is formed in a semiconductor layer including an oxide semiconductor. The off-state current of the transistor 200 is low; thus, by using the transistor 200 in a memory device, stored data can be retained for a long time. In other words, such a memory device does not require refresh operations or has extremely low frequency of the refresh operations, which leads to a sufficient reduction in power consumption of the memory device.

In the memory device illustrated in FIG. 16, a wiring 1001 is electrically connected to a source of the transistor 300, and a wiring 1002 is electrically connected to a drain of the transistor 300. In addition, a wiring 1003 is electrically connected to one of a source and a drain of the transistor 200, a wiring 1004 is electrically connected to a first gate of the transistor 200, and a wiring 1006 is electrically connected to a second gate of the transistor 200. Furthermore, a gate of the transistor 300 and the other of the source and the drain of the transistor 200 are electrically connected to one electrode (FG) of the capacitor 100, and a wiring 1005 is electrically connected to the other electrode of the capacitor 100.

Furthermore, by arranging the memory device illustrated in FIG. 16 in a matrix, a memory cell array can be formed.

<Transistor 300>

The transistor 300 is provided on a substrate 311 and includes a conductive layer 316 functioning as a gate electrode, an insulating layer 315 functioning as a gate insulating layer, a semiconductor region 313 formed of part of the substrate 311, and a low-resistance region 314a and a low-resistance region 314b functioning as a source region or a drain region. The transistor 300 is either a p-channel transistor or an n-channel transistor.

Here, in the transistor 300 illustrated in FIG. 16, the semiconductor region 313 (part of the substrate 311) in which the channel is formed has a protruding shape. In addition, the conductive layer 316 is provided to cover a side surface and a top surface of the semiconductor region 313 with the insulating layer 315 therebetween. Note that a material adjusting a work function may be used for the conductive layer 316. Such a transistor 300 is also referred to as a FIN-type transistor because it utilizes a convex portion of a semiconductor substrate. Note that an insulating layer functioning as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 16 is only an example and the structure is not limited thereto; an appropriate transistor can be used in accordance with a circuit structure or a driving method.

<Capacitor 100>

The capacitor 100 is provided above the transistor 200. The capacitor 100 includes a conductive layer 110 functioning as a first electrode, a conductive layer 120 functioning as a second electrode, and an insulating layer 130 functioning as a dielectric.

For example, a conductive layer 112 and the conductive layer 110 provided over a conductive layer 240 can be formed at the same time. Note that the conductive layer 112 has a function of a plug or a wiring that is electrically connected to the capacitor 100, the transistor 200, or the transistor 300.

The conductive layer 112 and the conductive layer 110 are illustrated as having a single-layer structure in FIG. 16; however, the structure is not limited thereto, and a stacked-layer structure of two or more layers may be used. For example, between a conductive layer having a barrier property and a conductive layer having high conductivity, a conductive layer that is highly adhesive to the conductive layer having a barrier property and the conductive layer having high conductivity may be formed.

In addition, the insulating layer 130 can be provided to have stacked layers or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, it is preferable to use a stacked-layer structure of a material with high dielectric strength such as silicon oxynitride and a material with high dielectric constant (high-k) for the insulating layer 130. With such a structure, in the capacitor 100, sufficient capacitance can be secured because an insulating layer with high dielectric constant (high-k) is included, and dielectric strength can be improved because an insulator with high dielectric strength is included, so that the electrostatic breakdown of the capacitor 100 can be inhibited.

Note that examples of the high dielectric constant (high-k) insulating layer (material with high relative dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Meanwhile, examples of the material with high dielectric strength (material with low relative dielectric constant) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

Wiring layers provided with an interlayer film, a wiring, a plug, and the like may be provided between components. In addition, a plurality of wiring layers can be provided in accordance with design. Here, a plurality of conductive layers having functions of plugs or wirings are collectively denoted by the same reference numeral in some cases. Furthermore, in this specification and the like, a wiring and a plug electrically connected to the wiring may be a single component. That is, there are cases where part of a conductive layer functions as a wiring and another part of the conductive layer functions as a plug.

For example, an insulating layer 320, an insulating layer 322, an insulating layer 324, and an insulating layer 326 are sequentially stacked over the transistor 300 as interlayer films. In addition, a conductive layer 328, a conductive layer 330, and the like that are electrically connected to the capacitor 100 or the transistor 200 are embedded in the insulating layer 320, the insulating layer 322, the insulating layer 324, and the insulating layer 326. Note that the conductive layer 328 and the conductive layer 330 function as a plug or a wiring.

The insulating layers functioning as interlayer films may also function as planarization films that cover uneven shapes therebelow. For example, a top surface of the insulating layer 322 may be planarized by planarization treatment using a chemical mechanical polishing (CMP) method or the like to increase planarity.

A wiring layer may be provided over the insulating layer 326 and the conductive layer 330. For example, in FIG. 16, an insulating layer 350, an insulating layer 352, and an insulating layer 354 are provided to be stacked sequentially. Furthermore, a conductive layer 356 is formed in the insulating layer 350, the insulating layer 352, and the insulating layer 354. The conductive layer 356 functions as a plug or a wiring.

Similarly, a conductive layer 218, a conductive layer constituting the transistor 200 (a conductive layer 205), and the like are embedded in an insulating layer 210, an insulating layer 212, an insulating layer 214, and an insulating layer 216. Note that the conductive layer 218 has a function of a plug or a wiring that is electrically connected to the capacitor 100 or the transistor 300. In addition, an insulating layer 150 is provided over the conductive layer 120 and the insulating layer 130.

Examples of an insulating material that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having low relative dielectric constant is used for the insulating material functioning as an interlayer film, parasitic capacitance generated between wirings can be reduced. Thus, a material is preferably selected in accordance with the function of an insulating layer.

For example, for the insulating layer 150, the insulating layer 212, the insulating layer 352, the insulating layer 354, or the like, an insulating layer having a low relative dielectric constant is preferably used. For example, the insulating layer preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulating layer preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide and silicon oxynitride, which are thermally stable, are combined with a resin, the stacked-layer structure can have thermal stability and low relative dielectric constant. Examples of the resin include polyester, polyolefin, polyamide (nylon, aramid, or the like), polyimide, polycarbonate, and acrylic.

In addition, it is preferable that one or both of the insulating layer 130 and the insulating layer 150 provided over the conductive layer 112 or the conductive layer 120 be an insulating layer or insulating layers each having resistivity higher than or equal to $1.0\times10^{12}$ Ωcm and lower than or equal to $1.0\times10^{15}$ Ωcm, preferably higher than or equal to $5.0\times10^{12}$ Ωcm and lower than or equal to $1.0\times10^{14}$ Ωcm, further preferably higher than or equal to $1.0\times10^{13}$ Ωcm and lower than or equal to $5.0\times10^{13}$ Ωcm. One or both of the insulating layer 130 and the insulating layer 150 are preferably an insulating layer or insulating layers each having resistivity in the above range so that the insulating layer or the insulating layers can disperse electric charge accumulated between the transistor 200, the transistor 300, the capacitor 100, and wirings such as the conductive layer 112 and the conductive layer 120 and can inhibit poor characteristics and electrostatic breakdown of the transistor and a memory device including the transistor due to the electric charge, while maintaining the insulating property. For such an insulating layer, silicon nitride or silicon nitride oxide can be used.

In addition, as the insulating layer having resistivity in the above range, an insulating layer 140 may be provided below the conductive layer 112. In this case, the insulating layer 140 is formed over an insulating layer 281; an opening portion is formed in the insulating layer 140, the insulating layer 281, an insulating layer 274, an insulating layer 280, an insulating layer 244, an insulating layer 228, an insulating layer 226, and the like; and an insulating layer 241 is formed in the opening portion, or the conductive layer 240 that is electrically connected to the transistor 200, the conductive layer 218, and the like is formed. For the insulating layer 140, a material similar to that of the insulating layer 130 or the insulating layer 150 can be used.

Furthermore, when a transistor using an oxide semiconductor is surrounded by an insulating layer having a function of inhibiting the permeation of oxygen and impurities such as hydrogen, the electrical characteristics of the transistor can be stable. Thus, an insulating layer having a function of inhibiting the permeation of oxygen and impurities such as hydrogen is used for the insulating layer 210, the insulating layer 350, or the like.

For the insulating layer having a function of inhibiting the permeation of oxygen and impurities such as hydrogen, a single layer or stacked layers of an insulating layer containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, for the insulating layer having a function of inhibiting the permeation of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductive layer that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductive layer 328, the conductive layer 330, the conductive layer 356, the conductive layer 218, the conductive layer 112, or the like, a single layer or stacked layers of a conductive material such as a metal material, an alloy material, a metal nitride material, or a metal oxide material that is formed using the above material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

<<Wiring or Plug in Layer Provided with Oxide Semiconductor>>

Note that in the case where an oxide semiconductor is used for the transistor 200, an insulating layer including an excess oxygen region is provided in the vicinity of the oxide semiconductor in some cases. In this case, an insulating layer having a barrier property is preferably provided between the insulating layer including the excess oxygen region and a conductive layer provided in an opening of the insulating layer including the excess oxygen region.

For example, the insulating layer 241 is preferably provided between an insulating layer 224 and the conductive layer 240 in FIG. 16. In particular, the insulating layer 241 is preferably provided in contact with an insulating layer 222, the insulating layer 226, the insulating layer 228, and the insulating layer 244 that sandwich the insulating layer 224 including the excess oxygen region. Since the insulating layer 241 is provided in contact with the insulating layer 222, the insulating layer 226, the insulating layer 228, and the insulating layer 244, a structure can be employed in which the insulating layer 224 and the transistor 200 are sealed by an insulating layer having a barrier property. Furthermore, it is also preferable that the insulating layer 241 be in contact with part of the insulating layer 280 and the insulating layer 281. When the insulating layer 241 extends to the insulating layer 280 and the insulating layer 281, diffusion of oxygen and impurities can be further inhibited.

That is, when the insulating layer 241 is provided, absorption of excess oxygen contained in the insulating layer 224 by the conductive layer 240 can be inhibited. In addition, when the insulating layer 241 is included, diffusion of hydrogen, which is an impurity, into the transistor 200 through the conductive layer 240 can be inhibited.

Note that an insulating material having a function of inhibiting diffusion of oxygen and impurities such as water or hydrogen is preferably used for the insulating layer 241. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide; silicon nitride oxide; silicon nitride; or the like.

The above is the description of the structure example. With use of the structure, changes in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with reduced power consumption can be provided.

[Memory Device 2]

Figure 17:
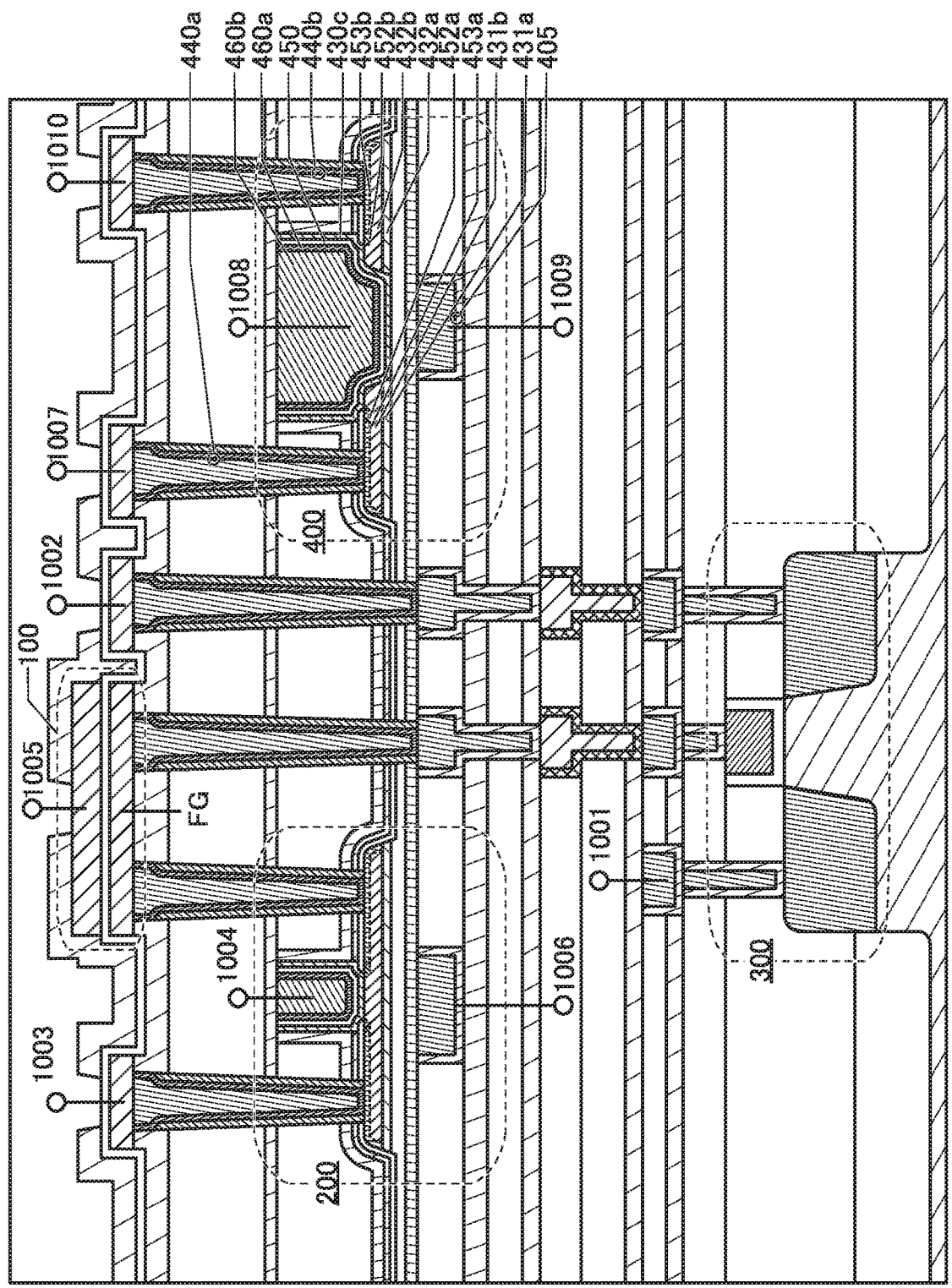
FIG. 17 A cross-sectional diagram of a memory device.

FIG. 17 illustrates an example of a semiconductor device (memory device) of one embodiment of the present invention. The memory device illustrated in FIG. 17 includes a transistor 400 in addition to the semiconductor device illustrated in FIG. 16 that includes the transistor 200, the transistor 300, and the capacitor 100.

The transistor 400 can control a second gate voltage of the transistor 200. For example, a first gate and a second gate of the transistor 400 are diode-connected to a source, and a source of the transistor 400 is connected to a second gate of the transistor 200. When a negative potential of the second gate of the transistor 200 is retained in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be retained for a long time even without power supply to the transistor 200 and the transistor 400. Accordingly, the memory device including the transistor 200 and the transistor 400 can retain stored data for a long time.

Hence, in FIG. 17, the wiring 1001 is electrically connected to a source of the transistor 300, and the wiring 1002 is electrically connected to a drain of the transistor 300. The wiring 1003 is electrically connected to one of the source and the drain of the transistor 200, the wiring 1004 is electrically connected to the gate of the transistor 200, and the wiring 1006 is electrically connected to a back gate of the transistor 200. Furthermore, a gate of the transistor 300 and the other of the source and the drain of the transistor 200 are electrically connected to one electrode (FG) of the capacitor 100, and a wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to a drain of the transistor 400. Here, the wiring 1006, the wiring 1007, the wiring 1008, and the wiring 1009 are electrically connected to each other.

When the memory device illustrated in FIG. 17 is arranged in a matrix similar to the memory device illustrated in FIG. 16, a memory cell array can be formed. Note that one transistor 400 can control second gate voltages of a plurality of transistors 200. For this reason, a fewer number of transistors 400 than the number of transistors 200 is preferably provided.

<Transistor 400>

The transistor 400 is formed in the same layer as the transistor 200 and thus can be fabricated in parallel. The transistor 400 includes a conductive layer 460 (a conductive layer 460a and a conductive layer 460b) functioning as a first gate electrode; a conductive layer 405 (a conductive layer 405a and a conductive layer 405b) functioning as a second gate electrode; the insulating layer 222, the insulating layer 224, and an insulating layer 450 each functioning as a gate insulating layer; a semiconductor layer 430c including a region where a channel is formed; a region 452a and a region 453a, a semiconductor layer 431a and a semiconductor layer 431b functioning as one of a source and a drain; a region 452b and a region 453b, a semiconductor layer 432a and a semiconductor layer 432b functioning as the other of the source and the drain; and a conductive layer 440 (a conductive layer 440a and a conductive layer 440b).

In the transistor 400, the conductive layer 405 is in the same layer as the conductive layer 205. The semiconductor layer 431a and the semiconductor layer 432a are in the same layer as a semiconductor layer 230a, and the semiconductor layer 431b and the semiconductor layer 432b are in the same layer as a semiconductor layer 230b. The region 452 is a region that is formed in the same process as a region 252. The region 453 is a region formed in the same process as a region 253. The semiconductor layer 430c is in the same layer as a semiconductor layer 230c. The insulating layer 450 is in the same layer as an insulating layer 250. The conductive layer 460 is in the same layer as a conductive layer 260.

Note that the structure body formed in the same layer can be formed at the same time. For example, the semiconductor layer 430c can be formed by processing a metal oxide film to be the semiconductor layer 230c.

In the semiconductor layer 430c functioning as an active layer of the transistor 400, oxygen vacancies and impurities such as hydrogen or water are reduced, as in the semiconductor layer 230 or the like. Accordingly, the threshold voltage of the transistor 400 can be higher than 0 V, an off-state current can be reduced, and the drain current can be extremely low when the second gate voltage and the first gate voltage are 0 V.

At least part of this embodiment can be implemented in combination with the other embodiments described in this specification as appropriate.

Embodiment 3

In this embodiment, a memory device according to one embodiment of the present invention to which a transistor using an oxide semiconductor (hereinafter referred to as an OS transistor in some cases) and a capacitor are applied (hereinafter referred to as an OS memory device in some cases) will be described with reference to FIG. 18 and FIG. 19. The OS memory device is a memory device including at least a capacitor and an OS transistor that controls charge and discharge of the capacitor. Since the off-state current of the OS transistor is extremely low, the OS memory device has excellent retention characteristics and can function as a nonvolatile memory.

<Structure Example of Memory Device>

Figure 18A:
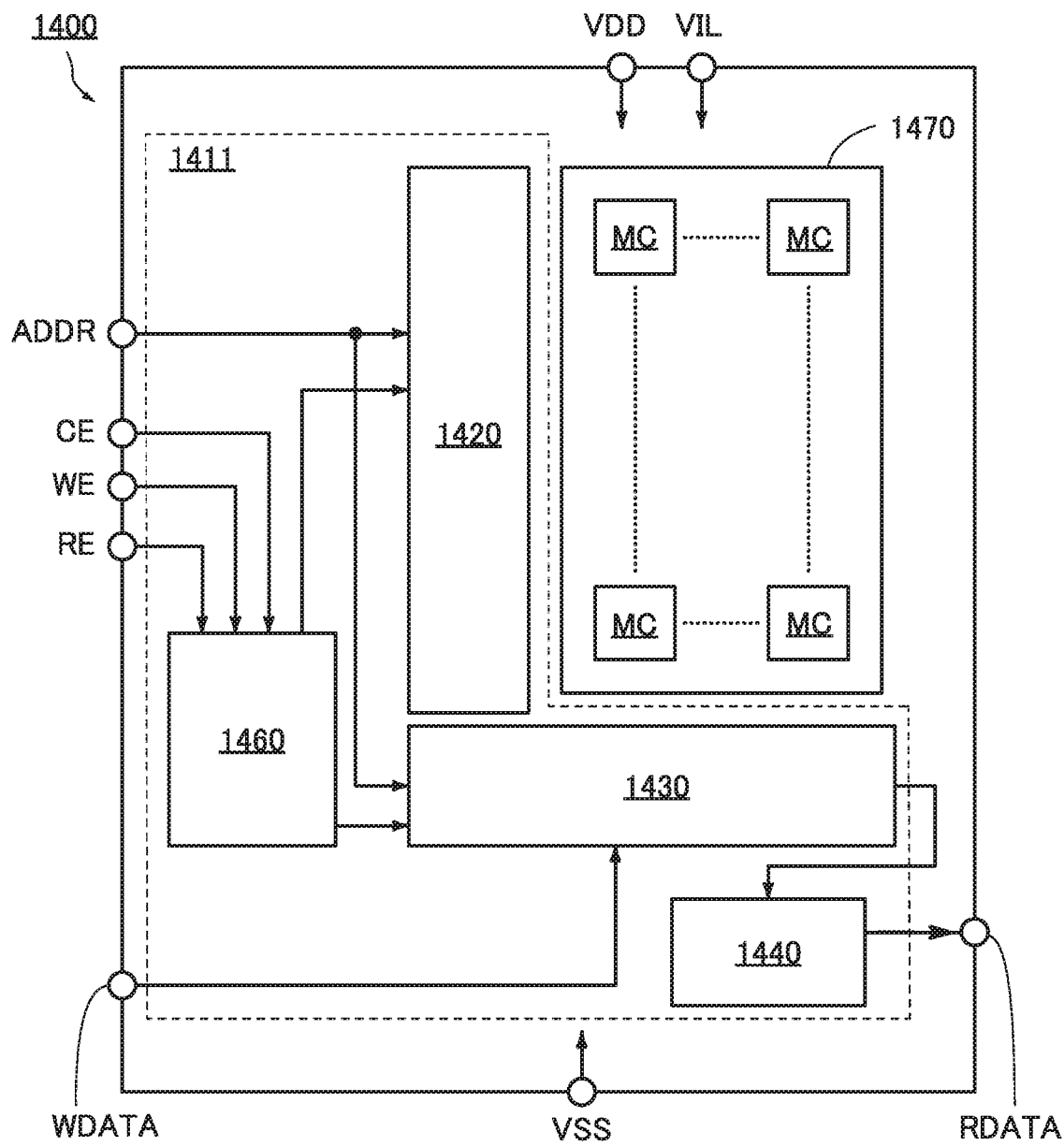
FIGS. 18A-18B Block diagrams of a memory device.

FIG. 18(A) illustrates a structure example of an OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are wirings connected to memory cells included in the memory cell array 1470, which will be described in detail later. An amplified data signal is output to the outside of the memory device 1400 as a data signal RDATA through the output circuit 1440. Furthermore, the row circuit 1420 includes, for example, a row decoder, a word line driver circuit, and the like, and can select a row to be accessed.

As power supply voltages, a low power supply voltage (VSS), a high power supply voltage (VDD) for the peripheral circuit 1411, and a high power supply voltage (VIL) for the memory cell array 1470 are supplied to the memory device 1400 from the outside. In addition, control signals (CE, WE, and RE), an address signal ADDR, and a data signal WDATA are input to the memory device 1400 from the outside. The address signal ADDR is input to the row decoder and the column decoder, and WDATA is input to the write circuit.

The control logic circuit 1460 processes the signals (CE, WE, and RE) input from the outside, and generates control signals for the row decoder and the column decoder. CE denotes a chip enable signal, WE denotes a write enable signal, and RE denotes a read enable signal. Signals processed by the control logic circuit 1460 are not limited thereto, and other control signals are input as necessary.

The memory cell array 1470 includes a plurality of memory cells MC and a plurality of wirings arranged in a matrix. Note that the number of wirings that connect the memory cell array 1470 and the row circuit 1420 is decided based on the structure of the memory cell MC, the number of memory cells MC included in one column, and the like. Furthermore, the number of wirings that connect the memory cell array 1470 and the column circuit 1430 is decided based on the structure of the memory cell MC, the number of memory cells MC included in one row, and the like.

Figure 18B:
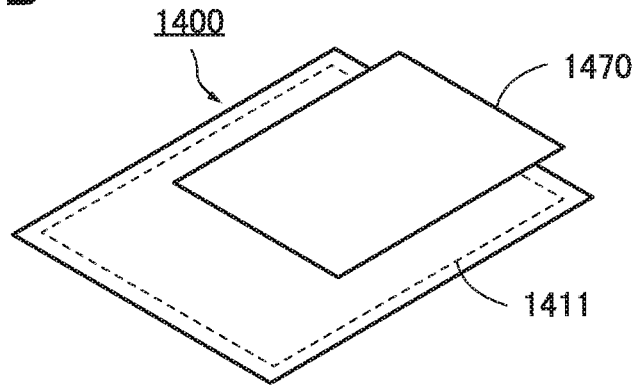

Note that FIG. 18(A) illustrates an example in which the peripheral circuit 1411 and the memory cell array 1470 are formed on the same plane; however, this embodiment is not limited thereto. For example, as illustrated in FIG. 18(B), part of the memory cell array 1470 may be provided over part of the peripheral circuit 1411 so that they overlap. For example, a structure may be employed in which the sense amplifier is provided to overlap with below the memory cell array 1470.

A structure example of a memory cell illustrated in FIG. 19 that can be used in the memory cell MC will be described.

[DOSRAM]

Figure 19A:
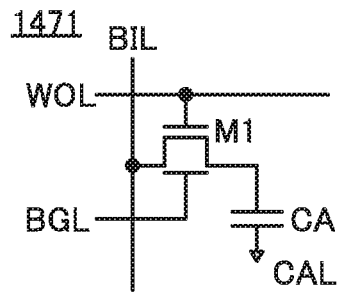
FIGS. 19A-19H Circuit diagrams of memory devices.
Figure 19B:
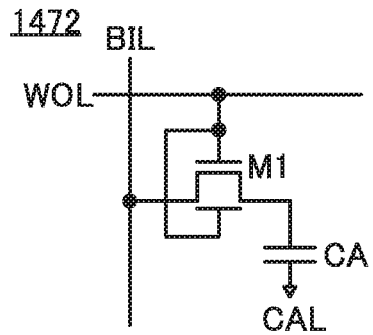
Figure 19C:
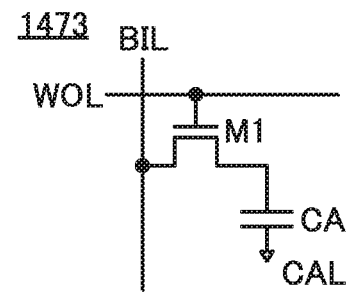
Figure 19D:
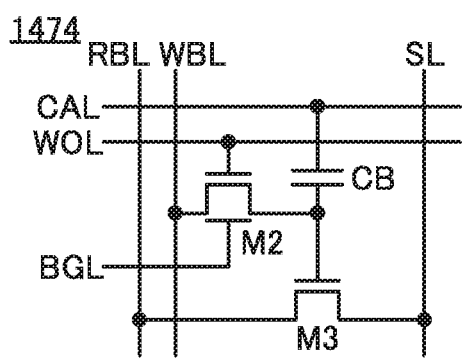
Figure 19E:
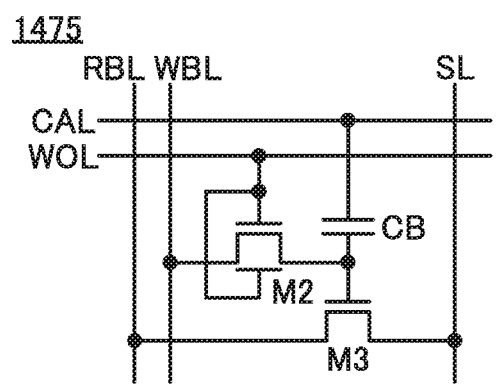
Figure 19F:
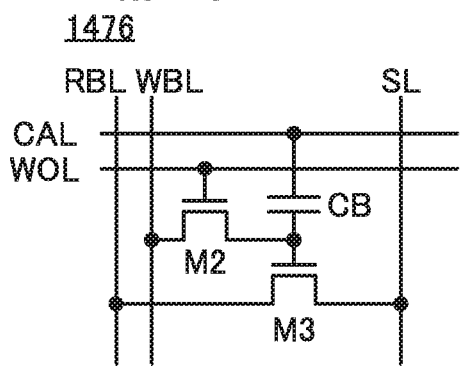
Figure 19G:
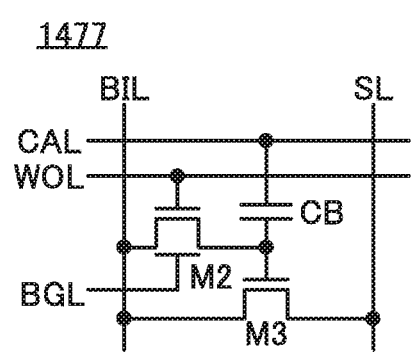

Circuit structure examples of a DRAM memory cell is illustrated in FIGS. 19(A) to 19(C). In this specification and the like, a DRAM using a memory cell including one OS transistor and one capacitor is sometimes referred to as a DOSRAM (Dynamic Oxide Semiconductor Random Access Memory). A memory cell 1471 illustrated in FIG. 19(A) includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. A gate of the transistor M1 is connected to a wiring WOL. A back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In data writing and reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

The memory cell MC is not limited to the memory cell 1471, and its circuit structure can be changed. For example, in the memory cell MC, the back gate of the transistor M1 may be connected to the wiring WOL instead of the wiring BGL as in a memory cell 1472 illustrated in FIG. 19(B). For example, the memory cell MC may be a memory cell configured of a single-gate structure transistor; that is, a transistor M1 that does not have a back gate, as in a memory cell 1473 illustrated in FIG. 19(C).

In the case where the semiconductor device described in the above embodiment is used in the memory cell 1471 or the like, the transistor 200 can be used as the transistor M1, and a capacitor 100 can be used as the capacitor CA. The use of an OS transistor as the transistor M1 enables the leakage current of the transistor M1 to be extremely low. That is, written data can be retained for a long time owing to the transistor M1; thus, the frequency of refresh operations of the memory cell can be reduced. Moreover, refresh operations of the memory cell can be omitted. In addition, the extremely low leakage current enables retention of multi-level data or analog data in the memory cell 1471, the memory cell 1472, or the memory cell 1473.

In the DOSRAM, providing a sense amplifier below the memory cell array 1470 so that they overlap each other as described above can shorten the bit line. This reduces the bit line capacitance, which reduces the storage capacitance of the memory cell.

[NOSRAM]

FIGS. 19(D) to 19(G) illustrate a circuit structure example of a gain-cell type memory cell including two transistors and one capacitor. A memory cell 1474 illustrated in FIG. 19(D) includes a transistor M2, a transistor M3, and a capacitor CB. Note that the transistor M2 includes a gate (also referred to as a front gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. A gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL, a second terminal of the transistor M3 is connected to a wiring SL, and a gate of the transistor M3 is connected to a first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

The memory cell MC is not limited to the memory cell 1474, and its circuit structure can be changed as appropriate. For example, for the memory cell MC, as in a memory cell 1475 illustrated in FIG. 19(E), a structure in which the back gate of the transistor M2 is connected to the wiring WOL instead of the wiring BGL may be used. For example, the memory cell MC may be a memory cell formed of a transistor with a single-gate structure; that is, a transistor M2 that does not have a back gate, as in a memory cell 1476 illustrated in FIG. 19(F). For example, the memory cell MC may have a structure in which the wiring WBL and the wiring RBL are combined into one wiring BIL as in a memory cell 1477 illustrated in FIG. 19(G).

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time owing to the transistor M2; thus, the frequency of refresh operations of the memory cell can be reduced. Moreover, refresh operations of the memory cell can be omitted. In addition, the extremely low leakage current enables retention of multi-level data or analog data in the memory cell 1474. The same applies to the memory cells 1475 to 1477.

Note that the transistor M3 may be a transistor containing silicon in a channel formation region (hereinafter such a transistor is referred to as a Si transistor in some cases). The conductivity type of the Si transistor may be an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Figure 19H:
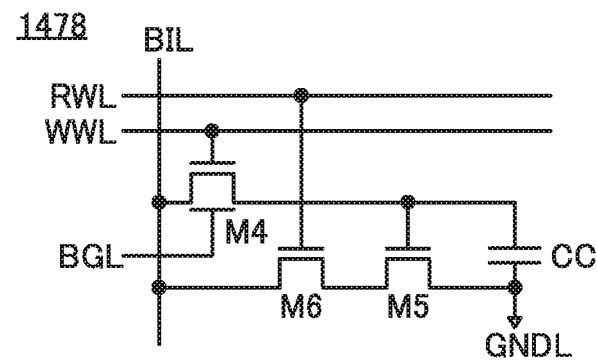

Furthermore, the transistor M3 may be an OS transistor. When OS transistors are used for the transistors M2 and M3, a circuit of the memory cell array 1470 can be formed using only n-type transistors. FIG. 19(H) illustrates an example of a gain-cell type memory cell including three transistors and one capacitor. A memory cell 1478 illustrated in FIG. 19(H) includes transistors M4 to M6 and a capacitor CC. The capacitor CC is provided as appropriate. The memory cell 1478 is electrically connected to wirings BIL, RWL, WWL, BGL, and GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistors M5 and M6 may be an n-channel Si transistor or a p-channel Si transistor. Alternatively, the transistors M4 to M6 may be OS transistors, in which case the memory cell array 1470 can be configured using only n-type transistors.

In the case where the semiconductor device described in the above embodiment is used in the memory cell 1478, the transistor 200 can be used as the transistor M4, the transistor 300 can be used as the transistors M5 and M6, and the capacitor 100 can be used as the capacitor CC. The use of an OS transistor as the transistor M4 enables the leakage current of the transistor M4 to be extremely low.

Note that the structures of the peripheral circuit 1411, the memory cell array 1470, and the like shown in this embodiment are not limited to those described above. The arrangement and functions of these circuits and the wirings, circuit components, and the like connected to the circuits can be changed, removed, or added as needed.

The structure described in this embodiment can be used in an appropriate combination with the structures described in the other embodiments and the like.

Embodiment 4

In this embodiment, an example of a chip 1200 on which a semiconductor device of the present invention is mounted is described using FIG. 20. A plurality of circuits (systems) are mounted on the chip 1200. The technology for integrating a plurality of circuits (systems) on one chip is referred to as system on chip (SoC) technology in some cases.

Figure 20A:
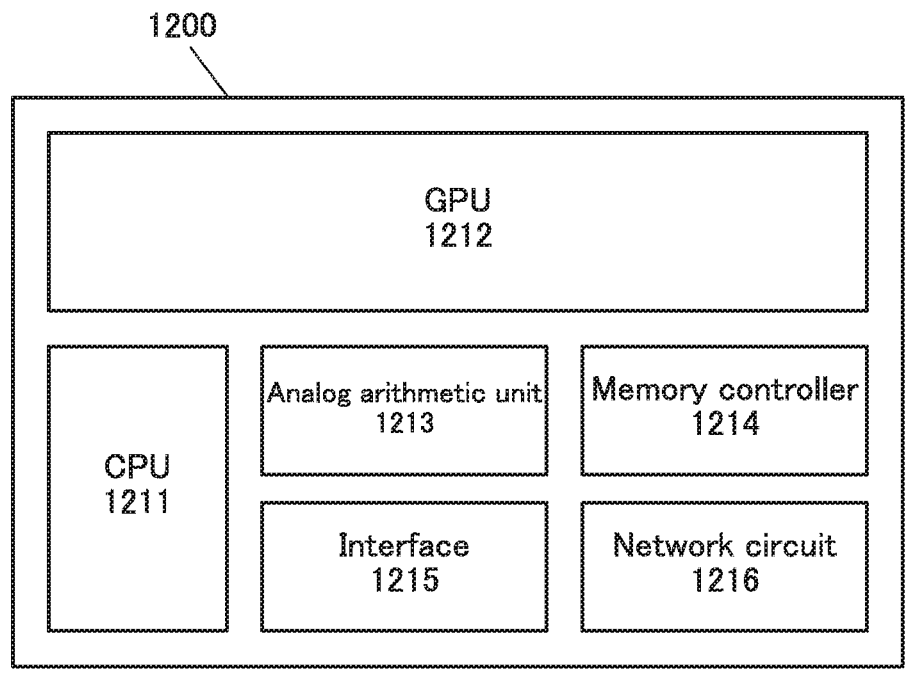
FIGS. 20A-20B Schematic diagrams of a semiconductor device.

As illustrated in FIG. 20(A), the chip 1200 includes a CPU 1211, a GPU (Graphics Processing Unit) 1212, one or a plurality of analog arithmetic units 1213, one or a plurality of memory controllers 1214, one or a plurality of interfaces 1215, one or a plurality of network circuits 1216, and the like.

Figure 20B:
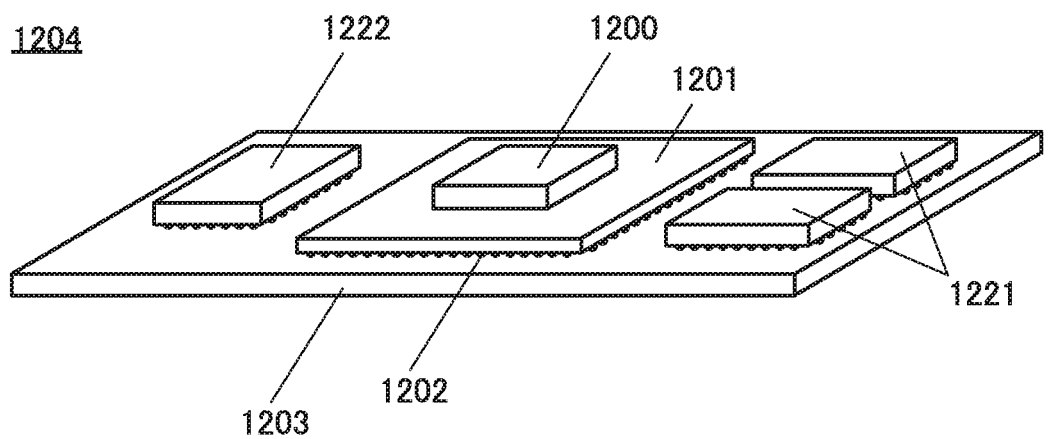

A bump (not illustrated) is provided on the chip 1200, and as illustrated in FIG. 20(B), the chip 1200 is connected to a first surface of a printed circuit board (PCB) 1201. A plurality of bumps 1202 are provided on the rear surface of the first surface of the PCB 1201 and are connected to a motherboard 1203.

Memory devices such as a DRAM 1221 and a flash memory 1222 may be provided over the motherboard 1203. For example, the DOSRAM described in the previous embodiment can be used as the DRAM 1221. For example, the NOSRAM described in the previous embodiment can be used as the flash memory 1222.

The CPU 1211 preferably includes a plurality of CPU cores. The GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. As the memory, the NOSRAM or the DOSRAM described above can be used. The GPU 1212 is suitable for parallel computation of a large number of data and thus can be used for image processing and product-sum operation. When an image processing circuit or a product-sum operation circuit using an oxide semiconductor of the present invention is provided in the GPU 1212, image processing and product-sum operation can be performed with low power consumption.

When the CPU 1211 and the GPU 1212 are provided in the same chip, a wiring between the CPU 1211 and the GPU 1212 can be shortened; accordingly, data transfer from the CPU 1211 to the GPU 1212, data transfer between the memories included in the CPU 1211 and the GPU 1212, and transfer of arithmetic operation results from the GPU 1212 to the CPU 1211 after the arithmetic operation in the GPU 1212 can be performed at high speed.

An analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

A memory controller 1214 includes a circuit functioning as a controller of the DRAM 1221 and a circuit functioning as the interface of the flash memory 1222.

An interface 1215 includes an interface circuit to be connected to an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

A network circuit 1216 includes a network circuit such as a LAN (Local Area Network). In addition, the network circuit 1216 may include a circuit for network security.

The circuits (systems) can be formed in the chip 1200 in the same manufacturing process. Therefore, even when the number of circuits (systems) needed for the chip 1200 increases, there is no need to increase the manufacturing processes; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 using the SoC technology, and thus can have a small size. The GPU module 1204 is excellent in image processing, and thus is suitable for use in portable electronic devices such as a smartphone, a tablet terminal, a laptop PC, and a portable (mobile) game console. The product-sum operation circuit using the GPU 1212 can execute the arithmetic operation in a deep neural network (DNN), a convolutional neural network (CNN), a recurrent neural network (RNN), an autoencoder, a deep Boltzmann machine (DBM), a deep belief network (DBN), or the like; hence, the chip 1200 can be used as an AI chip or the GPU module 1204 can be used as an AI system module.

At least part of this embodiment can be implemented in combination with the other embodiments described in this specification as appropriate.

Embodiment 5

In this embodiment, application examples of the memory device using the semiconductor device described in the previous embodiment will be described. The semiconductor device described in the previous embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the previous embodiment is applied to a variety of removable memory devices such as memory cards (e.g., SD cards), USB memories, and SSDs (solid state drives). FIG. 21 schematically illustrates some structure examples of removable memory devices. The semiconductor device described in the above embodiment is processed into a packaged memory chip and used in a variety of storage devices and removable memories, for example.

Figure 21A:
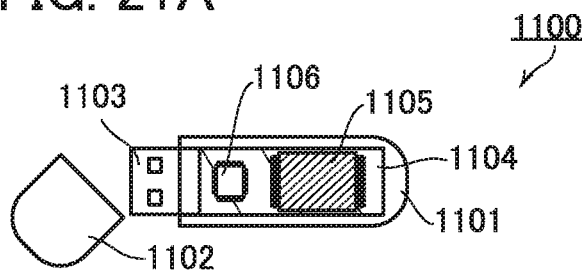
FIGS. 21A-21E Schematic diagrams of memory devices.

FIG. 21(A) is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the previous embodiment can be incorporated in the memory chip 1105 or the like on the substrate 1104.

Figure 21B:
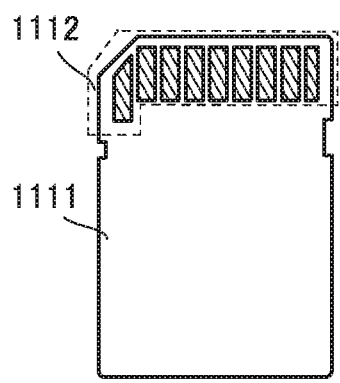
Figure 21C:
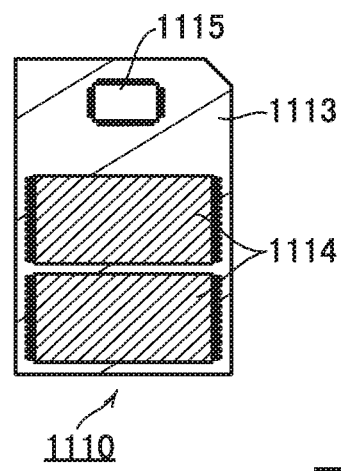

FIG. 21(B) is an external schematic diagram of an SD card, and FIG. 21(C) is a schematic diagram illustrating the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on a rear side of the substrate 1113, the capacity of the SD card 1110 can be increased. In addition, a wireless chip with a radio communication function may be provided on the substrate 1113. With such a wireless chip, data can be read from and written in the memory chip 1114 by radio communication between a host device and the SD card 1110. The semiconductor device described in the previous embodiment can be incorporated in the memory chip 1114 or the like on the substrate 1113.

Figure 21D:
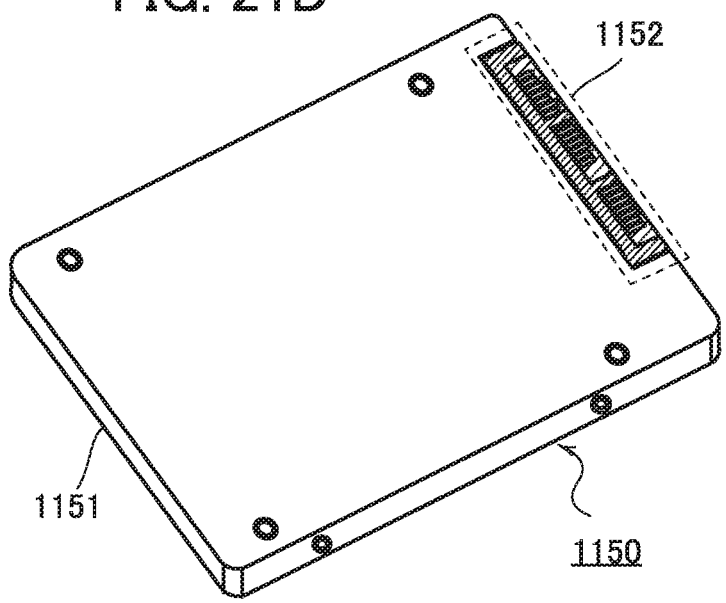
Figure 21E:
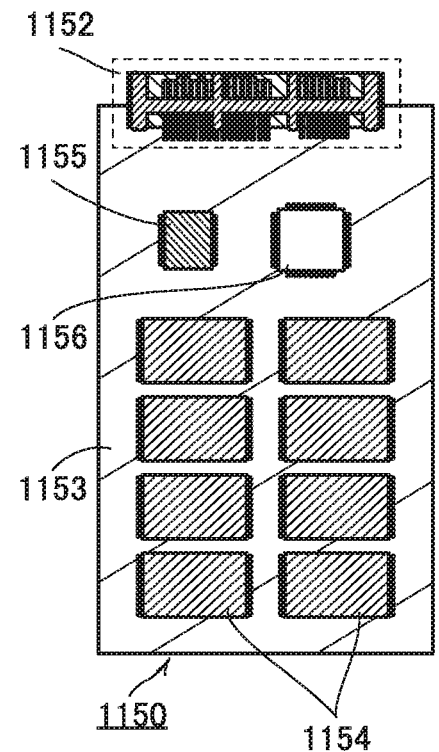

FIG. 21(D) is an external schematic diagram of an SSD, and FIG. 21(E) is a schematic diagram of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on a rear side of the substrate 1153, the capacity of the SSD 1150 can be increased. The semiconductor device described in the previous embodiment can be incorporated in the memory chip 1154 or the like on the substrate 1153.

At least part of this embodiment can be implemented in combination with the other embodiments described in this specification as appropriate.

Embodiment 6

The semiconductor device according to one embodiment of the present invention can be used for a chip or a processor such as a CPU or a GPU. FIG. 22 illustrates specific examples of electronic devices including processors such as CPUs and GPUs, or chips of one embodiment of the present invention.

<Electronic Device and System>

The GPU or the chip according to one embodiment of the present invention can be mounted on a variety of electronic devices. Examples of the electronic devices include electronic devices with a relatively large screen, such as a television device, a desktop or laptop personal computer, a monitor for a computer or the like, digital signage, and a large game machine such as a pachinko machine, in addition to a digital camera, a digital video camera, a digital photo frame, a mobile phone, a portable game console, a portable information terminal, and an audio reproducing device. Moreover, when an integrated circuit or a chip according to one embodiment of the present invention is provided in the electronic device, the electronic device can include artificial intelligence.

The electronic device of one embodiment of the present invention may include an antenna. When a signal is received by the antenna, the electronic device can display a video, information, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 22 illustrates examples of electronic devices.

[Mobile Phone]

FIG. 22(A) illustrates a mobile phone (smartphone) which is a type of an information terminal. An information terminal 5500 includes a housing 5510 and a display portion 5511. As input interfaces, a touch panel is provided in the display portion 5511 and a button is provided in the housing 5510.

When the chip of one embodiment of the present invention is applied to the information terminal 5500, the information terminal 5500 can execute an application utilizing artificial intelligence. Examples of the application utilizing artificial intelligence include an application for recognizing a conversation and displaying the content of the conversation on the display portion 5511; an application for recognizing letters, figures, and the like input to the touch panel of the display portion 5511 by a user and displaying them on the display portion 5511; and an application for performing biometric authentication using fingerprints, voice prints, or the like.

[Information Terminal]

FIG. 22(B) illustrates a desktop information terminal 5300. The desktop information terminal 5300 includes a main body 5301 of the information terminal, a display 5302, and a keyboard 5303.

Similar to the information terminal 5500 described above, when the chip of one embodiment of the present invention is applied to the desktop information terminal 5300, the desktop information terminal 5300 can execute an application utilizing artificial intelligence. Examples of the application utilizing artificial intelligence include design-support software, text correction software, and software for automatic menu generation. Furthermore, with the use of the desktop information terminal 5300, novel artificial intelligence can be developed.

Note that in the above description, as examples of the electronic devices, a smartphone, and a desktop information terminal are illustrated in FIGS. 22(A) and 22(B), respectively; however, the electronic devices can be information terminals other than a smartphone and a desktop information terminal. Examples of an information terminal other than a smartphone and a desktop information terminal include a PDA (Personal Digital Assistant), a notebook information terminal, and a workstation.

[Household Appliance]

FIG. 22(C) illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance including an air conditioner, a washing machine, a drying machine, and an audio visual appliance.

[Game Machine]

FIG. 22(D) illustrates a portable game machine 5200 as an example of a game machine. The portable game machine includes a housing 5201, a display portion 5202, a button 5203, and the like.

When the GPU or the chip of one embodiment of the present invention is applied to the portable game machine 5200, the portable game machine 5200 with low power consumption can be achieved. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is applied to the portable game machine 5200, the portable game machine 5200 including artificial intelligence can be achieved.

In general, the progress of a game, the actions and words of game characters, and expressions of a phenomenon and the like occurring in the game are determined by the program in the game; however, the use of artificial intelligence in the portable game machine 5200 enables expressions not limited to the game program. For example, an expression in which questions posed by the player, the progress of the game, time, and actions and words of game characters change is made possible.

In addition, when a game requiring a plurality of players is played on the portable game machine 5200, the artificial intelligence can create a virtual game player; thus, the game can be played alone with the game player created by the artificial intelligence as an opponent.

Although the portable game machine is illustrated as an example of a game machine in FIG. 22(D), the game machine using the GPU or the chip of one embodiment of the present invention is not limited thereto. Examples of the game machine to which the GPU or the chip of one embodiment of the present invention is applied include a home stationary game machine, an arcade game machine installed in entertainment facilities (a game center, an amusement park, and the like), and a throwing machine for batting practice installed in sports facilities.

[Moving Vehicle]

The GPU or the chip of one embodiment of the present invention can be applied to an automobile, which is a moving vehicle, and the surroundings of a driver's seat in the automobile.

FIG. 22(E1) illustrates an automobile 5700, which is an example of a moving vehicle, and FIG. 22(E2) is a diagram illustrating the surroundings of a windshield inside the automobile. FIG. 22(E2) illustrates a display panel 5701, a display panel 5702, and a display panel 5703 that are attached to a dashboard, in addition to a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the items, layout, or the like displayed on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not illustrated) provided for the automobile 5700. That is, displaying an image taken by the imaging device provided outside the automobile 5700 enables compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile 5700, for example. The chip can also be used for a navigation system, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Broadcasting System]

The GPU or the chip of one embodiment of the present invention can be applied to a broadcasting system.

FIG. 22(F) schematically illustrates data transmission in a broadcasting system. Specifically, FIG. 22(F) illustrates a path in which a radio wave (a broadcast signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 22(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting shown in FIG. 22(F) and may be satellite broadcasting using an artificial satellite, data broadcasting using an optical line, or the like.

The broadcasting system may be a broadcasting system utilizing artificial intelligence by applying the chip of one embodiment of the present invention. When broadcast data is transmitted from the broadcast station 5680 to the TV 5600 of each household, the broadcast data is compressed by an encoder. When the antenna 5650 receives the broadcast data, the broadcast data is decompressed by a decoder of the receiving device included in the TV 5600. With use of artificial intelligence, for example, a display pattern included in an image to be displayed can be recognized in motion compensation prediction, which is one of the compression methods of the encoder. In addition, in-frame prediction or the like utilizing artificial intelligence can also be performed. Furthermore, for example, when broadcast data with low resolution is received and the broadcast data is displayed on the TV 5600 with high resolution, image interpolation processing such as upconversion can be performed in the broadcast data decompression by the decoder.

The broadcasting system utilizing artificial intelligence is suitable for ultra-high definition television (UHDTV: 4K, 8K) broadcasting, which needs a larger amount of broadcast data.

In addition, as an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, the application examples of artificial intelligence, their effects, and the like described in this embodiment can be combined as appropriate with the description of another electronic device.

At least part of this embodiment can be implemented in combination with the other embodiments described in this specification as appropriate.

REFERENCE NUMERALS

100: capacitor, 200, 300: transistor, 110, 112, 120, 205, 218: conductive layer, 130, 140, 150, 210, 212, 214, 216: insulating layer, 222, 224, 226, 228: insulating layer, 230, 230a to 230c: semiconductor layer, 230A to 230C: metal oxide film, 231, 231a, 231b, 232, 232a, 232b, 234: region, 240, 240a, 240b, 260, 260a, 260b: conductive layer, 241, 241a, 241b, 244, 250, 274, 280, 281: insulating layer, 244A, 250A: insulating film, 252, 252a, 252b, 253, 253a, 253b: region, 256, 257: dopant, 260Aa, 260Ab: conductive film, 262: dummy gate, 262A: dummy gate layer, 263: opening

The invention claimed is:

1. A semiconductor device comprising:
a first metal oxide layer comprising a first region, a second region, and a third region;
a second metal oxide layer over the first metal oxide layer;
a first insulating layer over the second metal oxide layer;
a first conductive layer over the first insulating layer;
a second insulating layer over the first metal oxide layer;
a third insulating layer over the second insulating layer;
a fourth insulating layer over the third insulating layer; and a fifth insulating layer over the fourth insulating layer, wherein the first insulating layer comprises a portion in contact with a side surface and a bottom surface of the first conductive layer, wherein the second metal oxide layer comprises a portion in contact with a side surface and a bottom surface of the first insulating layer and a portion in contact with a top surface of the first region, wherein the second insulating layer comprises a portion in contact with a top surface of the second region, a portion in contact with a top surface of the third region, and a portion in contact with a side surface of the second metal oxide layer, wherein the third insulating layer comprises a portion in contact with the side surface of the second metal oxide layer, wherein the fourth insulating layer comprises a portion in contact with the side surface of the second metal oxide layer, wherein the fifth insulating layer is in contact with a top surface of the first conductive layer, a top surface of the first insulating layer, a top surface of the second metal oxide layer, and a top surface of the fourth insulating layer, wherein the second region and the third region contain a first element, and wherein the first element is phosphorus, boron, aluminum, or magnesium.

2. The semiconductor device according to claim 1,
wherein the first metal oxide layer further comprises a fourth region between the first region and the second region and a fifth region between the first region and the third region, wherein the fourth region and the fifth region contain the first element, and wherein the second region and the third region contain a larger amount of the first element than the fourth region or the fifth region.

3. The semiconductor device according to claim 1, wherein the second insulating layer comprises a portion protruding toward the first conductive layer rather than the third insulating layer.

4. The semiconductor device according to claim 1, wherein a bottom portion of the first insulating layer and a bottom portion of the first conductive layer have a rounded shape.

5. The semiconductor device according to claim 1, further comprising a second conductive layer and a third conductive layer, wherein the second conductive layer is located inside a first opening provided in the second insulating layer, the third insulating layer, the fourth insulating layer, and the fifth insulating layer and is in contact with the second region at a bottom portion of the first opening, and wherein the third conductive layer is located inside a second opening provided in the second insulating layer, the third insulating layer, the fourth insulating layer, and the fifth insulating layer and is in contact with the third region at a bottom portion of the second opening.

6. The semiconductor device according to claim 1, further comprising a fourth conductive layer and a sixth insulating layer, wherein the fourth conductive layer comprises a portion overlapping with the first conductive layer with the first region interposed therebetween, and wherein the sixth insulating layer comprises a portion positioned between the fourth conductive layer and the first region.

7. The semiconductor device according to claim 1, further comprising a third metal oxide layer, wherein the first metal oxide layer is positioned over the third metal oxide layer.

8. The semiconductor device according to claim 1,
wherein the first conductive layer is located inside a first opening provided in the second insulating layer, the third insulating layer, the fourth insulating layer, and the fifth insulating layer.

9. The semiconductor device according to claim 1,
wherein the first conductive layer functions as a gate electrode, and wherein the first insulating layer functions as a gate insulating layer.

10. A manufacturing method of a semiconductor device comprising the steps of:

forming a first insulating film covering a first metal oxide layer;

forming a first layer overlapping with the first metal oxide layer over the first insulating film;

performing a first injection treatment on a portion of the first metal oxide layer that is not covered by the first layer using the first layer as a mask through the first insulating film;

forming a second insulating film covering a side surface and a top surface of the first layer and a top surface of the first insulating film;

performing a second injection treatment through the second insulating film and the first insulating film using a portion of the second insulating film covering the side surface of the first layer and the first layer as masks;

performing a planarization treatment to expose the top surface of the first layer; and removing the first layer, wherein the first injection treatment and the second injection treatment are treatments injecting a first element by an ion implantation method, wherein the second injection treatment is performed with a condition in which a greater amount of the first element is injected to the first metal oxide layer than that in the first injection treatment, and wherein the first element is phosphorus, boron, aluminum, or magnesium.

* * * * *